(12) United States Patent
Tsuchino et al.

(10) Patent No.: US 8,017,208 B2
(45) Date of Patent: Sep. 13, 2011

(54) INFORMATION RECORDING MEDIUM, TARGET AND METHOD FOR MANUFACTURING OF INFORMATION RECORDING MEDIUM USING THE SAME

(75) Inventors: Akio Tsuchino, Osaka (JP); Hideo Kusada, Osaka (JP); Rie Kojima, Osaka (JP); Noboru Yamada, Osaka (JP)

(73) Assignee: Panasonic Corporation, Osaka (JP)

( * ) Notice: Subject to any disclaimer, the term of this patent is extended or adjusted under 35 U.S.C. 154(b) by 811 days.

(21) Appl. No.: 11/931,160

(22) Filed: Oct. 31, 2007

(65) Prior Publication Data

US 2009/0286037 A1 Nov. 19, 2009

(30) Foreign Application Priority Data

Nov. 1, 2006 (JP) ................................. 2006-297387

(51) Int. Cl.
*B32B 3/02* (2006.01)
(52) U.S. Cl. ....................... 428/64.1; 428/64.4; 428/64.5
(58) Field of Classification Search .................. 428/64.4; 430/270.13
See application file for complete search history.

(56) References Cited

U.S. PATENT DOCUMENTS

| | | | | |
|---|---|---|---|---|
| 6,365,256 B1* | 4/2002 | Tyan et al. | ................... | 428/64.1 |
| 7,438,965 B2* | 10/2008 | Ohkura et al. | ............... | 428/64.4 |
| 7,485,356 B2* | 2/2009 | Shingai et al. | ............... | 428/64.4 |
| 7,829,169 B2* | 11/2010 | Kojima et al. | ............... | 428/64.4 |
| 2004/0130998 A1* | 7/2004 | Iwasa et al. | ..................... | 369/94 |
| 2004/0191683 A1* | 9/2004 | Nishihara et al. | ........ | 430/270.11 |
| 2005/0177842 A1 | 8/2005 | Zhou | | |
| 2011/0020582 A1* | 1/2011 | Kojima et al. | ............... | 428/64.5 |

FOREIGN PATENT DOCUMENTS

| | | |
|---|---|---|
| JP | 63-225934 A | 9/1988 |
| JP | 63-225935 A | 9/1988 |
| JP | 7-025209 A | 1/1995 |
| JP | 2004-119003 | 4/2004 |
| JP | 2005-533331 | 11/2005 |

* cited by examiner

*Primary Examiner* — Elizabeth Mulvaney
(74) *Attorney, Agent, or Firm* — Hamre, Schumann, Mueller & Larson, P.C.

(57) ABSTRACT

An information recording medium of the present invention includes a recording layer whose phase changes by irradiation with a laser beam or application of current. The recording layer contains, as its main component, a composite composed of Ge and Sb that are essential components, and Te that is an optional component. The composite has a composition within a region enclosed by: point (a) (35, 65, 0), point (b) (36.9, 60, 3.1), point (c) (3.2, 60, 36.8), and point (d) (5, 95, 0) in terms of a coordinate (Ge, Sb, Te)=(x, y, z) on the triangular coordinate shown in FIG. 1, where point (b) corresponds to a point at Sb=60 on $Ge_{60}Te_{40}$—$Ge_{35}Sb_{65}$, point (c) corresponds to a point at Sb=60 on Te—$Ge_5Sb_{95}$, and the region includes lines extending between point (a) and point (b), point (b) and point (c), point (c) and point (d), and point (d) and point (a).

33 Claims, 12 Drawing Sheets

INFORMATION RECORDING MEDIUM, TARGET AND METHOD FOR MANUFACTURING OF INFORMATION RECORDING MEDIUM USING THE SAME

BACKGROUND OF THE INVENTION

1. Field of the Invention

The present invention relates to an information recording medium on or from which information is recorded or reproduced by an optical or an electrical system and a method for manufacturing the same as well as a target to be used for the manufacturing method.

2. Related Background Art

An example of optical information recording media is a phase-change information recording medium in which information is recorded, rewritten, or erased optically using a laser beam. The recording, erasure, and rewriting in the phase-change information recording medium are performed through reversible changes of a phase change material between crystalline and amorphous states in a recording layer thereof. Generally, information is recorded by irradiating an information recording medium with a high power laser beam to heat the recording layer to a higher temperature than its melting point so as to melt the irradiated region, and then cooling it rapidly to form an amorphous phase. On the other hand, information is erased by irradiating the information recording medium with a lower power laser beam than that used for recording to heat the recording layer to a temperature that is higher than its crystallization temperature but is lower than its melting point to increase the temperature of the recording layer and then cooling it slowly to form a crystalline phase and thereby to erase information. These crystallized region and amorphous region thus formed differ in reflectance from each other and thereby information can be reproduced. Accordingly, in order to obtain high quality reproduced signals, it is necessary to increase the difference in reflectance.

Examples of the phase-change information recording medium include currently commercialized Blu-ray Disc media. The Blu-ray Disc is a medium that can respond to digital high-definition broadcasting. The Blu-ray Disc has a storage capacity of 25 GB (one layer) or 50 GB (two layers on one side) and a transfer rate of 36 Mbps (1× speed). Examples of the recording layer materials contained in the 1× speed rewritable Blu-ray Disc media include one having a composition located on a line extending between $Ge_{50}Te_{50}$ and $Sb_{40}Te_{60}$ (see JP63 (1988)-225934 A) and one having a composition located on a line extending between $Ge_{50}Te_{50}$ and $Bi_{40}Te_{60}$ (see JP 63 (1988)-225935 A). The composition located on the line extending between $Ge_{50}Te_{50}$ and $Bi_{40}Te_{60}$ is obtained by substituting Sb with Bi in the composition located on the line extending between $Ge_{50}Te_{50}$ and $Sb_{40}Te_{60}$.

Further increases in capacity and transfer rate are desired for the future and various technologies according thereto are being studied. Providing an information recording medium with two or more information layers on one side is considered as one of the technologies for increasing the capacity thereof. In the case of using this technology, the reflectance change in each recording layer is reproduced with a laser beam that enters from one side of an information recording medium 1. Therefore the information layers that are located nearer to the laser beam incident side are required to have a higher transmittance that allows them to transmit the laser beam. Accordingly, in the information layer located on the laser beam incident side, the recording layer has to be thin to have higher transmittance. However, when the thickness of the recording layer is reduced, it tends to be difficult for atoms to migrate. This results in a reduction in crystallization rate of the recording layer. Therefore when the recording layer is made thin, a phase change material with an increased crystallization rate accordingly has to be employed.

Furthermore, a resultant higher transfer rate reduces the period of time for which the recording layer is irradiated with a laser beam. Accordingly, the time required for the recording layer to be crystallized has to be shortened. Therefore a phase change material that has a further increased crystallization rate is required.

As described above, in order to increase the speed of information recording media, the recording layers thereof have to have increased crystallization rates. Accordingly, it is necessary to increase the composition ratio of $Sb_{40}Te_{60}$ in the composition on the line extending between $Ge_{50}Te_{50}$ and $Sb_{40}Te_{60}$ and the composition ratio of $Bi_{40}Te_{60}$ in the composition on the line extending between $Ge_{50}Te_{50}$ and $Bi_{40}Te_{60}$. According to the experiments made by the present inventors, it was confirmed that in the case of using compositions on those lines, the rate at which recorded marks were erased was low even when a composition was used that had a crystallization rate increased corresponding to high linear velocity recording.

Conceivably, a cause of a low erasure rate is distortion (absorption distortion) of marks that results from the difference in optical absorptance between a crystalline region and an amorphous region. In a current High-to-Low structure (a structure in which when recording is performed in an unrecorded region, the reflectance of the recorded region is lower than that of the unrecorded region), the absorptance of a crystalline region is lower than that of an amorphous region. Therefore, in the same track of an information recording medium, a crystalline region and an amorphous region are different in meltability, and thus in conditions for forming a mark, from each other. These differences result in a decrease in erasure rate. The absorption distortion as described above appears prominently in high-speed recording in which the laser beam irradiation time is shorter. It also has been proved by the present inventors that in an information recording medium on which recording is performed using a blue-violet laser, it is difficult to design it to have a small difference in absorptance between a crystalline region and an amorphous region so as to reduce the effect of the absorption distortion. Therefore, a recording layer material having another crystallization mechanism is required for high-speed recording.

Furthermore, in the case of using the composition whose crystallization rate has been increased on the line extending between $Ge_{50}Te_{50}$ and $Sb_{40}Te_{60}$ or the line extending between $Ge_{50}Te_{50}$ and $Bi_{40}Te_{60}$, optical variations in refractive index and extinction coefficient between the crystalline region and the amorphous region are reduced, and thereby the difference in reflectance between the crystalline region and the amorphous region of the information recording medium is reduced. Accordingly, the quality of reproduced signals is deteriorated. Furthermore, in the composition whose crystallization rate has been improved as described above, the crystallization temperature also decreases. That is, this leads to deterioration in signal storage stability. These points also were proved through the experiments made by the present inventors.

On the other hand, when the number of information layers to be increased, which accompanies an increase in capacity, recording layer materials are required that are employed according to the crystallization rate needed in each layer as described above. Therefore when a recording layer is formed from one target, for example, in an information recording medium having four information layers, a maximum four types of targets are required. Accordingly, the cost for targets is high and additional cost is required. The additional cost is cost that accompanies an increase in the number of film formation chambers. Therefore, it is difficult to reduce the cost of the information recording medium.

SUMMARY OF THE INVENTION

The present invention is intended to provide an information recording medium that is capable of high-speed recording and has good signal storage stability even when the recording layer is thin. The present invention also is intended to provide, at low cost, an information recording medium that is capable of high-speed recording and has good signal storage stability even when the recording layer is thin, by forming recording layers having desired crystallization rates from limited targets.

A first information recording medium of the present invention includes a recording layer whose phase changes by irradiation with a laser beam or application of current, wherein the recording layer contains, as its main component, a composite composed of Ge and Sb that are essential components and Te that is an optional component, and the composite has a composition within a region enclosed by:

point (a) (35, 65, 0),
point (b) (36.9, 60, 3.1),
point (c) (3.2, 60, 36.8), and
point (d) (5, 95, 0)
in terms of a coordinate (Ge, Sb, Te)=(x, y, z) on a triangular coordinate shown in FIG. 1, where point (b) corresponds to a point at Sb=60 on $Ge_{60}Te_{40}$—$Ge_{35}Sb_{65}$, point (c) corresponds to a point at Sb=60 on Te—$Ge_5Sb_{95}$, and the region includes lines extending between point (a) and point (b), point (b) and point (c), point (c) and point (d), and point (d) and point (a).

For example, the expression "on $Ge_{60}Te_{40}$—$Ge_{35}Sb_{65}$" denotes "on the line extending between a point $Ge_{60}Te_{40}$ and a point $Ge_{35}Sb_{65}$" on the triangular coordinate shown in FIG. 1. Hereinafter, in this specification, similar expressions are used with the same meaning. Furthermore, "a composite composed of Ge and Sb that are essential components and Te that is an optional component" is one containing both a binary composite composed of Ge and Sb and a ternary composite composed of Ge, Sb, and Te. Moreover, in this specification, "the recording layer contains, as its main component, a composite" indicates that when the sum total of all the atoms contained in the recording layer is taken as 100 atom %, the sum total of all the atoms contained in the composite is at least 85 atom %, preferably at least 90 atom %.

A second information recording medium of the present invention includes a recording layer whose phase changes by irradiation with a laser beam or application of current, wherein the recording layer is formed with a first component layer to an X-th component layer (where X is an integer of 2 or more) that are disposed in that order in a thickness direction of the recording layer, and an m-th component layer (where m is an integer that satisfies 1≦m≦X), which is at least one component layer selected from the first component layer to the X-th component layer, contains Ge—Sb or Te.

A target of the present invention includes, as its main component, a composite that has a composition within a region enclosed by:
point (a) (35, 65, 0),
point (b) (36.9, 60, 3.1),
point (c) (3.2, 60, 36.8), and
point (d) (5, 95, 0)
in terms of a coordinate (Ge, Sb, Te)=(x, y, z) on a triangular coordinate shown in FIG. 1, where point (b) corresponds to a point at Sb=60 on $Ge_{60}Te_{40}$—$Ge_{35}Sb_{65}$, point (c) corresponds to a point at Sb=60 on Te—$Ge_5Sb_{95}$, and the region includes lines extending between point (a) and point (b), point (b) and point (c), point (c) and point (d), and point (d) and point (a). In this specification, "a target includes, as its main component, a composite" indicates that when the sum total of all the atoms contained in the target is taken as 100 atom %, the sum total of all the atoms contained in the composite is at least 85 atom %, preferably at least 90 atom %.

A first method for manufacturing an information recording medium of the present invention is a method for manufacturing an information recording medium including a recording layer whose phase changes by irradiation with a laser beam or application of current, wherein the method includes a step of forming the recording layer using a target according to the present invention, with the recording layer containing, as its main component, a composite having a composition within a region enclosed by:
point (a) (35, 65, 0),
point (b) (36.9, 60, 3.1),
point (c) (3.2, 60, 36.8), and
point (d) (5, 95, 0)
in terms of a coordinate (Ge, Sb, Te)=(x, y, z) on a triangular coordinate shown in FIG. 1, where point (b) corresponds to a point at Sb=60 on $Ge_{60}Te_{40}$—$Ge_{35}Sb_{65}$, point (c) corresponds to a point at Sb=60 on Te—$Ge_5Sb_{95}$, and the region includes lines extending between point (a) and point (b), point (b) and point (c), point (c) and point (d), and point (d) and point (a).

A second method for manufacturing an information recording medium of the present invention is a method for manufacturing an information recording medium having a recording layer whose phase changes by irradiation with a laser beam or application of current, wherein the recording layer is formed with a first component layer to an X-th component layer (where X is an integer of 2 or more) that are disposed in that order in a thickness direction of the recording layer, and the method includes a step of forming an m-th component layer (where m is an integer that satisfies 1≦m≦X), which is at least one component layer selected from the first component layer to the X-th component layer, using a target containing Ge—Sb or Te.

Phase change materials (recording layer materials) to be used for the recording layers of the first and second information recording media of the present invention each have a high crystallization rate and are capable of recording at a high linear velocity even when they are thin. Furthermore, they also allow marks to be formed stably even at a lower linear velocity and have wider linear velocity margins compared to conventional ones. Moreover, they have good signal storage stability.

Conceivably, the above-mentioned effects can be obtained since the composite contained as a main component in the recording layer contains at least 60% of Sb, which provides the recording layer with high crystallization ability, and further Ge is contained therein, which makes it possible to stabilize amorphous marks. Furthermore, it is conceivable that Te is contained, so that a greater optical variation is obtained and good signal properties of the information recording medium also are obtained.

Moreover, like the second information recording medium of the present invention, since the recording layer is formed of a plurality of component layers, similar recording properties as described above can be obtained even when it is configured to have a plurality of recording layers (even in the case of a structure with multilayered information layers). Furthermore, even when a plurality of recording layers have different composition ratios from each other, they can be formed using the same target by changing the ratio in thickness of the laminated layers. Therefore, in the second information recording medium of the present invention, it is no longer necessary to prepare targets whose number corresponds to the number of recording layer compositions with respect to one information recording medium, and thus the cost of information recording media can be reduced.

With the target of the present invention, for example, the first and second information recording media as described above can be manufactured easily.

Furthermore, the methods of manufacturing the first and second information recording media of the present invention make it possible to manufacture first and second information recording media having effects as described above.

DETAILED DESCRIPTION OF THE INVENTION

First, a first information recording medium of the present invention is described.

The first information recording medium of the present invention is an information recording medium including a recording layer whose phase changes by irradiation with a laser beam or application of current. The recording layer contains, as its main component, a composite composed of Ge and Sb that are essential components and Te that is an optional component. The composite has a composition within a region enclosed by:
point (a) (35, 65, 0),
point (b) (36.9, 60, 3.1),
point (c) (3.2, 60, 36.8), and
point (d) (5, 95, 0)
in terms of a coordinate (Ge, Sb, Te)=(x, y, z) on the triangular coordinate shown in FIG. 1, where point (b) corresponds to a point at Sb=60 on $Ge_{60}Te_{40}$—$Ge_{35}Sb_{65}$, point (c) corresponds to a point at Sb=60 on Te—$Ge_5Sb_{95}$, and the region includes lines extending between point (a) and point (b), point (b) and point (c), point (c) and point (d), and point (d) and point (a).

When a recording layer is produced using such a composite, an information recording medium can be provided in which, for example, even when the recording layer is made thin (for instance, even when the thickness thereof is as thin as about 2 to 7 nm), high-speed recording can be performed using a blue-violet laser, and further good signal storage stability is obtained.

Figure 1:
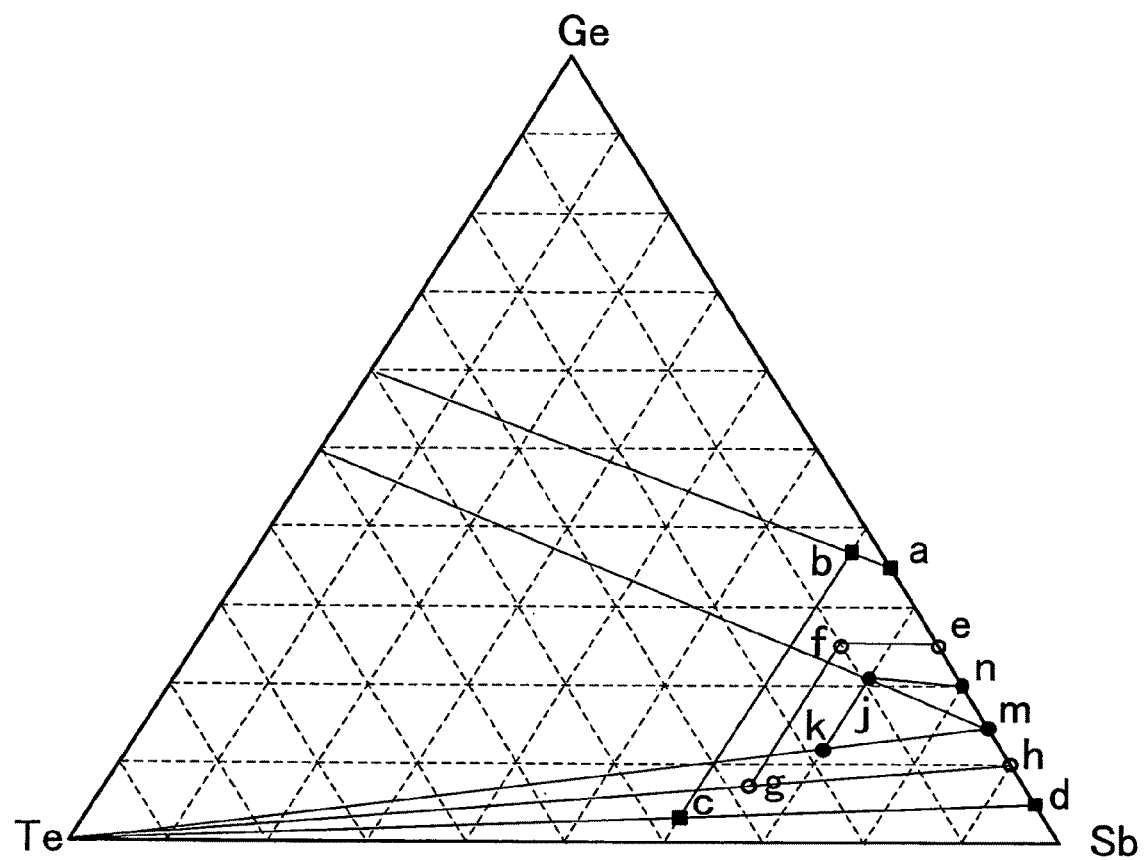
FIG. 1 is a ternary diagram of Ge—Sb—Te.

Preferably, the composite has a composition within a region enclosed by:
point (e) (25, 75, 0),
point (f) (25, 65, 10),
point (g) (7.2, 65, 27.8), and
point (h) (10, 90, 0)
on the triangular coordinate shown in FIG. 1, where point (g) corresponds to a point at Sb=65 on Te—$Ge_{10}Sb_{90}$, and the region includes lines extending between point (e) and point (f), point (f) and point (g), point (g) and point (h), and point (h) and point (e). The use of such a composite for the recording layer is further suitable for high speed recording and allows good quality of reproduced signals to be obtained.

Furthermore, it is more preferable that the composite have a composition within a region enclosed by:
point (j) (20.9, 70, 9.1),
point (k) (11.8, 70, 18.2),
point (m) (14.5, 85.5, 0), and
point (n) (20, 80, 0) on the triangular coordinate shown in FIG. 1, where point (j) corresponds to a point at Sb=70 on $Ge_{50}Te_{50}$—$Ge_{14.5}Sb_{85.5}$, point (k) corresponds to a point at Sb=70 on Te—$Ge_{14.5}Sb_{85.5}$, and the region includes respective lines extending between point (j) and point (k), point (k) and point (m), point (m) and point (n), and point (n) and point (j). The use of such a composite for the recording layer is further suitable for high speed recording and allows good quality of reproduced signals to be obtained.

The recording layer further may contain an element M, where M denotes at least one element selected from N, Bi, C, Si, Sn, Ga, In, Zn, Cu, Ag, Au, Ni, Pd, Pt, Co, Rh, Ru, Mn, Cr, Mo, W, V, Nb, Ta, Ti, Zr, Hf, Y, La, Ce, Pr, Nd, Gd, Tb, and Dy.

In this case, it is preferable that the content of the element M in the recording layer be 15 atom % or lower. The use of this composite is further suitable for high speed recording and allows good quality of reproduced signals to be obtained.

Furthermore, it is preferable that the element M be at least one element selected from C, Si, Sn, Bi, In and Mn. The use of these elements is further suitable for high speed recording and allows good quality of reproduced signals to be obtained.

The first information recording medium of the present invention includes a first information layer to an N-th information layer that are disposed in that order from the opposite side to the laser beam incident side, and at least one information layer selected from the first information layer to the N-th information layer may include the present recording layer.

In this case, it is preferable that the first information layer include the present recording layer and the recording layer have a thickness of 30 nm or less.

Preferably, at least one of the second information layer and the third information layer includes the present recording layer, and the recording layer has a thickness of 15 nm or less.

Preferably, the N is at least 4, and at least one information layer selected from the fourth information layer to the N-th information layer includes the present recording layer, and the recording layer has a thickness of 4 nm or less.

Moreover, the first information recording medium of the present invention further includes a first adjacent layer and a second adjacent layer that are disposed adjacent to the recording layer, and at least one of the first adjacent layer and the second adjacent layer may contain an oxide of at least one element selected from Si, Zr, Hf, Cr, In, Ga, Al, Ti, Nb, Y, and Dy.

The first information recording medium of the present invention is characterized in that the recording layer contains, as its main component, a composite having the composition described above, and this recording layer may consist substantially of the composite. In this specification, an expression "consist substantially of a composite" denotes that no other components are contained or even when other components are contained, the content thereof is as little as that of impurities contained therein, specifically less than 1 atom %.

The composite contains both a binary composite composed of Ge and Sb and a ternary composite composed of Ge, Sb, and Te. A recording layer produced using these composites is rich in Sb and therefore has high crystallization ability, and it also contains Ge and therefore can stabilize amorphous marks. Since in a recording layer produced using a ternary composite further containing Te in addition to Sb and Ge, the amount of optical variation between a crystalline state and an amorphous state further increases, better signal quality can be obtained as compared to the case where a binary composite is used. Accordingly, the use of a ternary composite composed of Ge, Sb, and Te allows a greater optical variation to be obtained and makes it possible to further improve the signal quality of the information recording medium.

Next, a second information recording medium of the present invention is described.

The second information recording medium of the present invention includes a recording layer whose phase changes by irradiation with a laser beam or application of current, wherein the recording layer is formed with a first component layer to an X-th component layer (where X is an integer of 2 or more) that are disposed in that order in the thickness direction of the recording layer, and an m-th component layer (where m is an integer that satisfies $1 \leq m \leq X$), which is at least one component layer selected from the first component layer to the X-th component layer, contains Ge—Sb or Te.

When X is 3 or more, i.e. when the recording layer includes at least 3 component layers, the first component layer and the X-th component layer may be formed of the same material. The first component layer and the X-th component layer may be formed of different materials from each other.

Preferably, each thickness dm (nm) of the first component layer to the X-th component layer satisfies $0.05 \leq dm \leq 25$.

Furthermore, the m-th component layer further may contain an element M, where M is at least one element selected from N, Bi, C, Si, Sn, Ga, In, Zn, Cu, Ag, Au, Ni, Pd, Pt, Co, Rh, Ru, Mn, Cr, Mo, W, V, Nb, Ta, Ti, Zr, Hf, Y, La, Ce, Pr, Nd, Gd, Tb, and Dy.

Preferably, the content of the element M in the m-th component layer is 15 atom % or less. The use of this composition is further suitable for high speed recording and allows good quality of reproduced signals to be obtained.

Preferably, the element M is at least one element selected from C, Si, Sn, Bi, In, and Mn. The use of these elements is further suitable for high speed recording and allows good quality of reproduced signals to be obtained.

The m-th component layer may contain a material that is represented by a composition formula, $Ge_p Sb_{100-p}$ (atom %), where p satisfies $0<p<100$, or $Ge_q Te_{100-q}$ (atom %), where q satisfies $0 \leq q<100$.

Furthermore, it is preferable that p satisfy $5 \leq p \leq 35$ or q satisfy $0 \leq q \leq 60$. The use of these compositions is further suitable for high speed recording and allows good quality of reproduced signals to be obtained.

Moreover, it is more preferable that p satisfy $10 \leq p \leq 20$ or q satisfy $0 \leq q \leq 60$. The use of these compositions is further suitable for high speed recording and allows good quality of reproduced signals to be obtained.

The second information recording medium of the present invention may include a first information layer to an N-th information layer that are disposed in that order from the opposite side to the laser beam incident side, and at least one information layer selected from the first information layer to the N-th information layer may include the recording layer.

The second information recording medium of the present invention further includes a first adjacent layer and a second adjacent layer that are disposed adjacent to the recording layer, and at least one of the first adjacent layer and the second adjacent layer may contain an oxide of at least one element selected from Si, Zr, Hf, Cr, In, Ga, Al, Ti, Nb, Y, and Dy.

Next, a first method for manufacturing an information recording medium of the present invention (hereinafter, described simply as a first manufacturing method) is described. In the present invention, a recording layer of the information recording medium can be formed by a sputtering method.

A target of the present invention can be used for the first manufacturing method of the present invention and contains, as its main component, a composite that has a composition within a region enclosed by:

point (a) (35, 65, 0),
point (b) (36.9, 60, 3.1),
point (c) (3.2, 60, 36.8), and
point (d) (5, 95, 0)

in terms of a coordinate (Ge, Sb, Te)=(x, y, z) on the triangular coordinate shown in FIG. 1, where point (b) corresponds to a point at Sb=60 on $Ge_{60}Te_{40}$—$Ge_{35}Sb_{65}$, point (c) corresponds to a point at Sb=60 on Te—$Ge_5Sb_{95}$, and the region includes lines extending between point (a) and point (b), point (b) and point (c), point (c) and point (d), and point (d) and point (a).

The first manufacturing method of the present invention is a method for manufacturing an information recording medium including a recording layer whose phase changes by irradiation with a laser beam or application of current, wherein the method includes a step of forming the recording layer using the target of the present invention, with the recording layer containing, as its main component, a composite having a composition within a region enclosed by:

point (a) (35, 65, 0),
point (b) (36.9, 60, 3.1),
point (c) (3.2, 60, 36.8), and
point (d) (5, 95, 0)

in terms of a coordinate (Ge, Sb, Te)=(x, y, z) on the triangular coordinate shown in FIG. 1, where point (b) corresponds to a point at Sb=60 on $Ge_{60}Te_{40}$—$Ge_{35}Sb_{65}$, point (c) corresponds to a point at Sb=60 on Te—$Ge_5Sb_{95}$, and the region includes lines extending between point (a) and point (b), point (b) and point (c), point (c) and point (d), and point (d) and point (a).

Furthermore, in the aforementioned step, the recording layer formed using the target may contain, as its main component, a composite having a composition within a region enclosed by:
point (e) (25, 75, 0),
point (f) (25, 65, 10),
point (g) (7.2, 65, 27.8), and
point (h) (10, 90, 0)
on the triangular coordinate shown in FIG. 1, where point (g) corresponds to a point at Sb=65 on Te—$Ge_{10}Sb_{90}$, and the region includes lines extending between point (e) and point (i), point (f) and point (g), point (g) and point (h), and point (h) and point (e).

Moreover, in the aforementioned step, the recording layer formed using the target may contain, as its main component, a composite having a composition within a region enclosed by:
point (j) (20.9, 70, 9.1),
point (k) (11.8, 70, 18.2),
point (m) (14.5, 85.5, 0), and
point (n) (20, 80, 0)
on the triangular coordinate shown in FIG. 1, where point (j) corresponds to a point at Sb=70 on $Ge_{50}Te_{50}$—$Ge_{14.5}Sb_{85.5}$, point (k) corresponds to a point at Sb=70 on Te—$Ge_{14.5}Sb_{85.5}$, and the region includes lines extending between point (j) and point (k), point (k) and point (m), point (m) and point (n), and point (n) and point (j).

The target further may contain an element M, where M denotes at least one element selected from N, Bi, C, Si, Sn, Ga, In, Zn, Cu, Ag, Au, Ni, Pd, Pt, Co, Rh, Ru, Mn, Cr, Mo, W, V, Nb, Ta, Ti, Zr, Hf, Y, La, Ce, Pr, Nd, Gd, Tb, and Dy, and in the aforementioned step, the recording layer may be formed using the target.

The target further may contain an element M, where M denotes at least one element selected from N, Bi, C, Si, Sn, Ga, In, Zn, Cu, Ag, Au, Ni, Pd, Pt, Co, Rh, Ru, Mn, Cr, Mo, W, V, Nb, Ta, Ti, Zr, Hf, Y, La, Ce, Pr, Nd, Gd, Tb, and Dy.

In this case, it is preferable that the content of the element M in the target be 15 atom % or lower.

Preferably, the element M is at least one element selected from C, Si, Sn, Bi, In, and Mn.

When the information recording medium includes a first information layer to an N-th information layer that are disposed in that order from the opposite side to the laser beam incident side and at least one information layer selected from the first information layer to the N-th information layer includes the present recording layer, the recording layer may be formed using the target in the aforementioned step.

Furthermore, when the information recording medium further includes a first adjacent layer and a second adjacent layer that are disposed adjacent to the recording layer, the first manufacturing method of the present invention further may include a step of forming at least one of the first adjacent layer and the second adjacent layer using a target containing an oxide of at least one element selected from Si, Zr, Hf, Cr, In, Ga, Al, Ti, Nb, Y, and Dy.

Next, a second method for manufacturing an information recording medium of the present invention (hereinafter, described simply as a second manufacturing method) is described. In the present invention, a recording layer of the information recording medium is formed by the sputtering method.

A second manufacturing method of the present invention is a method for manufacturing an information recording medium having a recording layer that undergoes a phase change by laser beam irradiation or current application, wherein the recording layer is formed with a first component layer to an X-th component layer (where X is an integer of 2 or more) that are disposed in that order in the thickness direction of the recording layer, and the method includes a step of forming an m-th component layer (where m is an integer that satisfies $1 \leq m \leq X$), which is at least one component layer selected from the first component layer to the X-th component layer, using a target containing Ge—Sb or Te.

The target further may contain an element M, where M is at least one element selected from N, Bi, C, Si, Sn, Ga, In, Zn, Cu, Ag, Au, Ni, Pd, Pt, Co, Rh, Ru, Mn, Cr, Mo, W, V, Nb, Ta, Ti, Zr, Hf, Y, La, Ce, Pr, Nd, Gd, Tb, and Dy, and in the aforementioned step, the m-th component layer may be formed using the target.

In this case, it is preferable that the content of the element M in the target be 15 atom % or lower.

Preferably, the element M is at least one element selected from C, Si, Sn, Bi, In, and Mn.

In the aforementioned step, the m-th component layer containing a material that is represented by a composition formula, $Ge_pSb_{100-p}$ (atom %), where p satisfies $0<p<100$, or $Ge_qTe_{100-q}$ (atom %), where q satisfies $0 \leq q<100$ may be formed using the target.

Furthermore, it is preferable that in the m-th component layer, p satisfy $5 \leq p \leq 35$ or q satisfy $0 \leq q \leq 60$.

Moreover, it is more preferable that in the m-th component layer, p satisfy $10 \leq p \leq 20$ or q satisfy $0 \leq q \leq 60$.

When the information recording medium includes a first information layer to an N-th information layer that are disposed in that order from the opposite side to the laser beam incident side and at least one information layer selected from the first information layer to the N-th information layer includes the present recording layer, the m-th component layer of the recording layer may be formed using the target in the aforementioned step.

In the second manufacturing method of the present invention, when the information recording medium further includes a first adjacent layer and a second adjacent layer that are disposed adjacent to the recording layer, the method further may include a step of forming at least one of the first adjacent layer and the second adjacent layer using a target that contains an oxide of at least one element selected from Si, Zr, Hf, Cr, In, Ga, Al, Ti, Nb, Y, and Dy.

Hereinafter, embodiments of the first and second information recording media of the present invention as well as the first and second manufacturing methods of the present invention are described with reference to the drawings. The embodiments described below are examples and the present invention is not limited to the following embodiments. In the following embodiments, identical components may be indicated with identical numerals and symbols and the same description may not be repeated.

Embodiment 1

Figure 2:
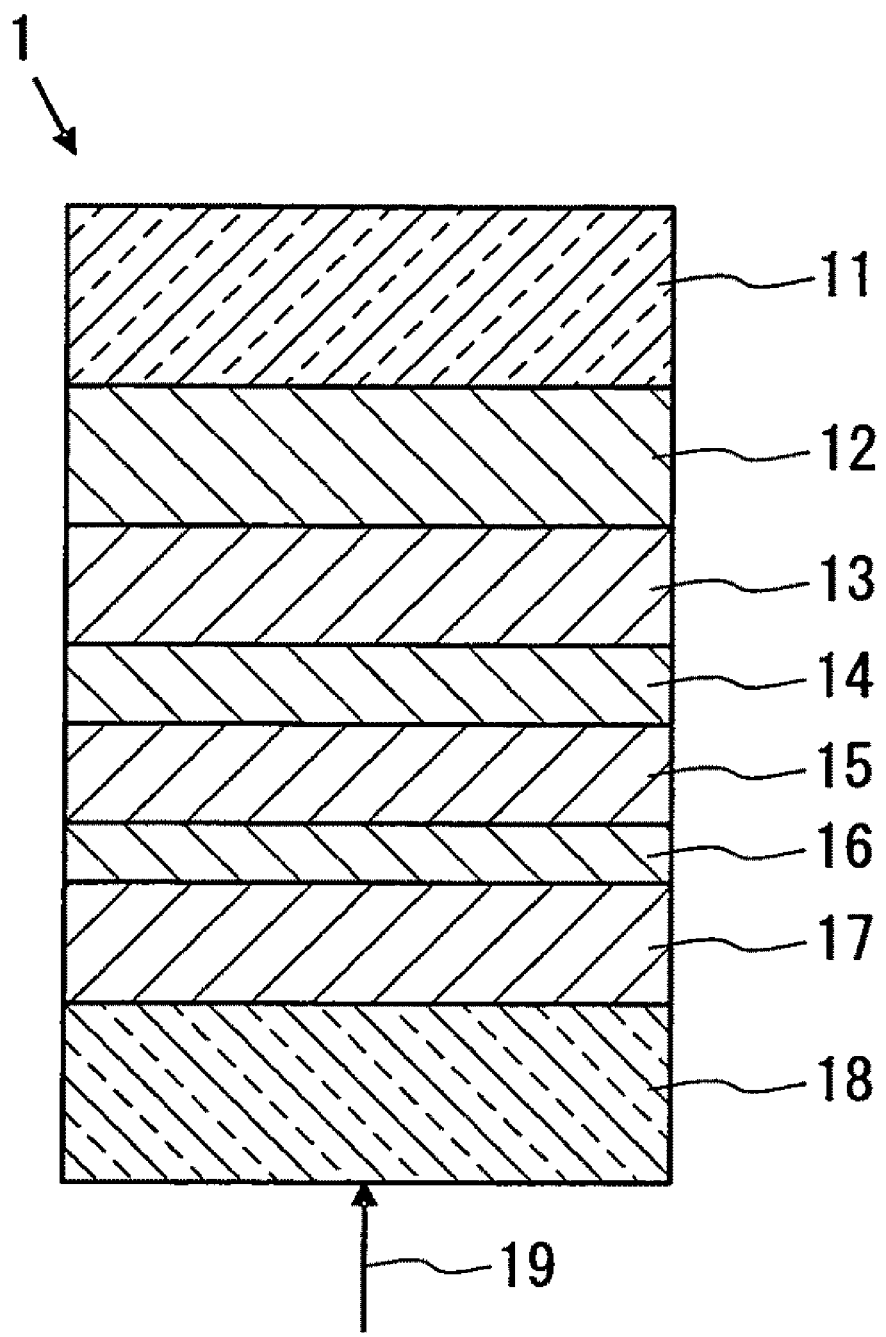
FIG. 2 is a partial cross-sectional view of an information recording medium according to Embodiment 1 of the present invention.

An example of information recording media that record and reproduce information using a laser beam (an example of the first information recording medium of the present invention) is described as Embodiment 1 of the present invention. FIG. 2 shows a partial cross-sectional view of the optical information recording medium.

The information recording medium 1 shown in FIG. 2 is formed with a reflective layer 12, a second dielectric layer 13, a second interface layer 14, a recording layer 15, a first interface layer 16, a first dielectric layer 17, and a cover layer 18 that are disposed sequentially on the surface of a substrate 11. This information recording medium 1 is irradiated with an energy beam (generally, a laser beam) 19 for recording and reproduction from the first dielectric layer 17 side.

The cover layer 18 is formed of, for example, a dielectric or a resin such as a photocurable resin (particularly, an ultraviolet curable resin) or a slow-acting thermosetting resin, and preferably has low optical absorption with respect to a laser beam to be used. Glass or a resin such as polycarbonate, amorphous polyolefin, or polymethyl methacrylate (PMMA) can be used for the cover layer 18. When these materials are used, the cover layer 18 is formed by, for example, bonding it to the first dielectric layer 17 with a resin such as a photocurable resin (particularly, an ultraviolet curable resin) or a slow-acting thermosetting resin.

The substrate 11 is a disk-shaped transparent substrate. For example, glass or a resin such as polycarbonate, amorphous polyolefin, or PMMA can be used as the material to be used for the substrate 11. A guide groove (with a track pitch of 0.32 μm) for guiding the laser beam may be formed at the surface of the substrate 11 on the recording layer 15 side if necessary. Preferably, the surface of the substrate 11 opposite to the recording layer 15 is smooth. The substrate 11 has a thickness of about 500 μm to 1300 μm. However, particularly when the cover layer 18 has a thickness of about 100 μm (a thickness that allows good recording and reproduction to be performed at an numerical aperture (NA) of 0.85), it is preferable that the substrate 11 have a thickness in the range of 1050 μm to 1150 μm.

The reflective layer 12 has an optical function of increasing the amount of light to be absorbed by the recording layer 15. Furthermore, the reflective layer 12 also has a thermal function of quickly diffusing the heat generated in the recording layer 15 and facilitating amorphization of the recording layer 15. Moreover, the reflective layer 12 also has a function of protecting a multilayer film from the environment in which it is used.

The material to be used for the reflective layer 12 can be a single metal with a high thermal conductivity, such as Ag, Au, Cu, Al, Pt, Ti, and W. Furthermore, alloys also can be used including an Al alloy obtained by adding, for example, Cr, Ni, or Ti to Al, an Au alloy obtained by adding, for example, Cu, Cr, or Nd to Au, an Ag alloy obtained by adding, for example, Cu, Pd, Ga, In, or Nd to Ag, an Ag alloy obtained by adding, for example, Pd, Ti, Ru, Al, Au, Ni, Nd, Ga, Ca, In, Gd, or Y to Ag—Cu, an Ag alloy obtained by adding, for example, Au or Pd to Ag—Nd, an Ag alloy obtained by adding, for example, Sn or Ga to Ag—In, or an alloy such as Ag—Ga—Sn, Ag—Ga—Y, Ag—Ga—Al, Ag—Zn—Al, or Cu—Si. Particularly, the Ag alloy has a high thermal conductivity and therefore is suitable as the material for the reflective layer 12. The concentration of metal to be added to the Ag alloy is preferably 3 atom % or lower. Preferably, the reflective layer 12 has a thickness of at least 30 nm, which allows a sufficiently high thermal diffusion function to be obtained. Even in this range, when the reflective layer 12 is thicker than 240 nm, the thermal diffusion function may become too high and thereby the recording sensitivity may deteriorate. Accordingly, the thickness of the reflective layer 12 is more preferably in the range of 30 nm to 240 nm.

The second dielectric layer 13 has a function of adjusting the optical distance to increase optical absorptance of the recording layer 15 and a function of increasing the rate of change in amount of reflected light before and after recording to increase the signal amplitude. It also has a function of quickly diffusing the heat generated in the recording layer 15 into the reflective layer 12 to cool the recording layer 15. When it is excellent in this thermal diffusion effect, the thermal load on the recording layer 15 is reduced and thereby good repeated rewriting properties can be obtained. The material for the second dielectric layer 13 can be, for example, an oxide such as $SiO_2$, $ZrO_2$, $ZrSiO_4$, ZnO, $SnO_2$, $Bi_2O_3$, $HfO_2$, $Cr_2O_3$, $In_2O_3$, $Ga_2O_3$, $Al_2O_3$, $TiO_2$, $Nb_2O_5$, $Ta_2O_5$, $Y_2O_3$ or $Dy_2O_3$, a nitride such as C—N, Ti—N, Zr—N, Nb—N, Ta—N, Si—N, Ge—N, Cr—N, Al—N, Ge—Si—N or Ge—Cr—N, a carbide such as SiC, a sulfide such as ZnS, or a fluoride such as $LaF_3$, $CeF_3$ or $YF_3$. Furthermore, it can be a mixture of at least two selected therefrom. Specific examples include $ZrO_2$—$Y_2O_3$ (stabilized zirconia or partially stabilized zirconia), $ZrO_2$—$Cr_2O_3$, $ZrO_2$—$SiO_2$—$Cr_2O_3$, $ZrO_2$—$Y_2O_3$—$Cr_2O_3$, $ZrSiO_4$—$Cr_2O_3$, $ZrO_2$—$SiO_2$—ZnO, $ZrO_2$—$In_2O_3$, $ZrO_2$—$SiO_2$—$In_2O_3$, $ZrO_2$—$Y_2O_3$—$In_2O_3$, $ZrO_2$—$SiO_2$—$In_2O_3$—$Cr_2O_3$, $HfO_2$—$Cr_2O_3$, $HfO_2$—$SiO_2$—$Cr_2O_3$, $ZrO_2$—$Ga_2O_3$, $ZrO_2$—$SiO_2$—$Ga_2O_3$, $ZrO_2$—$Al_2O_3$, $ZrO_2$—$Ti_2O_3$, $SiO_2$—$TiO_2$, $TiO_2$—$Nb_2O_5$, $ZrO_2$—$Nb_2O_5$, $ZrO_2$—$Ta_2O_5$, $ZrO_2$—$SiO_2$—$Al_2O_3$, $ZrO_2$—$Dy_2O_3$, $ZrO_2$—$SiO_2$—$Dy_2O_3$, $Bi_2O_3$—$SiO_2$, $ZrO_2$—AlN, $Al_2O_3$—AlN, $ZrO_2$—$Cr_2O_3$—SiC, $SnO_2$—SiC, $ZrO_2$—$SiO_2$—ZnS, $SiO_2$—ZnS, $ZrO_2$—$SiO_2$—$LaF_3$, $ZrO_2$—$SiO_2$—$Cr_2O_3$—$LaF_3$, $ZrO_2$—$CeF_3$, $ZrO_2$—$SiO_2$—$CeF_3$, $ZrO_2$—$SiO_2$—$Cr_2O_3$—$CeF_3$, $Dy_2O_3$—$CeF_3$, and $ZrO_2$—$Dy_2O_3$—$CeF_3$. The thickness of the second dielectric layer 13 is preferably 2 nm to 50 nm, and more preferably 3 nm to 35 nm to further increase the rate of change in amount of reflected light.

The first interface layer 16 and the second interface layer 14 are layers disposed adjacent to the recording layer 15 and correspond to the first adjacent layer and the second adjacent layer in the first information recording medium of the present invention. The second interface layer 14 and the first interface layer 16 each serve as a barrier that prevents the diffusion of elements and mixing of moisture into the recording layer 15. Furthermore, since they are provided in contact with the recording layer 15, they have an effect of accelerating or suppressing the crystallization rate of the recording layer 15, and it is desirable for them to have excellent adhesiveness with respect to the recording layer 15 formed of a chalcogenide material. Preferably, a material with less optical absorption is used for the interface layers. Examples of the material to be used for the interface layers 14 and 16 include oxides such as $SiO_2$, $ZrO_2$, $ZrSiO_4$, ZnO, $SnO_2$, $Bi_2O_3$, $HfO_2$, $Cr_2O_3$, $In_2O_3$, $Ga_2O_3$, $Al_2O_3$, $TiO_2$, $Nb_2O_5$, $Y_2O_3$ and $Dy_2O_3$, nitrides such as C—N, Ti—N, Zr—N, Nb—N, Ta—N, Si—N, Ge—N, Cr—N, Al—N, Ge—Si—N and Ge—Cr—N, carbides such as SiC, sulfides such as ZnS, and fluorides such as $LaF_3$, $CeF_3$ and $YF_3$. The material also can be a mixture of at least two selected therefrom. Furthermore, it is preferable that they contain an oxide of at least one selected from Si, Zr, Hf, Cr, In, Ga, Ti, Nb, Y, and Dy. Specific examples thereof include $ZrO_2$—$Y_2O_3$ (stabilized zirconia or partially stabilized zirconia), $ZrO_2$—$Cr_2O_3$, $ZrO_2$—$SiO_2$—$Cr_2O_3$, $ZrO_2$—$Y_2O_3$—$Cr_2O_3$, $ZrSiO_4$—$Cr_2O_3$, $ZrO_2$—$In_2O_3$, $ZrO_2$—$SiO_2$—$In_2O_3$, $ZrO_2$—$Y_2O_3$—$In_2O_3$, $ZrO_2$—$SiO_2$—$In_2O_3$—$Cr_2O_3$, $HfO_2$—$Cr_2O_3$, $HfO_2$—$SiO_2$—$Cr_2O_3$, $ZrO_2$—$Ga_2O_3$, $ZrO_2$—$SiO_2$—$Ga_2O_3$, $ZrO_2$—$Al_2O_3$, $ZrO_2$—$Ti_2O_3$, $SiO_2$—$TiO_2$, $TiO_2$—$Nb_2O_5$, $ZrO_2$—$Nb_2O_5$, $ZrO_2$—$SiO_2$—$Al_2O_3$, $ZrO_2$—$Dy_2O_3$, $ZrO_2$—$SiO_2$—$Dy_2O_3$, $ZrO_2$—$Cr_2O_3$—SiC, $SnO_2$—SiC, $ZrO_2$—$SiO_2$—ZnS, $SiO_2$—ZnS, $ZrO_2$—$SiO_2$—$LaF_3$, $ZrO_2$—$SiO_2$—$Cr_2O_3$—$LaF_3$, $ZrO_2$—$CeF_3$, $ZrO_2$—$SiO_2$—$CeF_3$, $ZrO_2$—$SiO_2$—$Cr_2O_3$—$CeF_3$, $Dy_2O_3$—$CeF_3$, and $ZrO_2$—$Dy_2O_3$—$CeF_3$. Preferably, the interface layers 14 and 16 each have a thickness of 1 nm to 12 nm. When the interface layers are too thin, a sufficient barrier effect cannot be obtained, which causes elements to diffuse or moisture to be mixed into the recording layer 15 and thereby results in deterioration in signal quality. Furthermore, when they are excessively thick, the effect of accelerating or suppressing the crystallization on the recording layer 15 becomes excessively great, and thereby the recording/reproducing properties are deteriorated. Accordingly, the thickness is further preferably 3 nm to 10 nm.

The first dielectric layer 17 has not only a function of protecting the recording layer 15 from, for instance, moisture but also a function of adjusting the optical distance to increase the optical absorptance of the recording layer 15 and a function of increasing the rate of change in amount of reflected light before and after recording to increase the signal amplitude.

Examples of the material that can be used for the first dielectric layer 17 include oxides such as $TiO_2$, $ZrO_2$, $HfO_2$, $SiO_2$, $MgO$, $ZnO$, $Nb_2O_2$, $Ta_2O_5$ and $Al_2O_3$, and nitrides such as C—N, Ti—N, Zr—N, Nb—N, Ta—N, Si—N, Ge—N, Cr—N, Al—N, Ge—Si—N and Ge—Cr—N. Furthermore, sulfides such as ZnS and carbides such as SiC also can be used. In addition, a mixture of the above-mentioned materials also can be used. Moreover, the oxide-fluoride dielectric described with respect to the second dielectric layer 13 also can be used. Among these materials, for example, a mixture of ZnS and $SiO_2$ is an amorphous material, and has a high film forming rate, a high refractive index, high mechanical strength and high moisture resistance. Therefore the mixture of ZnS and $SiO_2$ is a particularly excellent material to be used for the first dielectric layer 17. The thickness of the first dielectric layer 17 can be determined by calculation based on the matrix method (see, for example, Hiroshi Kubota, "Wave Optics", Iwanami Shoten, 1971, Chapter 3) so that the following conditions are satisfied: the optical absorptance of the recording layer 15 is increased, and the rate of change in amount of reflected light between the case where the recording layer 15 is in a crystalline phase and the case where it is in an amorphous phase is increased. The specific thickness is desirably in the range of 10 nm to 150 nm and more preferably in the range of 25 nm to 80 nm.

The recording layer 15 is a part that characterizes the present invention. A material whose phase can change by an incident laser beam 19 can be used for the recording layer 15. The recording layer 15 contains, as its main component, a composite composed of essential components, Ge and Sb, and an optional component, Te. This composite has a composition within a region enclosed by:
point (a) (35, 65, 0),
point (b) (36.9, 60, 3.1),
point (c) (3.2, 60, 36.8), and
point (d) (5, 95, 0)
in terms of a coordinate (Ge, Sb, Te)=(x, y, z) on the triangular coordinate shown in FIG. 1, where point (b) corresponds to a point at Sb=60 on $Ge_{60}Te_{40}$—$Ge_{35}Sb_{65}$, point (c) corresponds to a point at Sb=60 on Te—$Ge_5Sb_{95}$, and the region includes lines extending between point (a) and point (b), point (b) and point (c), point (c) and point (d), and point (d) and point (a). The use of a composition within this region makes it possible to obtain an information recording medium that has a high crystallization temperature and high thermal stability, has a great optical variation between a crystalline region and an amorphous region (a recorded region and an unrecorded region), and is capable of rewriting at a high linear velocity. In this embodiment, the description is made with respect to the case where the recording layer 15 is composed substantially of the aforementioned composite.

In the composition within the range, an increase in Sb amount promotes crystallization, which increases the crystallization rate. Therefore in high linear velocity recording, the recording layer 15 has preferably a composition within a region enclosed by:
point (e) (25, 75, 0),
point (f) (25, 65, 10),
point (g) (7.2, 65, 27.8), and
point (h) (10, 90, 0)
on the triangular coordinate shown in FIG. 1, where point (g) corresponds to a point at Sb=65 on Te—$Ge_{10}Sb_{90}$, and the region includes lines extending between point (e) and point (f), point (f) and point (g), point (g) and point (h), and point (h) and point (e), and the recording layer 15 has further preferably a composition within a region enclosed by:
point (j) (20.9, 70, 9.1),
point (k) (11.8, 70, 18.2),
point (m) (14.5, 85.5, 0), and
point (n) (20, 80, 0),
where point (j) corresponds to a point at Sb=70 on $Ge_{50}Te_{50}$—$Ge_{14.5}Sb_{85.5}$, point (k) corresponds to a point at Sb=70 on Te—$Ge_{14.5}Sb_{85.5}$, and the region includes lines extending between point (j) and point (k), point (k) and point (m), point (m) and point (n), and point (n) and point (j).

Furthermore, when the recording layer 15 further contains an element M (where M denotes at least one element selected from N, Bi, C, Si, Sn, Ga, In, Zn, Cu, Ag, Au, Ni, Pd, Pt, Co, Rh, Ru, Mn, Cr, Mo, W, V, Nb, Ta, Ti, Zr, Hf, Y, La, Ce, Pr, Nd, Gd, Tb, and Dy), the optical variation between a crystalline region and an amorphous region can be increased and thereby the quality of reproduced signals can be improved. However, since excessive addition thereof may cause the crystallization rate to decrease, the amount of the element M to be added is preferably 15% or less. Moreover, when the element M is at least one element selected from C, Si, Sn, Bi, In and Mn, the quality of reproduced signals further can be improved.

With respect to the thickness of the recording layer 15, an excessive thickness thereof results in a large heat capacity and higher recording power is required. Therefore, the thickness is preferably 30 nm or less.

Next, a method for manufacturing the information recording medium 1 described in this embodiment (an example of the first manufacturing method of the present invention) is described.

The reflective layer 12, the second dielectric layer 13, the second interface layer 14, the recording layer 15, the first interface layer 16, and the first dielectric layer 17 can be formed by a sputtering method, which is one of vapor phase film forming methods. First, the substrate 11 (for example, with a thickness of 1100 μm) is disposed in a film forming apparatus.

Subsequently, the reflective layer 12 is formed. In this stage, when the substrate 11 has a guide groove formed therein, the reflective layer 12 is formed on the surface of the substrate where the groove is formed. The reflective layer 12 is formed by sputtering a target formed of metal or an alloy that composes the reflective layer 12, in a rare gas (for instance, it can be any one of Ar gas, Kr gas, and Xe gas, and among them, an inexpensive Ar gas is used preferably; this also applies to the rare gas to be described later) atmosphere or an atmosphere of a mixed gas of in a rare gas and a reactive gas (for instance, oxygen gas and nitrogen gas).

Next, the second dielectric layer 13 is formed on the reflective layer 12. The second dielectric layer 13 can be formed by sputtering in a rare gas atmosphere or in an atmosphere of a mixed gas of a rare gas and a reactive gas using a target formed of a mixture that composes the second dielectric layer 13.

Subsequently, the second interface layer 14 is formed on the second dielectric layer 13. The second interface layer 14 can be formed by sputtering in a rare gas atmosphere or in an atmosphere of a mixed gas of a rare gas and a reactive gas using a target formed of a mixture of a dielectric that composes the second interface layer 14. Furthermore, the second interface layer 14 also can be formed by reactive sputtering in an atmosphere of a mixed gas of a rare gas and a reactive gas using a target containing metal elements that compose the second interface layer 14.

Then the recording layer 15 is formed on the second interface layer 14. The recording layer 15 can be formed by sputtering in a rare gas atmosphere, in an atmosphere of a mixed gas of a rare gas and a reactive gas, or in an atmosphere of a mixed gas of Kr and a reactive gas, using a target formed of, for example, a Ge—Sb—Te alloy or a Ge—Sb—Te—M alloy according to the composition thereof. Furthermore, the recording layer 15 also can be formed by simultaneously sputtering respective targets of Ge, Sb, Te, or element M using a plurality of power supplies. The recording layer 15 also can be formed by simultaneously sputtering a binary target or a ternary target composed of a combination of elements selected from Ge, Sb, Te, and M using a plurality of power supplies. Similarly in these cases, the recording layer 15 can be formed by sputtering in a rare gas atmosphere, in an atmosphere of a mixed gas of a rare gas and a reactive gas, or in an atmosphere of a mixed gas of Kr and a reactive gas. The target for the recording layer 15 to be used in this embodiment can be one containing, as its main component, a composite having a composition within a region enclosed by:
point (a) (35, 65, 0),
point (b) (36.9, 60, 3.1),
point (c) (3.2, 60, 36.8), and
point (d) (5, 95, 0)
in terms of a coordinate (Ge, Sb, Te)=(x, y, z) on the triangular coordinate shown in FIG. 1, where point (b) corresponds to a point at Sb=60 on $Ge_{60}Te_{40}$—$Ge_{35}Sb_{65}$, point (c) corresponds to a point at Sb=60 on Te—$Ge_5Sb_{95}$, and the region includes lines extending between point (a) and point (b), point (b) and point (c), point (c) and point (d), and point (d) and point (a).

Subsequently, the first interface layer 16 is formed on the recording layer 15. The first interface layer 16 can be formed by sputtering in a rare gas atmosphere or in an atmosphere of a mixed gas of a rare gas and a reactive gas using a target formed of a mixture that composes the first interface layer 16. The first interface layer 16 also can be formed by reactive sputtering in an atmosphere of a mixed gas of a rare gas and a reactive gas using a target containing metal elements that compose the first interface layer 16.

Subsequently, the first dielectric layer 17 is formed on the first interface layer 16. The first dielectric layer 17 can be formed by sputtering in a rare gas atmosphere or in an atmosphere of a mixed gas of a rare gas and a reactive gas using a sputtering target formed of a mixture that composes the first dielectric layer 17. The first dielectric layer 17 also can be formed by reactive sputtering in an atmosphere of a mixed gas of a rare gas and a reactive gas using a target containing metal elements that compose the first dielectric layer 17.

The power supplies to be used in the sputtering processes described above can be direct current (DC) power supplies or radio frequency (RF) power supplies. The supply power can be 1 W to 10 kW. In this context, sputtering that is carried out using a DC power supply is referred to as "DC sputtering", while sputtering that is carried out using a RF power supply is referred to as "RF sputtering".

The pressure inside the film formation chamber during sputtering can be, for example, 0.01 Pa to 100 Pa.

Finally, the cover layer 18 is formed on the first dielectric layer 17. The cover layer 18 can be formed by applying a resin such as a photocurable resin (particularly, an ultraviolet curable resin) or a slow-acting thermosetting resin onto the first dielectric layer 17, carrying out spin coating and then curing the resin. The cover layer 18 may be formed using a disk-shaped substrate made of glass, or a resin such as polycarbonate, amorphous polyolefin or polymethyl methacrylate (PMMA). In this case, it can be formed by applying a resin such as a photocurable resin (particularly, an ultraviolet curable resin) or a slow-acting thermosetting resin onto the first dielectric layer 17, adhereing such a substrate thereto, spreading the resin uniformly by spin coating, and then curing it.

Besides the sputtering method, a vacuum vapor deposition method, an ion plating method, a chemical vapor deposition method (CVD method), and a molecular beam epitaxy method (MBE method) also can be used as the method for forming each layer.

After the formation of the first dielectric layer 17 or the cover layer 18, an initialization process can be carried out for crystallizing the whole surface of the recording layer 15 if necessary. This initialization can be carried out by laser beam irradiation.

Embodiment 2

Figure 3:
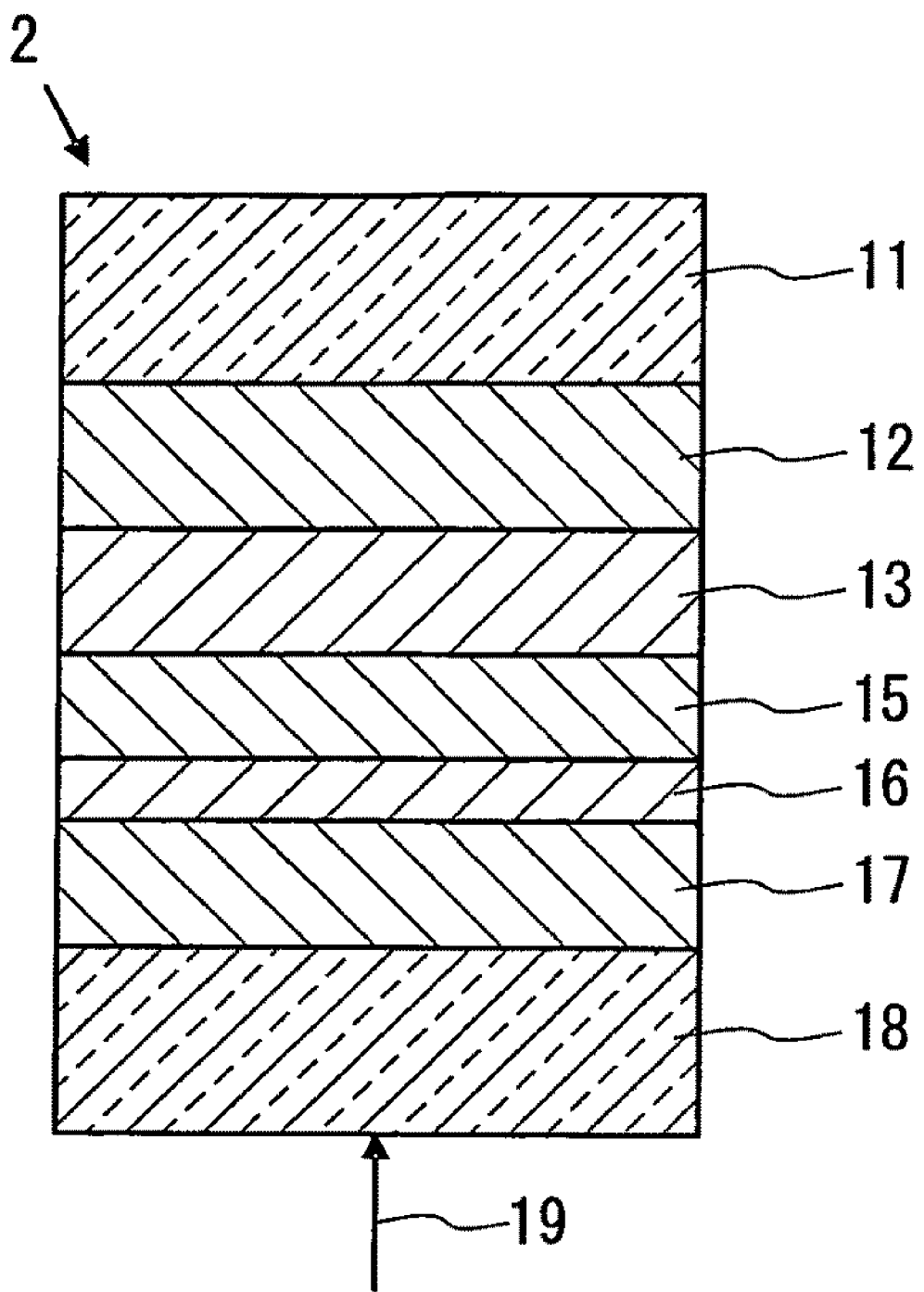
FIG. 3 is a partial cross-sectional view of an information recording medium according to Embodiment 2 of the present invention.

Another example of the information recording medium on or from which information is recorded or reproduced using a laser beam (another example of the first information recording medium of the present invention) is described as Embodiment 2 of the present invention. FIG. 3 shows a partial cross-sectional view of the optical information recording medium.

The information recording medium 2 shown in FIG. 3 is formed with a reflective layer 12, a second dielectric layer 13, a recording layer 15, a first interface layer 16, a first dielectric layer 17, and a cover layer 18 that are stacked in this order on the surface of a substrate 11. This information recording medium 2 is irradiated with an energy beam (generally, a laser beam) 19 for recording and reproduction from the first dielectric layer 17 side. In the information recording medium 2, the second dielectric layer 13 and the first interface layer 16 are layers (a first adjacent layer and a second adjacent layer) disposed adjacent to the recording layer 15.

The substrate 11, the reflective layer 12, the recording layer 15, the first interface layer 16, the first dielectric layer 17, and the cover layer 18 are identical to those of Embodiment 1 in material, function, and shape, respectively.

The material for the second dielectric layer 13 is the same as that described in Embodiment 1. The function thereof provides an effect of accelerating or suppressing the crystallization rate of the recording layer 15 in addition to those described in Embodiment 1, since it is provided adjacent to the recording layer 15. Furthermore, the second dielectric layer 13 is desired to have excellent adhesiveness with respect to the recording layer 15 formed of a chalcogenide material. Accordingly, it is more preferable that the material for the second dielectric layer 13 be the same as that used for the second interface layer 14 in Embodiment 1. As in Embodiment 1, the thickness of the second dielectric layer 13 can be determined by the calculation based on the matrix method. The specific thickness thereof is desirably in the range of 2 nm to 80 nm and more preferably in the range of 4 nm to 45 nm.

Next, a method for manufacturing the information recording medium 2 described in this embodiment (another example of the first manufacturing method of the present invention) is described.

First, the substrate 11 (for example, with a thickness of 1100 μm) is disposed in a film forming apparatus.

Subsequently, the reflective layer 12, the second dielectric layer 13, the recording layer 15, the first interface layer 16, and the first dielectric layer 17 are formed sequentially. The methods of forming them are the same as those described in Embodiment 1, respectively. Finally, the cover layer 18 is formed by the same method as that used in Embodiment 1.

After the formation of the first dielectric layer 17 or the cover layer 18, an initialization process can be carried out for crystallizing the whole surface of the recording layer 15 if necessary. This initialization can be carried out by laser beam irradiation.

Embodiment 3

Figure 4:
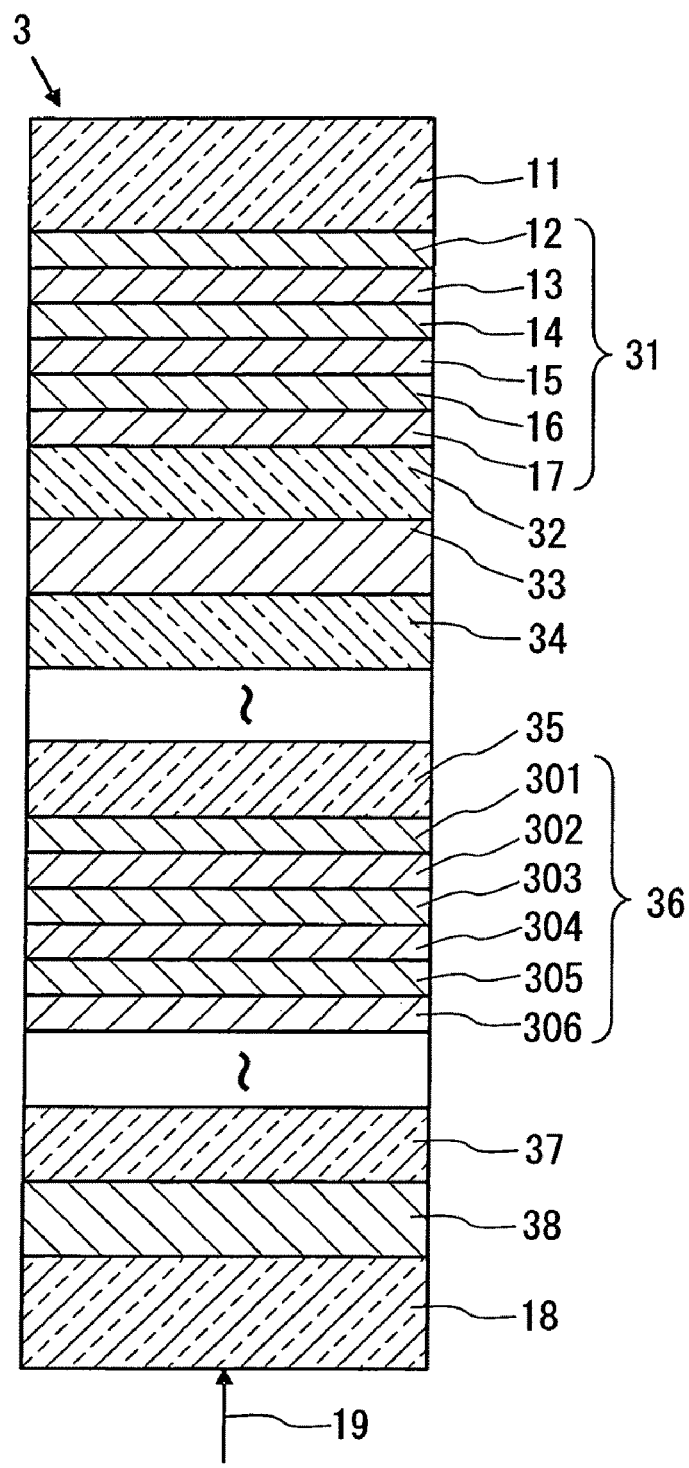
FIG. 4 is a partial cross-sectional view of an information recording medium according to Embodiment 3 of the present invention.

Still another example of the information recording medium on or from which information is recorded or reproduced using a laser beam (another example of the first information recording medium of the present invention) is described as Embodiment 3 of the present invention. FIG. 4 shows a partial cross-sectional view of the optical information recording medium. The information recording medium 3 of this embodiment includes N (where N is an integer of 2 or more) information layers for recording and reproducing information. It is a multilayer optical information recording medium in which information can be recorded on or reproduced from each information layer by irradiation with an energy beam (generally, a laser beam) 19 from one side. The information recording medium 3 is provided with a first information layer 31 to an N-th information layer 38 that are stacked sequentially, with, for example, optical separation layers 32, 34, 35, and 37 being interposed therebetween.

The substrate 11 and the cover layer 18 are identical to those described in Embodiment 1 in material, function, and shape, respectively.

The optical separation layers 32, 34, 35, 37, etc. are formed of, for example, a resin such as a photocurable resin (particularly, an ultraviolet curable resin) or a slow-acting thermosetting resin, or a dielectric. Preferably, they have low optical absorption with respect to a laser beam to be used. The optical separation layers 32, 34, 35, 37, etc. are used for differentiating focal positions of the first information layer 31, the second information layer 33, the n-th information layer 36 (n is an integer that satisfies $2 \leq n \leq N$), and the N-th information layer 38. Their thicknesses need to be equal to or more than the focal depth ΔZ that is determined by the numerical aperture (NA) of an objective lens and the wavelength λ of the laser beam. Assuming that the reference value of optical intensity at the focal point is 80% of that obtained in the case of aberration free, ΔZ can be approximated by $\Delta Z = \lambda / \{2(NA)^2\}$. The optical separation layers 32, 34, 35, 37, etc. each may have a guide groove formed on the laser beam incident side.

First, the structure of the first information layer 31 is described. The first information layer 31 is formed with a reflective layer 12, a second dielectric layer 13, a second interface layer 14, a recording layer 15, a first interface layer 16, and a first dielectric layer 17 that are disposed sequentially on the surface of a substrate 11. The substrate 11, the reflective layer 12, the second dielectric layer 13, the second interface layer 14, the recording layer 15, the first interface layer 16, and the first dielectric layer 17 are identical to those described in Embodiment 1 in material, function, and shape, respectively. That is, in the information recording medium 3 of this embodiment, the recording layer 15 included in the first information layer 31 corresponds to the recording layer of the first information recording medium of the present invention. In the first information layer 31, the second interface layer 14 does not always need to be provided.

Next, the structure of the n-th information layer 36 is described. FIG. 4 shows the structure of the n-th information layer 36. The n-th information layer 36 is formed with a transmittance adjusting layer 301, a reflective layer 302, a second dielectric layer 303, a recording layer 304, a first interface layer 305, and a first dielectric layer 306 that are disposed sequentially on the surface of the optical separation layer 35.

The transmittance adjusting layer 301 serves to adjust the transmittance of the n-th information layer 36. When provided, this layer can increase both the transmittance $T_c$ (%) of the n-th information layer 36 that is obtained when the recording layer is in a crystalline state and the transmittance $T_a$ (%) of the n-th information layer 36 that is obtained when the recording layer 304 is in an amorphous state. Specifically, when the transmittance adjusting layer 301 is provided, $T_c$ and $T_a$ can be increased by 2 to 10% as compared to the case where the transmittance adjusting layer 301 is absent. Furthermore, it also serves to diffuse quickly the heat generated in the recording layer 304 into the reflective layer 302 to cool the recording layer 304. In order to further increase the transmittance, the refractive index n1 and the extinction coefficient k1 of the transmittance adjusting layer 301 satisfy preferably $k1 \geq 2.0$ and $k1 \leq 0.1$ and further preferably $2.0 \leq n1 \leq 3.0$ and $k1 \leq 0.05$. The transmittance adjusting layer 301 can be formed using an oxide such as $TiO_2$, $ZrO_2$, $HfO_2$, $ZnO$, $Nb_2O_5$, $Ta_2O_5$, $Al_2O_3$, $Bi_2O_3$, $Y_2O_3$, or $CeO_2$, or a nitride such as Ti—N, Zr—N, Nb—N, Ta—N, Si—N, Ge—N, Cr—N, Al—N, Ge—Si—N, or Ge—Cr—N. Preferably, the thickness d1 thereof satisfies $(1/16)\lambda/n1 \leq d1 \leq (7/32)\lambda/n1$ or $(9/16)\lambda/n1 \leq d1 \leq (21/32)\lambda/n1$.

The reflective layer 302 can be formed using the same material as that used for the reflective layer 12 described in Embodiment 1 and also is identical thereto in function and shape. Preferably, the thickness thereof is 20 nm or less to allow the information layer to have transparency.

The material to be used for the second dielectric layer 303 can be that used for the second dielectric layer 13 or the second interface layer 14 of Embodiment 1. The second dielectric layer 303 serves to improve the optical absorptance of the recording layer 304 by adjusting the optical distance and to increase the signal amplitude by increasing the rate of change in amount of reflected light before and after recording. Furthermore, it also serves to diffuse quickly the heat generated in the recording layer 304 into the reflective layer 302 to cool the recording layer 304. Since the second dielectric layer 303 is provided in contact with the recording layer 304, it also provides an effect of accelerating or suppressing the crystallization rate of the recording layer. The thickness thereof can be determined by the calculation based on the matrix method.

The recording layer 304 can be formed using the same material as that used for the recording layer 15 described in Embodiment 1 and also is identical thereto in function and shape. However, it is preferable that the thickness thereof be as thin as possible to increase the transmittance with respect to the laser beam. When the n-th information layer 36 is the second or third information layer, the thickness of the recording layer 304 is preferably 15 nm or less. When it is the fourth information layer or one of those provided thereafter (i.e. one of the fourth information layer to the N-th information layer), the thickness of the recording layer 304 is preferably 4 nm or less.

In a multilayer optical information recording medium including N information layers, when a phase change material (the material used for the recording layer 15 in Embodiment 1) used in the present invention is used for the recording layer of at least one information layer, the material for the recording layers of the other information layers is not limited to the phase change material used in the present invention. For example, a material represented by a composition formula, $Ge_rM1_sM2_tTe_{100-(r+s+t)}$ (atom %) can be used. M1 is an element selected from Sb, Bi, and Sn. M2 is an element selected from Si, Ti, V, Fe, Co, Ni, Cu, Zr, Nb, Mo, Se, Ru, Rs, Pd, Mn, Ag, Al, Cr, Sn, Ga, In, Ta, Dy, Gd, Td, Os, Ir, W, Pt, and, Au. Preferably, r satisfies $30 \leq r \leq 50$, and further s satisfies $35 \leq s \leq 60$. Furthermore, it is preferable that t satisfy $0 \leq t \leq 20$. Moreover, a material containing, for example, Sb and an element M3 can be used. M3 is at least one element selected from Al, V, Mn, Ga, Ge, Se, Ag, In, Sn, Te, Pb, Bi, C, Si, Zn, and Au. Specifically, a material represented by $Sb_uM3_{100-u}$ (atom %) can be used. When u satisfies $50 \leq u \leq 95$, the information recording medium can have a large difference in reflectance between the case where the recording layer is in a crystalline phase and the case where it is in an amorphous phase, and thereby good recording and reproducing properties can be obtained. Particularly, when $75 \leq u \leq 95$, the crystallization rate is especially high and therefore good rewriting performance can be obtained at a high transmission rate. Furthermore, when $50 \leq u \leq 75$, the amorphous phase is especially stable, and thereby good recording performance can be obtained at a low transmission rate.

The recording layer of the other information layer also can be formed of an irreversible phase change material. Preferably, for example, TeOx+M4 (where M4 is an element such as Pd, Ge, Si, or Bi), as is disclosed in JP 7-25209 A (JP 2006849 B), is used as the irreversible phase change material. When the recording layer is formed of an irreversible phase change material, a write-once recording medium in which information can be written only once is obtained. In such an information recording medium, the present invention also can be used suitably in order to reduce the problems of recording sensitivity and signal storage stability.

The first interface layer 305 can be formed using the same material as that used for the first interface layer 16 described in Embodiment 1 and also is identical thereto in function and shape.

The first dielectric layer 306 can be formed using the same material as that used for the first dielectric layer 17 described in Embodiment 1 and also is identical thereto in function and shape. The thickness thereof can be determined by the calculation based on the matrix method.

Next, a method for manufacturing the information recording medium 3 described in this embodiment (another example of the first manufacturing method of the present invention) is described.

First, the substrate 11 (for example, with a thickness of 1100 μm) is disposed in a film forming apparatus.

Subsequently, in order to form the first information layer 31, the reflective layer 12, the second dielectric layer 13, the second interface layer 14, the recording layer 15, the first interface layer 16, and the first dielectric layer 17 are formed sequentially. The methods of forming them are the same as those described in Embodiment 1, respectively.

Thereafter, the optical separation layer 32 is formed on the first dielectric layer 17. The optical separation layer 32 can be formed by applying a resin such as a photocurable resin (particularly, an ultraviolet curable resin) or a slow-acting thermosetting resin onto the first information layer 31, carrying out spin coating and then curing the resin. When the optical separation layer 32 is to be provided with a guide groove, a transfer substrate (mold) with a groove having a predetermined shape formed at the surface thereof is placed on the resin that has not been cured yet, and then the substrate 11 and the transfer substrate are subjected to spin coating to adhere to each other. Thereafter, the resin is cured. Then the transfer substrate is stripped from the cured resin. Thus the optical separation layer 32 with a predetermined guide groove formed therein can be formed.

Subsequently, the second information layer 33 is formed and then the optical separation layer 34 is formed in the same manner as in the case of the optical separation layer 32. The method for forming the second information layer 33 is the same as that used for the n-th information layer described below.

The optical separation layer 35 is formed by the same method as that used for the optical separation layer 32, which is followed by formation of the n-th information layer 36. When the n-th information layer 36 is to be formed, the transmittance adjusting layer 301 is formed first. The transmittance adjusting layer 301 can be formed by sputtering in a rare gas atmosphere or in an atmosphere of a mixed gas of a rare gas and a reactive gas using a target formed of a dielectric that composes the transmittance adjusting layer 301. The transmittance adjusting layer 301 also can be formed by reactive sputtering in an atmosphere of a mixed gas of a rare gas and a reactive gas using a target containing metal elements that compose it.

Subsequently, the reflective layer 302 is formed on the transmittance adjusting layer 301. The reflective layer 302 can be formed by the same method as that used for the reflective layer 12 described in Embodiment 1.

Thereafter, the second dielectric layer 303 is formed on the reflective layer 302. The second dielectric layer 303 can be formed by the same method as that used for the second dielectric layer 13 or the second interface layer 14 described in Embodiment 1.

Subsequently, the recording layer 304 is formed on the second dielectric layer 303. The recording layer 304 can be formed by the same method as that used for the recording layer 15 described in Embodiment 1.

Then the first interface layer 305 is formed on the recording layer 304. The first interface layer 305 can be formed by the same method as that used for the first interface layer 16 described in Embodiment 1.

Subsequently, the first dielectric layer 306 is formed on the first interface layer 305. The first dielectric layer 306 can be formed by the same method as that used for the first dielectric layer 17 described in Embodiment 1.

Subsequently, the n+1-th to N−1-th information layers are produced, with optical separation layers being interposed therebetween. Thereafter, the optical separation layer 37 is formed by the same method as that used for forming the optical separation layer 32 and then the N-th information layer 38 is formed. Finally, the cover layer 18 is formed on the N-th information layer 38 by the same method as that used in Embodiment 1.

After the formation of each information layer or the cover layer 18, an initialization process can be carried out for crystallizing the whole surface of the recording layer of each information layer if necessary. In all cases, the initialization can be carried out by laser beam irradiation.

Embodiment 4

Figure 5:
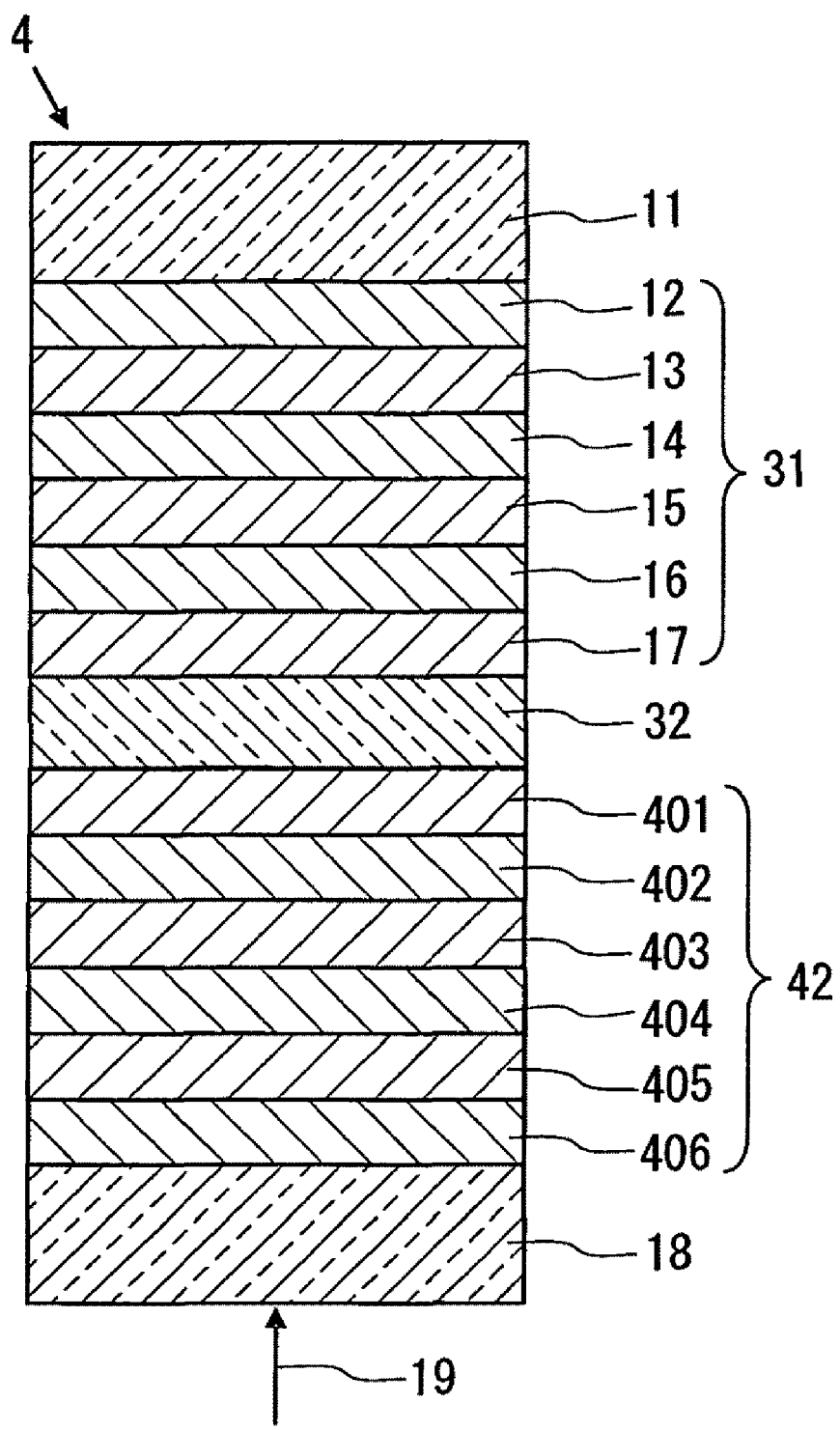
FIG. 5 is a partial cross-sectional view of an information recording medium according to Embodiment 4 of the present invention.

Yet another example of the information recording medium on or from which information is recorded or reproduced using a laser beam (another example of the first information recording medium of the present invention) is described as Embodiment 4 of the present invention. FIG. 5 shows a partial cross-sectional view of the optical information recording medium. The information recording medium 4 of this embodiment includes two information layers for recording and reproducing information (a first information layer 31 and a second information layer 42). It is an information recording medium in which information can be recorded or reproduced with respect to each information layer by irradiation with an energy beam (generally, a laser beam) 19 from one side.

A substrate 11, a first information layer 31, an optical separation layer 32, and a cover layer 18 can be formed using the same materials as those described in Embodiment 3 and also are identical to those described in Embodiment 3 in function and shape.

The structure of the second information layer 42 is described. The second information layer 42 is formed with a transmittance adjusting layer 401, a reflective layer 402, a second dielectric layer 403, a recording layer 404, a first interface layer 405, and a first dielectric layer 406 that are stacked in this order on the surface of the optical separation layer 32.

The transmittance adjusting layer 401 can be formed using the same material as that used for the transmittance adjusting layer 301 described in Embodiment 3 and also is identical thereto in function and shape. The specific thickness thereof is preferably 8 nm to 50 nm.

The reflective layer 402 can be formed using the same material as that used for the reflective layer 301 described in Embodiment 3 and also is identical thereto in function and shape. The specific thickness is preferably 3 nm to 20 nm.

The material used for the second dielectric layer 403 can be the same as that used for the second dielectric layer 303 employed in Embodiment 3 and also is identical thereto in function and shape. The specific thickness is desirably in the range of 3 nm to 45 nm and more preferably in the range of 5 nm to 30 nm.

The recording layer 404 can be formed using the same material as that used for the recording layer 304 described in Embodiment 3 and also is identical thereto in function and shape. The specific thickness is preferably 15 nm or less.

The first interface layer 405 can be formed using the same material as that used for the first interface layer 305 described in Embodiment 3 and also is identical thereto in function and shape. The specific thickness is preferably 2 nm to 10 nm.

The first dielectric layer 406 can be formed using the same material as that used for the first dielectric layer 306 described in Embodiment 3 and also is identical thereto in function and shape. The specific thickness is desirably in the range of 10 nm to 80 nm and more preferably in the range of 20 nm to 60 nm.

Next, a method for manufacturing the information recording medium 4 described in this embodiment (another example of the first manufacturing method of the present invention) is described.

First, the substrate 11 (for example, with a thickness of 1100 μm) is disposed in a film forming apparatus.

Subsequently, in order to form the first information layer 31, the reflective layer 12, the second dielectric layer 13, the second interface layer 14, the recording layer 15, the first interface layer 16, and the first dielectric layer 17 are formed sequentially. The methods of forming them are the same as those described in Embodiment 1, respectively.

Thereafter, the optical separation layer 32 is formed on the first dielectric layer 17. The formation method is the same as that described in Embodiment 3.

Subsequently, the second information layer 42 is formed. In the formation of the second information layer 42, the transmittance adjusting layer 401 is formed first. The transmittance adjusting layer 401 can be formed by the same method as that used for the transmittance adjusting layer 301 described in Embodiment 3.

Subsequently, the reflective layer 402 is formed on the transmittance adjusting layer 401. The reflective layer 402 can be formed by the same method as that used for the reflective layer 302 described in Embodiment 3.

Thereafter, the second dielectric layer 403 is formed on the reflective layer 402. The second dielectric layer 403 can be formed by the same method as that used for the second dielectric layer 303 described in Embodiment 3.

Subsequently, the recording layer 404 is formed on the second dielectric layer 403. The recording layer 404 can be formed by the same method as that used for the recording layer 304 described in Embodiment 3.

Then the first interface layer 405 is formed on the recording layer 404. The first interface layer 405 can be formed by the same method as that used for the first interface layer 305 described in Embodiment 3.

Subsequently, the first dielectric layer 406 is formed on the first interface layer 405. The first dielectric layer 406 can be formed by the same method as that used for the first dielectric layer 306 described in Embodiment 3.

Finally, the cover layer 18 is formed on the first dielectric layer 406 by the same method as in Embodiment 1.

After the formation of the first dielectric layer 17 or the cover layer 18, an initialization process can be carried out for crystallizing the whole surface of the recording layer 15 if necessary. After the formation of the first dielectric layer 406 or the cover layer 18, an initialization process can be carried out for crystallizing the whole surface of the recording layer 404 if necessary. In all cases, the initialization can be carried out by laser beam irradiation.

Embodiment 5

Figure 6:
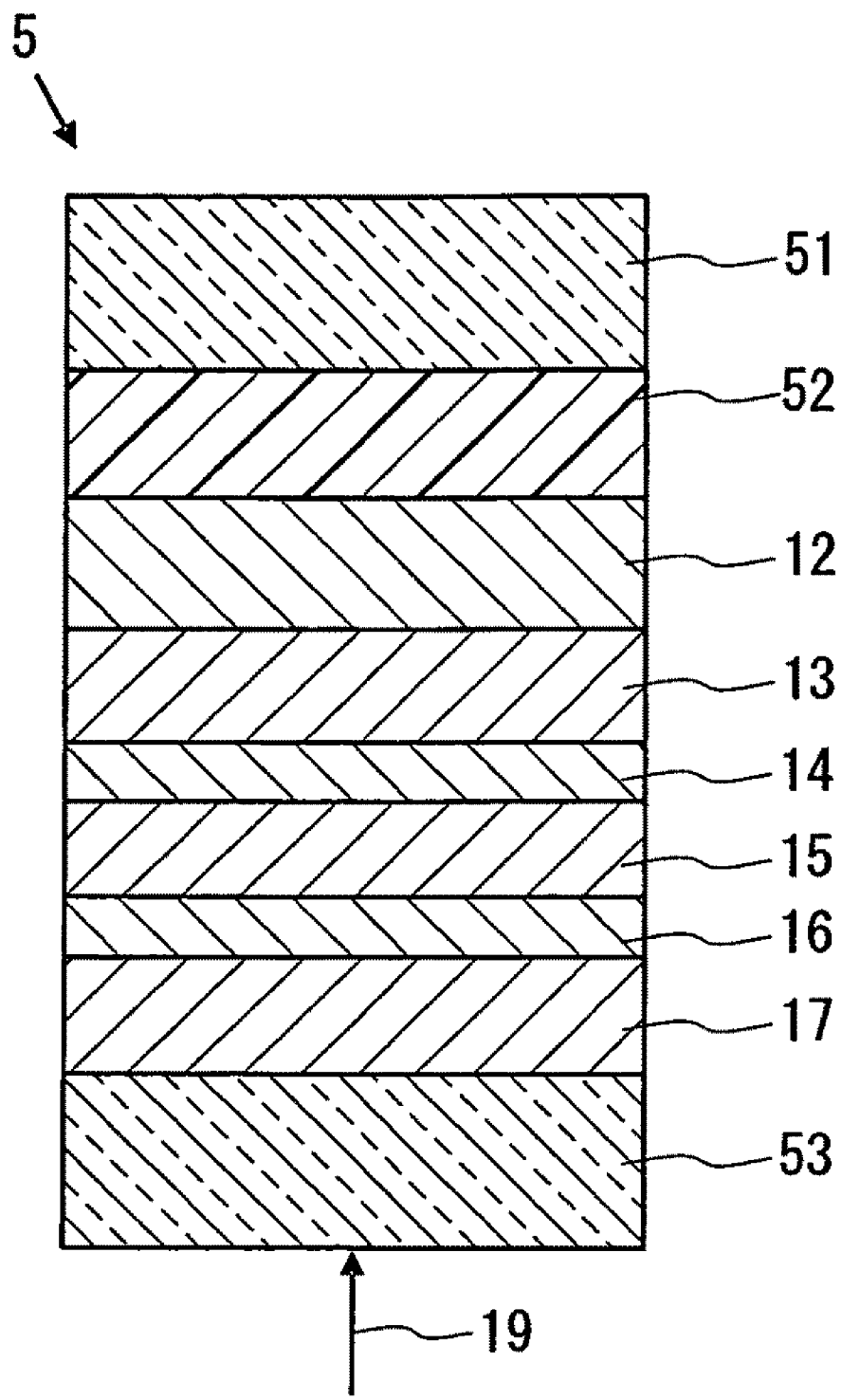
FIG. 6 is a partial cross-sectional view of an information recording medium according to Embodiment 5 of the present invention.

A further example of the information recording medium on or from which information is recorded or reproduced using a laser beam (another example of the first information recording medium of the present invention) is described as Embodiment 5 of the present invention. FIG. 6 shows a partial cross-sectional view of the optical information recording medium.

An information recording medium 5 shown in FIG. 6 is formed with a first dielectric layer 17, a first interface layer 16, a recording layer 15, a second interface layer 14, a second dielectric layer 13, a reflective layer 12, an adhesive layer 52, and a dummy substrate 51 that are disposed in this order on the surface of a substrate 53. This information recording medium is irradiated with an energy beam (generally, a laser beam) 19 for recording and reproduction from the first dielectric layer 17 side.

The substrate 53 and the dummy substrate 51 are disk-shaped transparent substrates. For example, a resin such as polycarbonate, amorphous polyolefin or PMMA, or glass can be used for the substrate 53 and the dummy substrate 51 as in the case of the substrate 11 of Embodiment 1. A guide groove (with a track pitch of 0.615 μm) for guiding the laser beam may be formed at the surface of the substrate 53 on the first dielectric layer 17 side if necessary. Preferably, the surface of the substrate 53 opposite to the first dielectric layer 17 and the surface of the dummy substrate 51 opposite to the adhesive layer 52 are smooth. The thickness of each of the substrate 53 and the dummy substrate 51 is preferably in the range of 0.3 mm to 0.9 mm so that they have sufficient strength and the information recording medium 5 has a thickness of about 1.2 mm.

The adhesive layer 52 is formed of a resin such as a photocurable resin (particularly, an ultraviolet curable resin) or a slow-acting thermosetting resin. Preferably, the adhesive layer 52 has low optical absorption with respect to the laser beam 19 to be used and has low optical birefringence in the short wavelength region. The thickness of the adhesive layer 52 is preferably in the range of 0.2 μm to 50 μm.

The reflective layer 12, the second dielectric layer 13, the second interface layer 14, the recording layer 15, the first interface layer 16, and the first dielectric layer 17 are identical to those described in Embodiment 1 in material, function, and shape, respectively. Preferably, the thickness of the recording layer 15 is specifically 30 nm or less.

Next, a method for manufacturing the information recording medium 5 described in this embodiment (another example of the first manufacturing method of the present invention) is described.

First, the substrate 53 (for example, with a thickness of 600 μm) is disposed in a film forming apparatus.

Subsequently, the first dielectric layer 17, the first interface layer 16, the recording layer 15, the second interface layer 14, the second dielectric layer 13, and the reflective layer 12 are formed sequentially. The methods of forming them are the same as those described in Embodiment 1, respectively. Then the substrate 53 with an information layer stacked thereon and the dummy substrate 51 (for example, with a thickness of 600 μm) are bonded together using the adhesive layer 52. Specifically, a resin such as a photocurable resin (particularly, an ultraviolet curable resin) or a slow-acting thermosetting resin is applied onto the dummy substrate 51 and spin coating is carried out, with the substrate 53, on which the information layer has been stacked, being allowed to adhere to the dummy substrate 51. Thereafter the resin is cured. It also is possible to apply an adhesive resin onto the dummy substrate 51 uniformly beforehand and then to allow it to adhere to the substrate 53 with the information layer stacked thereon.

After adhesion of the substrate 53 and the dummy substrate 51, an initialization process can be carried out for crystallizing the whole surface of the recording layer 15 if necessary. This initialization can be carried out by laser beam irradiation.

Embodiment 6

A structure (an example of the second information recording medium of the present invention) that includes a different recording layer from the recording layer 15 of the information recording medium 1 or 2 described in Embodiment 1 and 2 is described as Embodiment 6 of the present invention. For convenience, the information recording medium of this embodiment is described with reference to FIGS. 2 and 3.

A substrate 11, a reflective layer 12, a second dielectric layer 13, a second interface layer 14, a first interface layer 16, a first dielectric layer 17, and a cover layer 18 can be formed using the same materials as those described in Embodiments 1 and 2, and also are identical to those described in Embodiments 1 and 2 in function and shape.

The recording layer 15 of this embodiment is formed of a material whose phase changes. The recording layer 15 is composed of first to X-th component layers (a first component layer to an X-th component layer) disposed in that order in the thickness direction. An m-th component layer (where m is an integer that satisfies $1 \leq m \leq X$), which is at least one of the first component layer to the X-th component layer, contains Ge—Sb or Te. In this manner, the recording layer is formed of a plurality of component layers and the composition or thickness of each component layer is adjusted suitably, so that a recording layer material can be obtained that has the same function as that of the recording layer materials indicated in, for example, Embodiments 1 and 2 when the recording layer is considered as a whole. Therefore, the recording layer 15 can be formed with a limited number of targets (for example, two types of targets including a target containing Ge—Sb and a target containing Te when the first to X-th component layers are formed of layers containing Ge—Sb and layers containing Te). This allows the cost of the information recording medium to be reduced. Furthermore, the first component layer and the X-th component layer (where X is 3 or more) may contain the same material, or the first component layer and the X-th component layer may contain different materials from each other. The thickness dm (nm) of each component layer is preferably $0.05 \leq dm \leq 25$. The thickness of the recording layer 15 is preferably 30 nm or less.

When the m-th component layer contains an element M (where M is at least one element selected from N, Bi, C, Si, Sn, Ga, In, Zn, Cu, Ag, Au, Ni, Pd, Pt, Co, Rh, Ru, Mn, Cr, Mo, W, V, Nb, Ta, Ti, Zr, Hf, Y, La, Ce, Pr, Nd, Gd, Tb, and Dy), the optical variation between a crystalline region and an amorphous region can be increased and thereby the quality of reproduced signals can be improved. However, since excessive addition thereof may reduce the crystallization rate, the amount of the element M to be added is preferably 15 atom % or less. Moreover, when the element M is at least one selected from C, Si, Sn, Bi, In, and Mn, the quality of reproduced signals can be improved further.

When the m-th component layer contains a material represented by a composition formula, $Ge_pSb_{100-p}$ (0<p<100) (atom %) or $Ge_qTe_{100-q}$ ($0 \leq q<100$) (atom %), the quality of reproduced signals can be improved further. In this case, with respect to the high linear velocity recording, the range is preferably $5 \leq p \leq 35$ or $0 \leq q \leq 60$ and more preferably $10 \leq p \leq 20$ or $0 \leq q \leq 60$.

Next, a method for manufacturing the information recording medium described in this embodiment (an example of the second manufacturing method of the present invention) is described.

First, the substrate 11 (for example, with a thickness of 1100 μm) is disposed in a film forming apparatus.

Subsequently, the reflective layer 12, the second dielectric layer 13, and the second interface layer 14 are formed sequentially. The methods of forming them are the same as those described in Embodiment 1.

Subsequently, the recording layer 15 is formed on the second interface layer 14. The recording layer 15 of this embodiment can be formed by sequentially forming the first component layer to the X-th component layer by sputtering. The method for forming the m-th component layer can be carried out by sputtering in a rare gas atmosphere, in an atmosphere of a mixed gas of a rare gas and a reactive gas, or in an atmosphere of a mixed gas of Kr and a reactive gas using a sputtering target formed of, for example, a Ge—Sb alloy, Te, and element M according to the composition of the m-th component layer.

Subsequently, the first interface layer 16 and the first dielectric layer 17 are formed sequentially on the recording layer 15. The methods of forming them are the same as those described in Embodiment 1.

Finally, the cover layer 18 is formed on the first dielectric layer 17 by the same method as that used in Embodiment 1.

After the formation of the first dielectric layer 17 or the cover layer 18, an initialization process can be carried out for crystallizing the whole surface of the recording layer 15 if necessary.

Embodiment 7

A structure (another example of the second information recording medium of the present invention) that includes different recording layers from the recording layers 15 and 304 of the information recording medium 3 described in Embodiment 3 is described as Embodiment 7 of the present invention. For convenience, the information recording medium of this embodiment is described with reference to FIG. 4.

The layers other than the recording layers 15 and 304 are identical to those of Embodiment 3 in material, function, and shape.

The structure of the recording layer 15 described in Embodiment 6 (a structure including the first to X-th (where X is an integer of 2 or more) component layers stacked in the thickness direction) is used for at least one of the recording layers 15 and 304. The material to be used for the m-th component layer is identical to that described in Embodiment 6. The thickness dm (nm) of each component layer is preferably $0.05 \leq dm \leq 25$. The thickness of the recording layer 15 is preferably 30 nm or less. In order to increase the transmittance, the thickness of the recording layer 304 is preferably as thin as possible and is preferably 15 nm or less. When the recording layer 304 is included in the second or third information layer, the thickness thereof is preferably 15 nm or less. When it is included in the fourth information layer or thereafter (one of the fourth information layer to the N-th information layer), the thickness thereof is preferably 4 nm or less.

Next, a method for manufacturing the information recording medium described in this embodiment is described.

First, the substrate 11 (for example, with a thickness of 1100 μm) is disposed in a film forming apparatus.

Subsequently, in order to form the first information layer 31, the reflective layer 12, the second dielectric layer 13, and the second interface layer 14 are formed sequentially. The methods of forming them are the same as those described in Embodiment 3, respectively.

Subsequently, the recording layer 15 is formed on the second interface layer 14. The method for forming it is the same as the method for forming the recording layer 15 described in Embodiment 6.

Subsequently, the first interface layer 16 and the first dielectric layer 17 are formed sequentially on the recording layer 15. The methods of forming them are the same as those described in Embodiment 3, respectively.

Subsequently, the optical separation layer 32 is formed on the first dielectric layer 17. The method for forming it is the same as that described in Embodiment 3.

Subsequently, the second information layer 33 is formed, which is followed by the formation of the optical separation layer 34 in the same manner as in the case of the optical separation layer 32. The methods of forming them are the same as those described in Embodiment 3, respectively.

In the same manner, the optical separation layer 35 is formed, which is followed by the formation of the n-th information layer 36. In order to form the n-th information layer 36, the transmittance adjusting layer 301 is formed first. Subsequently, the reflective layer 302 and the second dielectric layer 303 are formed sequentially. The methods of forming them are the same as those described in Embodiment 3, respectively.

Subsequently, the recording layer 304 is formed on the second dielectric layer 303. The method for forming it is the same as the method for forming the recording layer 15 described in Embodiment 6.

Subsequently, the first interface layer 305 and the first dielectric layer 306 are formed on the recording layer 304. The methods of forming them are the same as those described in Embodiment 3, respectively.

Subsequently, the n+1-th to N−1-th information layers are produced with optical separation layers being interposed therebetween. Thereafter, the optical separation layer 37 is formed by the same method as that used for forming the optical separation layer 32, and then the N-th information layer 38 is formed. Finally, the cover layer 18 is formed on the N-th information layer 38 by the same method as in Embodiment 3.

After the formation of each information layer, an initialization process can be carried out for crystallizing the whole surface of the recording layer of each information layer if necessary. In all cases, the initialization can be carried out by laser beam irradiation.

Embodiment 8

A structure (another example of the second information recording medium of the present invention) that includes different recording layers from the recording layers 15 and 404 of the information recording medium 4 described in Embodiment 4 is described as Embodiment 8 of the present invention. For convenience, the information recording medium of this embodiment is described with reference to FIG. 5.

The layers other than the recording layers 15 and 404 are identical to those of Embodiment 4 in material, function, and shape.

The structure of the recording layer 15 described in Embodiment 6 (a structure including the first to X-th (where X is an integer of 2 or more) component layers stacked in the thickness direction) is used for at least one of the recording layers 15 and 404. The material to be used for the m-th component layer is identical to that described in Embodiment 6. The thickness dm (nm) of each component layer is preferably $0.05 \leq dm \leq 25$. The thickness of the recording layer 15 is preferably 30 nm or less. In order to increase the transmittance, the thickness of the recording layer 404 of the second information layer is preferably as thin as possible and is preferably 15 nm or less.

Next, a method for manufacturing the information recording medium described in this embodiment (another example of the second manufacturing method of the present invention) is described.

First, the substrate 11 (for example, with a thickness of 1100 μm) is disposed in a film forming apparatus.

Subsequently, in order to form the first information layer 31, the reflective layer 12, the second dielectric layer 13, and the second interface layer 14 are formed sequentially. The methods of forming them are the same as those described in Embodiment 4, respectively.

Subsequently, the recording layer 15 is formed on the second interface layer 14. The method for forming it is the same as that of forming the recording layer 15 described in Embodiment 6.

Subsequently, the first interface layer 16 and the first dielectric layer 17 are formed sequentially on the recording layer 15. The methods of forming them are the same as those described in Embodiment 4, respectively.

Subsequently, the optical separation layer 32 is formed on the first dielectric layer 17. The method for forming it is the same as that described in Embodiment 4.

Subsequently, the second information layer 42 is formed. In order to form the second information layer 42, a transmittance adjusting layer 401 is formed first, which is followed by sequential formation of the reflective layer 402 and the second dielectric layer 403. The methods of forming them are the same as those described in Embodiment 4, respectively.

Subsequently, the recording layer 404 is formed on the second dielectric layer 403. The method for forming it is the same as the method for forming the recording layer 15 described in Embodiment 6.

Subsequently, the first interface layer 405 and the first dielectric layer 406 are formed on the recording layer 404. The methods of forming them are the same as those described in Embodiment 4, respectively.

Finally, the cover layer 18 is formed on the first dielectric layer 406 by the same method as in Embodiment 4.

After the formation of the first dielectric layer 17 or the cover layer 18, an initialization process can be carried out for crystallizing the whole surface of the recording layer 15 if necessary. Furthermore, after the formation of the first dielectric layer 406 or the cover layer 18, an initialization process can be carried out for crystallizing the whole surface of the recording layer 404 if necessary. In any cases, the initialization can be carried out by laser beam irradiation.

Embodiment 9

Figure 7:
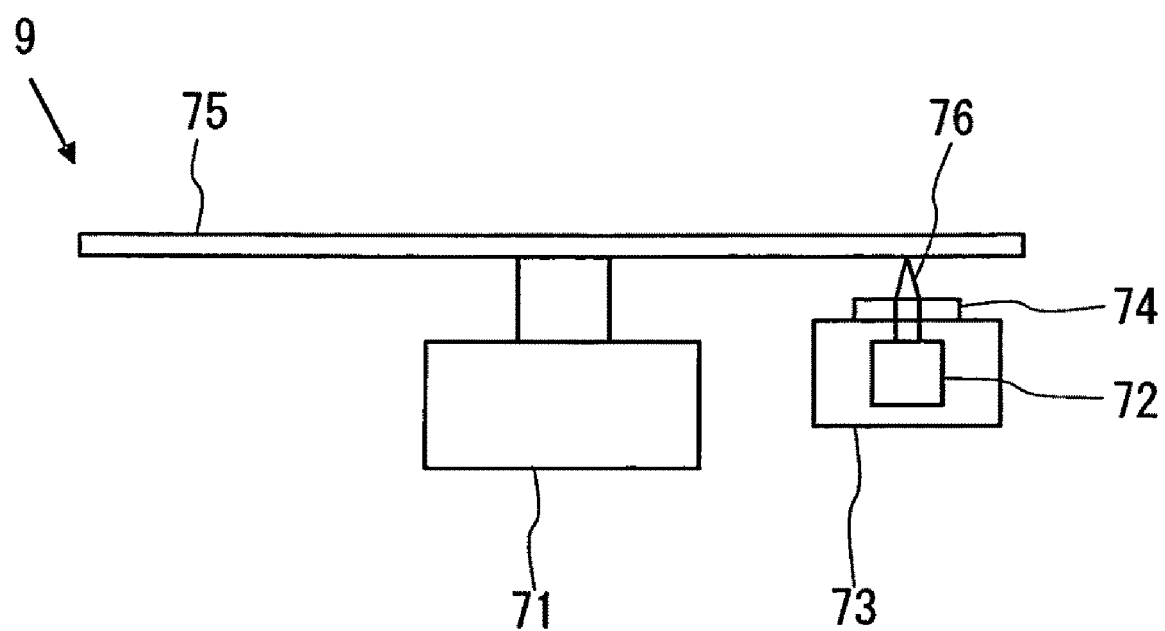
FIG. 7 is a schematic view of a partial configuration of a recording and reproducing apparatus for recording and reproducing information with respect to an information recording medium of the present invention.

A method of recording and reproducing information with respect to the information recording media 1, 2, 3, and 4 described in Embodiments 1, 2, 3, 4, 6, 7, and 8 is described as Embodiment 9 of the present invention. FIG. 7 is a schematic view of a partial configuration of a recording and reproducing apparatus 9 that is used for the recording and reproducing method of this embodiment. The recording and reproducing apparatus 9 includes a spindle motor 71 for rotating an information recording medium, an optical head 73 provided with a semiconductor laser 72, and an objective lens 74 for focusing a laser beam 76 emitted from the semiconductor laser 72.

In order to adjust the spot diameter of the laser beam within the range of 0.4 µm to 0.7 µm, the numerical aperture (NA) of the objective lens 74 is preferably in the range of 0.5 to 1.0. The wavelength of the laser beam is preferably 450 nm or shorter (more preferably in a blue-violet region of 350 nm to 450 nm). The linear velocity at which information is recorded or reproduced is preferably in the range of 3 m/s to 20 m/s, in which crystallization tends not to be caused by a reproducing beam and a sufficiently high erasure rate can be obtained.

Recording, erasure, and overwrite recording of information with respect to the information recording media can be performed through modulation of the laser beam power between a peak power of high power and a bias power of low power. An amorphous phase is formed in a local area of the recording film of an information recording medium by irradiation with a laser beam of peak power, and the amorphous phase serves as a recording area (recording mark). The region between recording marks is irradiated with a laser beam of bias power and thereby a crystalline phase is formed to serve as an erased area. In the case of irradiation with a laser beam of peak power, it is common to employ a multipulse composed of pulse trains. The multipulse may be modulated at levels of the peak power and the bias power or may be modulated at levels of arbitrary power between 0 mW and the peak power.

When the substrate 11 is provided with a guide groove, information may be recorded on a groove located far from the laser beam incident side, a land located near the laser beam incident side, or both of them.

Information is reproduced by irradiating the information recording medium with a laser beam and reading signals from the information recording medium with a detector. The laser beam power used during reproduction is a power that does not affect the optical state of the recorded marks and that allows a sufficiently large amount of reflected light to be obtained for detecting the recorded marks on the information recording medium.

Embodiment 10

A method of recording and reproducing information with respect to the information recording medium 5 described in Embodiment 5 is described as Embodiment 10 of the present invention. The partial configuration of the recording and reproducing apparatus that is used for the recording and reproducing method of the present invention is identical to that described in Embodiment 9 and is shown in FIG. 7. The descriptions that are identical to those made in Embodiment 9 are not repeated.

In order to adjust the spot diameter of the laser beam within the range of 0.4 µm to 0.7 µm, the numerical aperture (NA) of the objective lens 74 is preferably in the range of 0.5 to 1.0. The wavelength of the laser beam is preferably 700 nm or shorter (more preferably in the range of 700 nm to 600 nm). The linear velocity is preferably in the range of 3 m/s to 20 m/s, in which crystallization tends not to be caused by a reproducing beam and a sufficiently high erasure rate can be obtained.

Embodiment 11

Figure 8:
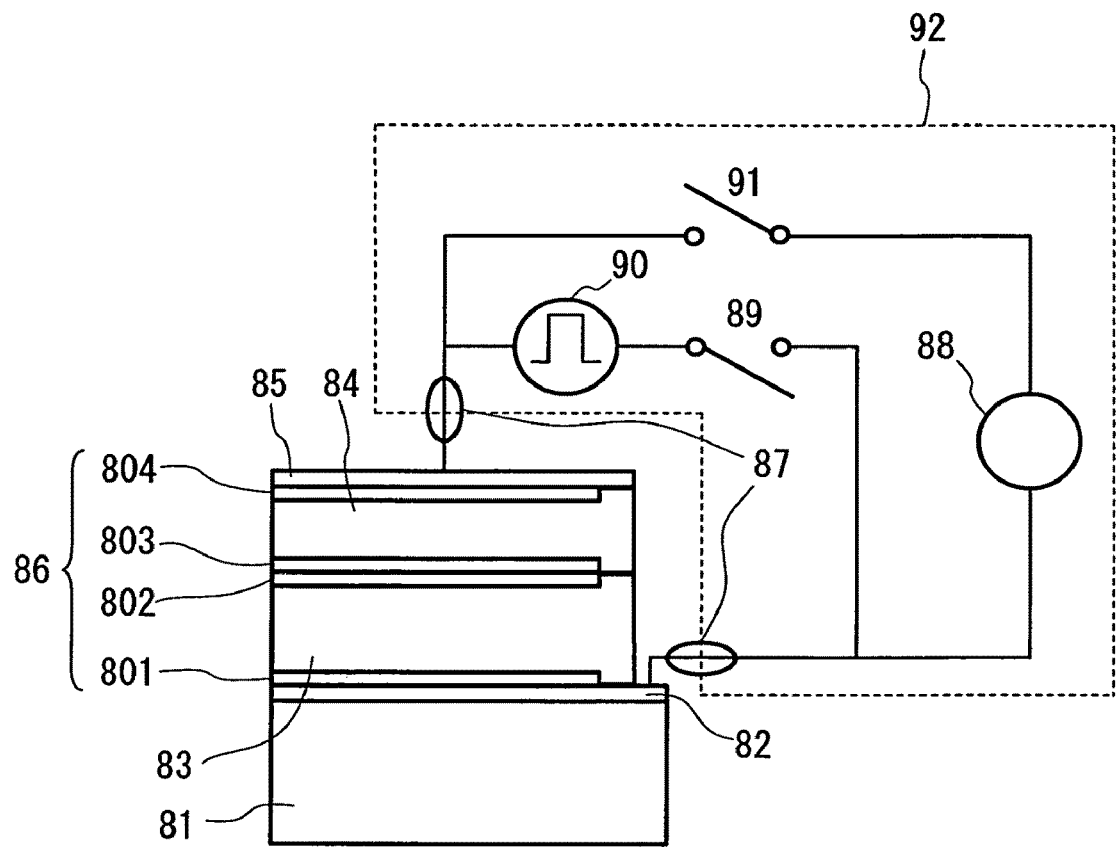
FIG. 8 is a schematic view showing a part of the configurations of an electrical information recording and reproducing apparatus and an information recording medium of the present invention.

An example of the information recording medium to which electrical energy is applied to record and reproduce information is described as Embodiment 11 of the present invention. FIG. 8 shows a cross section of a part of the electrical information recording medium (memory) 86.

The materials that can be used for the substrate 81 include a resin such as polycarbonate, glass, ceramic such as $Al_2O_3$, various semiconductors such as Si, and various metals such as Cu. In this embodiment, the case where a Si substrate is used as the substrate is described. The electrical information recording medium 86 is configured with a lower electrode 82, a first interface layer 801, a first recording layer 83, a second interface layer 802, a third interface layer 803, a second recording layer 84, a fourth interface layer 804, and an upper electrode 85 that are disposed sequentially on the substrate 81. The lower electrode 82 and the upper electrode 85 are formed for applying an electric current to the first recording layer 83 and the second recording layer 84. The first interface layer 801 and the second interface layer 802 are provided to adjust the crystallization time of the first recording layer 83, and the third interface layer 803 and the fourth interface layer 804 are provided to adjust the crystallization time of the second recording layer 84.

The materials used for the first interface layer 801, the second interface layer 802, the third interface layer 803, and the fourth interface layer 804 can be the same as those used for the first interface layer 16 of Embodiment 1.

The first recording layer 83 and the second recording layer 84 are formed of a material whose phase changes irreversible between a crystalline phase and an amorphous phase due to Joule heat generated by the application of an electric current. They utilize the phenomenon of change in electrical resistivity between the crystalline phase and the amorphous phase, for information recording. The material used for them can be the same material as that used for the recording layer 15 of Embodiment 1.

The first recording layer 83 and the second recording layer 84 can be formed by the same method as that used for forming the recording layer 15 of Embodiment 1.

The material to be used for the lower electrode 82 and the upper electrode 85 can be a single metal material such as Al, Au, Ag, Cu, or Pt, or an alloy material containing one or more elements selected therefrom as its main components and one other element or more added suitably thereto so as to, for example, improve the moisture resistance or adjust the thermal conductivity. The lower electrode 82 and the upper electrode 85 can be formed by sputtering a metal base material or an alloy base material to be used as the material in a rare gas atmosphere. The method used for forming each layer can be, for example, a vacuum vapor deposition method, an ion plating method, a CVD method, or a MBE method.

Embodiment 12

An example of the system using the electrical information recording medium (memory) 86 described in Embodiment 11 is described as Embodiment 12 of the present invention. FIG. 8 shows a schematic view of the system.

An electrical information recording and reproducing apparatus 92 is connected electrically to the electrical information recording medium 86 via application units 87. With this electrical information recording and reproducing apparatus 92, a pulse power supply 90 is connected between the lower electrode 82 and the upper electrode 85 via a switch 89 to apply an electric current pulse to the first recording layer 83 and the second recording layer 84. In order to detect the change in resistance caused by the phase changes of the first recording layer 83 and the second recording layer 84, a resistance measuring device 88 is connected between the lower electrode 82 and the upper electrode 85 via a switch 91. In order to change the amorphous phase (a high resistance state) of the first recording layer 83 or the second recording layer 84 into a crystalline phase (a low resistance state), the switch 89 is closed (the switch 91 is opened) to apply an electric current pulse between the electrodes, and the temperature of the region to which the electric current pulse is applied is maintained at a temperature that is higher than the crystallization temperature but is lower than the melting point of the material, during the crystallization time. When the crystalline phase is to be reversed to the amorphous phase again, a relatively higher electric current pulse than that applied during the crystallization is applied in a shorter time to increase the temperature of the recording layer to a higher temperature than the melting point thereof to melt it, and then it is cooled rapidly. The pulse power supply 90 of the electrical information recording and reproducing apparatus 92 is a power supply that outputs a recording and erasing pulse.

Figure 9:
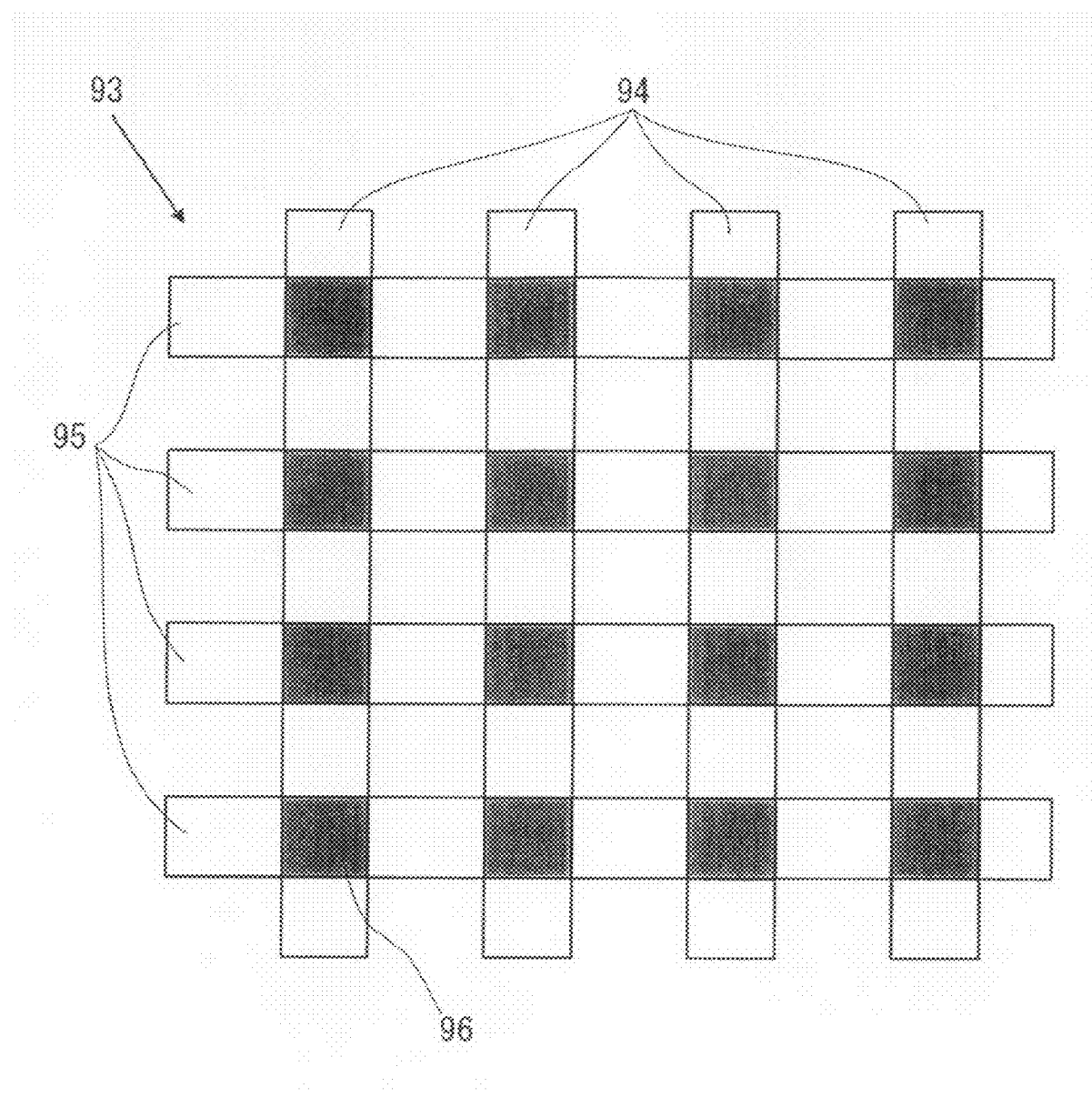
FIG. 9 is a schematic view showing a part of the configuration of a large-capacity electrical information recording medium of the present invention.

A plurality of electrical information recording media 86 can be disposed in the form of a matrix to compose a high-capacity electrical information recording medium 93 as shown in FIG. 9. Each memory cell 96 has the same structure as that of the electrical information recording medium 86 formed in a minute region. Recording and reproduction of information with respect to each memory cell 96 are carried out by assigning one each of word lines 94 and bit lines 95.

Figure 10:
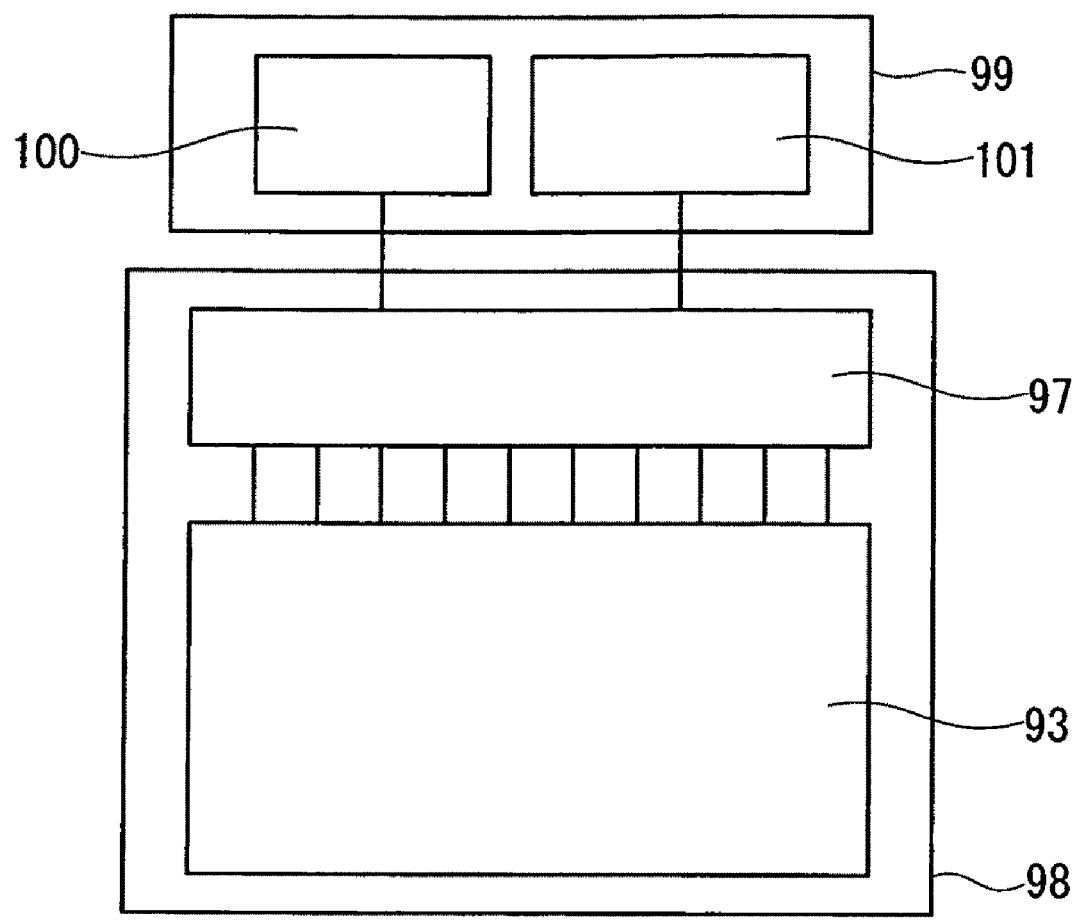
FIG. 10 is a schematic diagram showing a part of the configurations of an electrical information recording medium of the present invention and a recording and reproducing system with respect to the medium.

FIG. 10 shows a structural example of an information recording system in which the electrical information recording medium 93 is used. A memory unit 98 is composed of the electrical information recording medium 93 and an addressing circuit 97. The addressing circuit 97 assigns each of the ward line 94 and the bit line 95 of the electrical information recording medium 93, and thereby information can be recorded on or reproduced from each memory cell 96. Furthermore, when the memory unit 98 is connected electrically to an external circuit 99 composed of at least a pulse power supply 100 and a resistance measuring device 101, information can be recorded on or reproduced from the electrical information recording medium 93.

Example 1

Hereinafter, the present invention is described in further detail using examples.

An example of the information recording medium 1 shown in FIG. 2 is described in this example. A method for manufacturing the information recording medium 1 of this example is described below.

First, a polycarbonate substrate with a guide groove (with a depth of 20 nm and a track pitch of 0.32 μm) formed therein was prepared as the substrate 11. A 100-nm Ag—Pd—Cu film to serve as the reflective layer 12, a 6-nm $TiO_2$ film to serve as the second dielectric layer 13, a 5-nm $(ZrO_2)_{35}(SiO_2)_{15}(Cr_2O_3)_{50}$ (mol %) film to serve as the second interface layer 14, a 10-nm recording layer 15, a 5-nm $(ZrO_2)_{35}(SiO_2)_{15}(Cr_2O_3)_{50}$ (mol %) film to serve as the first interface layer 16, and a $(ZnS)_{80}(SiO_2)_{20}$ (mol %) film to serve as the first dielectric layer 17 were formed sequentially on the substrate by the sputtering method. Thereafter, an ultraviolet curable resin was applied to the first dielectric layer 17, and a polycarbonate substrate (with a diameter of 120 mm and a thickness of 70 μm) was allowed to adhere thereto, which was subjected to spin coating. After that, the resin was cured with ultraviolet rays and a cover layer 18 was formed. Thus the information recording medium 1 was produced. Finally, an initialization process was carried out for crystallizing the whole surface of the recording layer 15 with a laser beam.

The thickness of the first dielectric layer 17 was determined by the calculation based on the matrix method. Specifically, it was determined so that when a laser beam with a wavelength of 405 nm was incident, the reflectance of the information recording medium with the recording layer 15 being in a crystalline state (the mirror surface area of the substrate) was 15% to 25% and the reflectance of the information recording medium with the recording layer 15 being in an amorphous state (the mirror surface area of the substrate) was 1% to 7%.

The information recording media 1 produced as described above with different materials used for the recording layers 15 and information recording media of conventional examples (comparative examples) were evaluated for the modulation degree of a 9T mark, the erasure rate of the 9T mark, the storage stability of the 9T mark, the CNR of a 2T mark, the erasure rate of the 2T mark, and the storage stability of the 2T mark at 4× and 2× speed recording. The evaluation method is described below in detail.

All the evaluations were made using the recording and reproducing apparatus 9 shown in FIG. 7. The wavelength of the laser beam was 405 nm, the numerical aperture (NA) of the objective lens was 0.85, the linear velocity at 1× speed was 4.9 m/s, and the shortest mark length (2T) was 0.149 µm. Information was recorded in the groove. Reproduction was carried out at 1× speed and 0.35 mW in all the evaluations. Furthermore, the accelerated test was carried out in a thermostatic bath for 50 hours at 80° C. and 20% RH.

The modulation degree of the 9T mark was evaluated by capturing reproduced signals with an oscilloscope and reading the difference between a crystalline (unrecorded) level and an amorphous (recorded) level, which is followed by calculation. With respect to the modulation degrees, ⊚ indicates at least 45%, ○ at least 40%, Δ at least 35%, and × lower than 35%.

The erasure rate of the 9T mark denotes the degree of erasure of the 9T mark obtained when a 9T mark is recorded ten times and a 2T mark is recorded once thereon. The evaluation was made using a spectrum analyzer. With respect to the erasure rate, ⊚ indicates at least 30 dB, ○ at least 25 dB, Δ at least 20 dB, and × lower than 20 dB.

The storage stability of the 9T mark denotes the degree of degradation of the 9T mark recorded ten times in the accelerated test. The evaluation was made by using the spectrum analyzer and measuring the difference in CNR obtained before and after the accelerated test. With respect to the amount of reduction in CNR(CNR before acceleration —CNR after acceleration), ⊚ indicates 0.0 dB or lower, ○ 1.0 dB or lower, Δ 3.0 dB or lower, and × higher than 3.0 dB.

The CNR of the 2T mark was evaluated using the spectrum analyzer. With respect to the CNR, ⊚ indicates at least 43 dB, ○ at least 40 dB, Δ at least 37 dB, and × lower than 37 dB.

The erasure rate of the 2T mark denotes the degree of erasure of the 2T mark obtained when a 2T mark is recorded ten times and a 9T mark is recorded once thereon. The evaluation was made using the spectrum analyzer. With respect to the erasure rate, ⊚ indicates at least 30 dB, ○ at least 25 dB, Δ at least 20 dB, and × lower than 20 dB.

The storage stability of the 2T mark denotes the degree of degradation of the 2T mark recorded ten times in the accelerated test. The evaluation was made by using the spectrum analyzer and measuring the difference in CNR obtained before and after the accelerated test. With respect to the amount of reduction in CNR(CNR before acceleration —CNR after acceleration), ⊚ indicates 0.0 dB or lower, ○ 1.0 dB or lower, Δ 3.0 dB or lower, and × higher than 3.0 dB.

Figure 11:
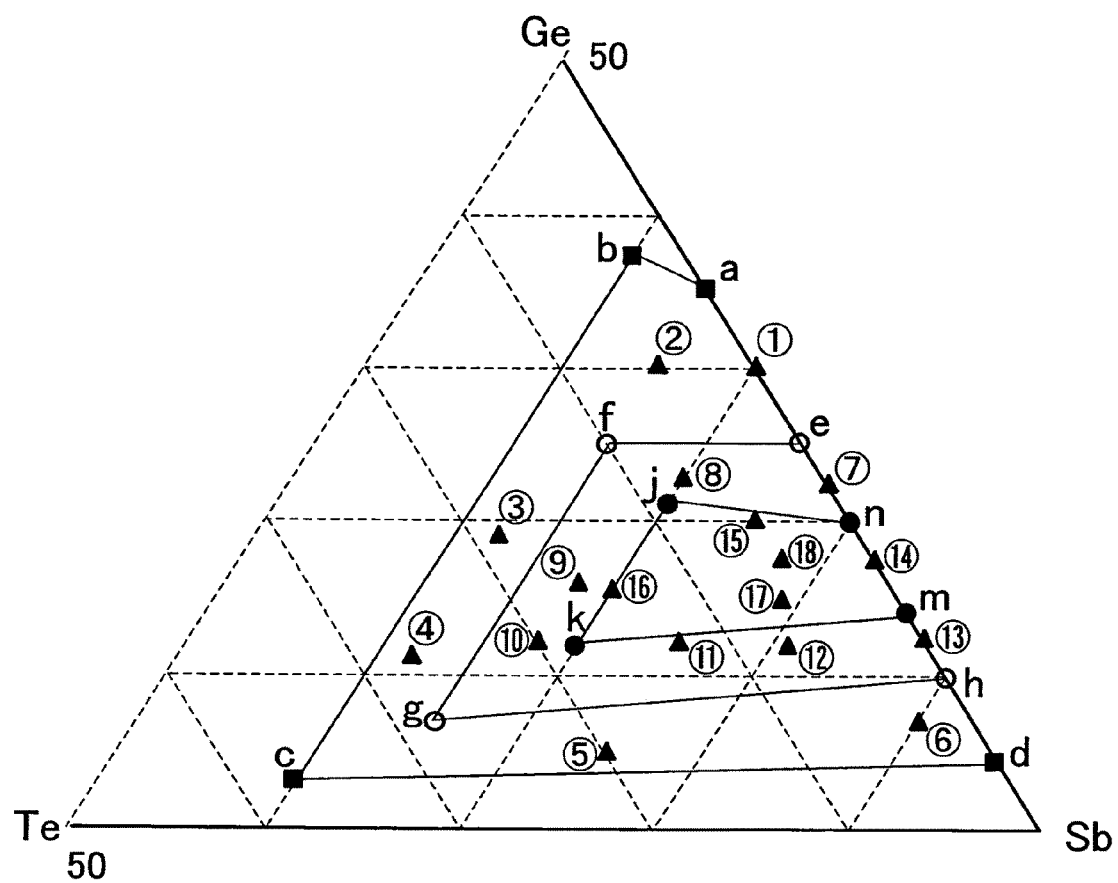
FIG. 11 is a partial enlarged view of a ternary diagram of Ge—Sb—Te that shows the compositions used in Examples.

In examples of the information recording medium 1 of this example, the respective recording layers 15 used herein were those having the following compositions, which were expressed in terms of a coordinate (Ge, Sb, Te)=(x, y, z) on the triangular coordinate shown in FIG. 1: (x, y, z)=a (35, 65, 0), b (36.9, 60, 3.1), c (3.2, 60, 36.8), d (5, 95, 0), ① (30, 70, 0), ② (30, 65, 5), ③ (19, 62, 19), ④ (11, 62, 27), ⑤ (5, 75, 20), ⑥ (7.5, 90, 2.5), e (25, 75, 0), f (25, 65, 10), g (7.2, 65, 27.8), h (10, 90, 0), ⑦ (22.5, 77.5, 0), ⑧ (23, 70, 7), ⑨ (16, 68, 16), ⑩ (12, 68, 20), ⑪ (12.5, 75, 12.5), ⑫ (12, 81, 7), ⑬ (13, 87, 0), j (20.9, 70, 9.1), k (11.8, 70, 18.2), m (14.5, 85.5, 0), n (20, 80, 0), ⑭ (18, 82, 0), ⑮ (20, 75, 5), ⑯ (15, 70, 15), ⑰ (14, 79, 7), and ⑱ (17, 78, 5). These discs were numbered as 1-101 to 1-130, respectively. The compositions described above are indicated in the enlarged view of a ternary diagram shown in FIG. 11.

Furthermore, in order to make a comparison with conventional recording layers, the following information recording media with the structure described above were produced: information recording media (Disc Nos. 1-001 to 1-003) in which $Ge_{35.3}Sb_{11.8}Te_{52.9}$, $Ge_{38.1}Sb_{9.5}Te_{52.4}$ and $Ge_{38.1}Bi_{9.5}Te_{52.4}$ were used for the recording layers 15, and information recording media (Disc Nos. 1-011 to 1-013) in which $Ge_{30}Sb_{55}Te_{15}$, $Ge_{20}Sb_{57}Te_{23}$ and $Ge_5Bi_{58}Te_{37}$ were used for the recording layers 15, respectively. They then were evaluated in the same manner.

Table 1 shows the evaluation results of the modulation degree of a 9T mark, the erasure rate of the 9T mark, and the storage stability of the 9T mark at 4× speed recording. Table 2 shows the evaluation results of the CNR of a 2T mark, the erasure rate of the 2T mark, and the storage stability of the 2T mark at 4× speed recording.

TABLE 1

| | | 4x speed | | | |
|---|---|---|---|---|---|
| Disc No. | Recording layer 15 | 9T Modulation degree | 9T Erasure rate | 9T Storage stability | Overall evaluation |
| 1-101 | $Ge_{35}Sb_{65}$ | ○ | Δ | ⊚ | Δ |
| 1-102 | $Ge_{36.9}Sb_{60}Te_{3.1}$ | ○ | Δ | ⊚ | Δ |
| 1-103 | $Ge_{3.2}Sb_{60}Te_{36.8}$ | ○ | Δ | ○ | Δ |
| 1-104 | $Ge_5Sb_{95}$ | Δ | ⊚ | Δ | Δ |
| 1-105 | $Ge_{30}Sb_{70}$ | ⊚ | Δ | ⊚ | Δ |
| 1-106 | $Ge_{30}Sb_{65}Te_5$ | ○ | Δ | ⊚ | Δ |
| 1-107 | $Ge_{19}Sb_{62}Te_{19}$ | ○ | Δ | ○ | Δ |
| 1-108 | $Ge_{11}Sb_{62}Te_{27}$ | ○ | Δ | ○ | Δ |
| 1-109 | $Ge_5Sb_{75}Te_{20}$ | ○ | ○ | Δ | Δ |
| 1-110 | $Ge_{7.5}Sb_{90}Te_{2.5}$ | Δ | ⊚ | Δ | Δ |
| 1-111 | $Ge_{25}Sb_{75}$ | ○ | ○ | ⊚ | ○ |
| 1-112 | $Ge_{25}Sb_{65}Te_{10}$ | ○ | ○ | ⊚ | ○ |
| 1-113 | $Ge_{7.2}Sb_{65}Te_{27.8}$ | ○ | ○ | ○ | ○ |
| 1-114 | $Ge_{10}Sb_{90}$ | ○ | ⊚ | ○ | ○ |
| 1-115 | $Ge_{22.5}Sb_{77.5}$ | ○ | ○ | ⊚ | ○ |
| 1-116 | $Ge_{23}Sb_{70}Te_7$ | ○ | ○ | ⊚ | ○ |
| 1-117 | $Ge_{16}Sb_{68}Te_{16}$ | ○ | ○ | ⊚ | ○ |
| 1-118 | $Ge_{12}Sb_{68}Te_{20}$ | ○ | ○ | ○ | ○ |
| 1-119 | $Ge_{12.5}Sb_{75}Te_{12.5}$ | ○ | ○ | ○ | ○ |
| 1-120 | $Ge_{12}Sb_{81}Te_7$ | ○ | ⊚ | ○ | ○ |
| 1-121 | $Ge_{13}Sb_{87}$ | ○ | ⊚ | ○ | ○ |
| 1-122 | $Ge_{20.9}Sb_{70}Te_{9.1}$ | ⊚ | ○ | ⊚ | ⊚ |
| 1-123 | $Ge_{11.8}Sb_{70}Te_{18.2}$ | ⊚ | ○ | ⊚ | ⊚ |
| 1-124 | $Ge_{14.5}Sb_{85.5}$ | ○ | ⊚ | ⊚ | ⊚ |
| 1-125 | $Ge_{20}Sb_{80}$ | ⊚ | ○ | ⊚ | ⊚ |
| 1-126 | $Ge_{18}Sb_{82}$ | ⊚ | ○ | ⊚ | ⊚ |
| 1-127 | $Ge_{20}Sb_{75}Te_5$ | ⊚ | ○ | ⊚ | ⊚ |
| 1-128 | $Ge_{15}Sb_{70}Te_{15}$ | ⊚ | ○ | ⊚ | ⊚ |
| 1-129 | $Ge_{14}Sb_{79}Te_7$ | ⊚ | ○ | ⊚ | ⊚ |
| 1-130 | $Ge_{17}Sb_{78}Te_5$ | ⊚ | ○ | ⊚ | ⊚ |
| 1-001 | $Ge_{35.3}Sb_{11.8}Te_{52.9}$ | Δ | × | Δ | × |
| 1-002 | $Ge_{38.1}Sb_{9.5}Te_{52.4}$ | × | × | Δ | × |
| 1-003 | $Ge_{38.1}Bi_{9.5}Te_{52.4}$ | Δ | Δ | × | × |
| 1-011 | $Ge_{30}Sb_{55}Te_{15}$ | Δ | × | × | × |
| 1-012 | $Ge_{20}Sb_{57}Te_{23}$ | Δ | × | Δ | × |
| 1-013 | $Ge_5Sb_{58}Te_{37}$ | × | Δ | × | × |

TABLE 2

| | | 4x speed | | | |
|---|---|---|---|---|---|
| Disc No. | Recording layer 15 | 2T CNR | 2T Erasure rate | 2T Storage stability | Overall evaluation |
| 1-101 | $Ge_{35}Sb_{65}$ | ○ | Δ | ⊚ | Δ |
| 1-102 | $Ge_{36.9}Sb_{60}Te_{3.1}$ | ○ | Δ | ⊚ | Δ |
| 1-103 | $Ge_{3.2}Sb_{60}Te_{36.8}$ | ○ | Δ | ○ | Δ |
| 1-104 | $Ge_5Sb_{95}$ | Δ | ⊚ | Δ | Δ |
| 1-105 | $Ge_{30}Sb_{70}$ | ⊚ | Δ | ⊚ | Δ |
| 1-106 | $Ge_{30}Sb_{65}Te_5$ | ○ | Δ | ⊚ | Δ |
| 1-107 | $Ge_{19}Sb_{62}Te_{19}$ | ○ | Δ | ○ | Δ |
| 1-108 | $Ge_{11}Sb_{62}Te_{27}$ | ○ | Δ | ○ | Δ |
| 1-109 | $Ge_5Sb_{75}Te_{20}$ | ○ | ○ | Δ | Δ |
| 1-110 | $Ge_{7.5}Sb_{90}Te_{2.5}$ | Δ | ⊚ | Δ | Δ |
| 1-111 | $Ge_{25}Sb_{75}$ | ○ | ○ | ⊚ | ○ |
| 1-112 | $Ge_{25}Sb_{65}Te_{10}$ | ○ | ○ | ⊚ | ○ |
| 1-113 | $Ge_{7.2}Sb_{65}Te_{27.8}$ | ○ | ○ | ○ | ○ |
| 1-114 | $Ge_{10}Sb_{90}$ | ○ | ⊚ | ○ | ○ |

TABLE 2-continued

| | | 4x speed | | | |
|---|---|---|---|---|---|
| Disc No. | Recording layer 15 | 2T CNR | 2T Erasure rate | 2T Storage stability | Overall evaluation |
| 1-115 | $Ge_{22.5}Sb_{77.5}$ | ○ | ○ | ◎ | ○ |
| 1-116 | $Ge_{23}Sb_{70}Te_7$ | ○ | ○ | ◎ | ○ |
| 1-117 | $Ge_{16}Sb_{68}Te_{16}$ | ○ | ○ | ◎ | ○ |
| 1-118 | $Ge_{12}Sb_{68}Te_{20}$ | ○ | ○ | ○ | ○ |
| 1-119 | $Ge_{12.5}Sb_{75}Te_{12.5}$ | ○ | ○ | ○ | ○ |
| 1-120 | $Ge_{12}Sb_{81}Te_7$ | ○ | ◎ | ○ | ○ |
| 1-121 | $Ge_{13}Sb_{87}$ | ○ | ○ | ○ | ○ |
| 1-122 | $Ge_{20.9}Sb_{70}Te_{9.1}$ | ◎ | ○ | ◎ | ◎ |
| 1-123 | $Ge_{11.8}Sb_{70}Te_{18.2}$ | ◎ | ○ | ◎ | ◎ |
| 1-124 | $Ge_{14.5}Sb_{85.5}$ | ○ | ◎ | ◎ | ◎ |
| 1-125 | $Ge_{20}Sb_{80}$ | ◎ | ○ | ◎ | ◎ |
| 1-126 | $Ge_{18}Sb_{82}$ | ◎ | ○ | ◎ | ◎ |
| 1-127 | $Ge_{20}Sb_{75}Te_5$ | ◎ | ○ | ◎ | ◎ |
| 1-128 | $Ge_{15}Sb_{70}Te_{15}$ | ◎ | ○ | ◎ | ◎ |
| 1-129 | $Ge_{14}Sb_{79}Te_7$ | ◎ | ○ | ◎ | ◎ |
| 1-130 | $Ge_{17}Sb_{78}Te_5$ | ◎ | ○ | ◎ | ◎ |
| 1-001 | $Ge_{35.3}Sb_{11.8}Te_{52.9}$ | Δ | X | Δ | X |
| 1-002 | $Ge_{38.1}Sb_{9.5}Te_{52.4}$ | X | X | Δ | X |
| 1-003 | $Ge_{38.1}Bi_{9.5}Te_{52.4}$ | Δ | Δ | X | X |
| 1-011 | $Ge_{30}Sb_{55}Te_{15}$ | Δ | X | ○ | X |
| 1-012 | $Ge_{20}Sb_{57}Te_{23}$ | Δ | X | Δ | X |
| 1-013 | $Ge_5Sb_{58}Te_{37}$ | X | Δ | X | X |

Figure 12:
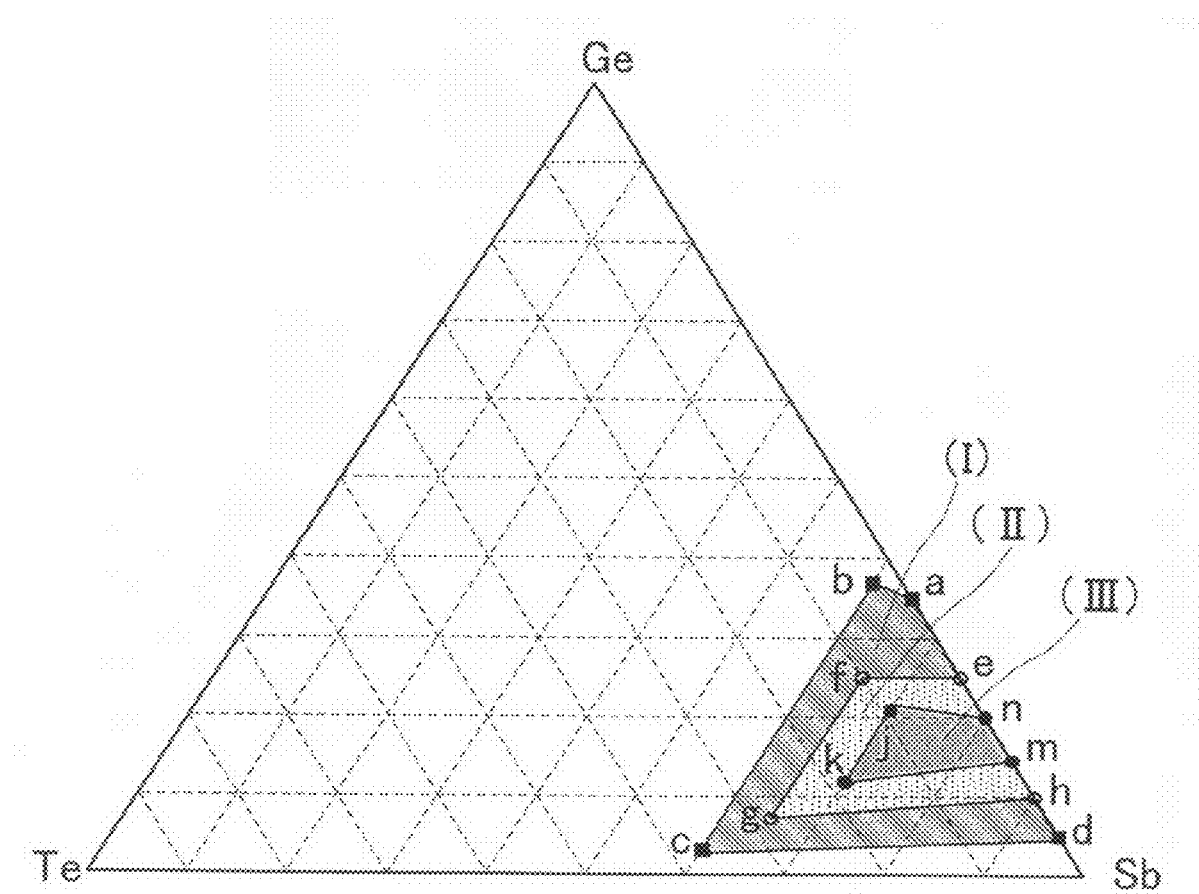
FIG. 12 is a ternary diagram of Ge—Sb—Te that shows an optimal composition region indicated by Examples.

As shown in Tables 1 and 2, with respect to all the properties obtained at 4× speed recording, considerably improved results were obtained in all the information recording media 1 (Disc Nos. 1-101 to 1-130) of this example as compared to the conventional examples 1-001 to 1-003 and 1-011 to 1-013. Furthermore, in the case of the compositions within the composition range (I) (the composition range (I) includes compositions within a region enclosed by point (a), point (b), point (c), point (d), point (h), point (g), point (f), and point (e)) shown in FIG. 12, any one property selected from the modulation degree of a 9T mark, the erasure rate of the 9T mark, the storage stability of the 9T mark, the CNR of a 2T mark, the erasure rate of the 2T mark and the storage stability of the 2T mark was evaluated as Δ. Thus there were properties that were slightly unsatisfactory for the information recording media. However, in the case of the compositions within the composition range (II) (the composition range (II) includes compositions within a region enclosed by point (e), point (f), point (g), point (h), point (m), point (k), point (j), and point (n)), no properties were evaluated as Δ and thus the composition range (II) was proved to be more suitable for 4× speed recording. Furthermore, in the case of the compositions within the composition range (III) (the composition range (III) includes compositions within a region enclosed by point (j), point (k), point (m), and point (n)), two of the properties were evaluated as ◎ and thus the composition range (III) was proved to be more suitable for 4× speed recording as compared to the composition range (II).

Next, Table 3 shows the evaluation results of the modulation degree of a 9T mark, the erasure rate of the 9T mark, and the storage stability of the 9T mark at 2× speed recording. Table 4 shows the evaluation results of the CNR of a 2T mark, the erasure rate of the 2T mark, and the storage stability of the 2T mark at 2× speed recording.

TABLE 3

| | | 2x Speed | | | |
|---|---|---|---|---|---|
| Disc No. | Recording layer 15 | 9T Modulation degree | 9T Erasure rate | 9T Storage stability | Overall evaluation |
| 1-101 | $Ge_{35}Sb_{65}$ | ○ | ○ | ◎ | ○ |
| 1-102 | $Ge_{36.9}Sb_{60}Te_{3.1}$ | ◎ | ○ | ◎ | ◎ |
| 1-103 | $Ge_{3.2}Sb_{60}Te_{36.8}$ | ○ | ○ | ○ | ○ |
| 1-104 | $Ge_5Sb_{95}$ | Δ | ◎ | Δ | Δ |
| 1-105 | $Ge_{30}Sb_{70}$ | ◎ | Δ | ◎ | Δ |
| 1-106 | $Ge_{30}Sb_{65}Te_5$ | ○ | ○ | ◎ | ○ |
| 1-107 | $Ge_{19}Sb_{62}Te_{19}$ | ◎ | ○ | ◎ | ◎ |
| 1-108 | $Ge_{11}Sb_{62}Te_{27}$ | ○ | ○ | ○ | ○ |
| 1-109 | $Ge_5Sb_{75}Te_{20}$ | ○ | ◎ | ○ | ○ |
| 1-110 | $Ge_{7.5}Sb_{90}Te_{2.5}$ | Δ | ◎ | Δ | Δ |
| 1-111 | $Ge_{25}Sb_{75}$ | ○ | ◎ | ◎ | ◎ |
| 1-112 | $Ge_{25}Sb_{65}Te_{10}$ | ◎ | ○ | ◎ | ◎ |
| 1-113 | $Ge_{7.2}Sb_{65}Te_{27.8}$ | ○ | ◎ | ○ | ○ |
| 1-114 | $Ge_{10}Sb_{90}$ | ○ | ◎ | ○ | ○ |
| 1-115 | $Ge_{22.5}Sb_{77.5}$ | ○ | ◎ | ◎ | ◎ |
| 1-116 | $Ge_{23}Sb_{70}Te_7$ | ○ | ◎ | ◎ | ◎ |
| 1-117 | $Ge_{16}Sb_{68}Te_{16}$ | ◎ | ○ | ◎ | ◎ |
| 1-118 | $Ge_{12}Sb_{68}Te_{20}$ | ◎ | ○ | ◎ | ◎ |
| 1-119 | $Ge_{12.5}Sb_{75}Te_{12.5}$ | ○ | ◎ | ○ | ○ |
| 1-120 | $Ge_{12}Sb_{81}Te_7$ | ○ | ◎ | ○ | ○ |
| 1-121 | $Ge_{13}Sb_{87}$ | ○ | ◎ | ○ | ○ |
| 1-122 | $Ge_{20.9}Sb_{70}Te_{9.1}$ | ◎ | ○ | ◎ | ◎ |
| 1-123 | $Ge_{11.8}Sb_{70}Te_{18.2}$ | ◎ | ○ | ◎ | ◎ |
| 1-124 | $Ge_{14.5}Sb_{85.5}$ | ○ | ◎ | ◎ | ◎ |
| 1-125 | $Ge_{20}Sb_{80}$ | ◎ | ◎ | ◎ | ◎ |
| 1-126 | $Ge_{18}Sb_{82}$ | ◎ | ◎ | ◎ | ◎ |
| 1-127 | $Ge_{20}Sb_{75}Te_5$ | ◎ | ◎ | ◎ | ◎ |
| 1-128 | $Ge_{15}Sb_{70}Te_{15}$ | ◎ | ○ | ◎ | ◎ |
| 1-129 | $Ge_{14}Sb_{79}Te_7$ | ◎ | ◎ | ◎ | ◎ |
| 1-130 | $Ge_{17}Sb_{78}Te_5$ | ◎ | ◎ | ◎ | ◎ |
| 1-001 | $Ge_{35.3}Sb_{11.8}Te_{52.9}$ | Δ | ○ | X | X |
| 1-002 | $Ge_{38.1}Sb_{9.5}Te_{52.4}$ | ○ | Δ | Δ | Δ |
| 1-003 | $Ge_{38.1}Bi_{9.5}Te_{52.4}$ | ○ | ○ | X | X |
| 1-011 | $Ge_{30}Sb_{55}Te_{15}$ | ○ | X | ○ | X |
| 1-012 | $Ge_{20}Sb_{57}Te_{23}$ | Δ | Δ | Δ | Δ |
| 1-013 | $Ge_5Sb_{58}Te_{37}$ | X | ○ | X | X |

TABLE 4

| | | 2x Speed | | | |
|---|---|---|---|---|---|
| Disc No. | Recording layer 15 | 2T CNR | 2T Erasure rate | 2T Storage stability | Overall evaluation |
| 1-101 | $Ge_{35}Sb_{65}$ | ○ | ○ | ◎ | ○ |
| 1-102 | $Ge_{36.9}Sb_{60}Te_{3.1}$ | ◎ | ○ | ◎ | ◎ |
| 1-103 | $Ge_{3.2}Sb_{60}Te_{36.8}$ | ○ | ○ | ○ | ○ |
| 1-104 | $Ge_5Sb_{95}$ | Δ | ◎ | Δ | Δ |
| 1-105 | $Ge_{30}Sb_{70}$ | ◎ | Δ | ◎ | Δ |
| 1-106 | $Ge_{30}Sb_{65}Te_5$ | ○ | ○ | ◎ | ○ |
| 1-107 | $Ge_{19}Sb_{62}Te_{19}$ | ◎ | ○ | ◎ | ◎ |
| 1-108 | $Ge_{11}Sb_{62}Te_{27}$ | ○ | ○ | ○ | ○ |
| 1-109 | $Ge_5Sb_{75}Te_{20}$ | ○ | ◎ | ○ | ○ |
| 1-110 | $Ge_{7.5}Sb_{90}Te_{2.5}$ | Δ | ◎ | Δ | Δ |
| 1-111 | $Ge_{25}Sb_{75}$ | ○ | ◎ | ◎ | ◎ |
| 1-112 | $Ge_{25}Sb_{65}Te_{10}$ | ◎ | ○ | ◎ | ◎ |
| 1-113 | $Ge_{7.2}Sb_{65}Te_{27.8}$ | ○ | ◎ | ○ | ○ |
| 1-114 | $Ge_{10}Sb_{90}$ | ○ | ◎ | ○ | ○ |
| 1-115 | $Ge_{22.5}Sb_{77.5}$ | ○ | ◎ | ◎ | ◎ |
| 1-116 | $Ge_{23}Sb_{70}Te_7$ | ◎ | ○ | ◎ | ◎ |
| 1-117 | $Ge_{16}Sb_{68}Te_{16}$ | ◎ | ○ | ◎ | ◎ |
| 1-118 | $Ge_{12}Sb_{68}Te_{20}$ | ◎ | ○ | ○ | ◎ |
| 1-119 | $Ge_{12.5}Sb_{75}Te_{12.5}$ | ○ | ◎ | ○ | ○ |
| 1-120 | $Ge_{12}Sb_{81}Te_7$ | ○ | ◎ | ○ | ○ |
| 1-121 | $Ge_{13}Sb_{87}$ | ○ | ◎ | ○ | ○ |
| 1-122 | $Ge_{20.9}Sb_{70}Te_{9.1}$ | ◎ | ○ | ◎ | ◎ |
| 1-123 | $Ge_{11.8}Sb_{70}Te_{18.2}$ | ◎ | ○ | ◎ | ◎ |
| 1-124 | $Ge_{14.5}Sb_{85.5}$ | ○ | ◎ | ◎ | ◎ |
| 1-125 | $Ge_{20}Sb_{80}$ | ◎ | ◎ | ◎ | ◎ |
| 1-126 | $Ge_{18}Sb_{82}$ | ◎ | ◎ | ◎ | ◎ |

TABLE 4-continued

| | | 2x Speed | | |
|---|---|---|---|---|
| Disc No. | Recording layer 15 | 2T CNR | 2T Erasure rate | 2T Storage stability | Overall evaluation |
| 1-127 | $Ge_{20}Sb_{75}Te_5$ | ◎ | ◎ | ◎ | ◎ |
| 1-128 | $Ge_{15}Sb_{70}Te_{15}$ | ◎ | ○ | ◎ | ◎ |
| 1-129 | $Ge_{14}Sb_{79}Te_7$ | ◎ | ◎ | ◎ | ◎ |
| 1-130 | $Ge_{17}Sb_{78}Te_5$ | ◎ | ◎ | ◎ | ◎ |
| 1-001 | $Ge_{35.3}Sb_{11.8}Te_{52.9}$ | Δ | ○ | X | X |
| 1-002 | $Ge_{38.1}Sb_{9.5}Te_{52.4}$ | ○ | Δ | Δ | Δ |
| 1-003 | $Ge_{38.1}Bi_{9.5}Te_{52.4}$ | ○ | ○ | X | X |
| 1-011 | $Ge_{30}Sb_{55}Te_{15}$ | ○ | X | ○ | X |
| 1-012 | $Ge_{20}Sb_{57}Te_{23}$ | Δ | Δ | Δ | Δ |
| 1-013 | $Ge_5Sb_{58}Te_{37}$ | X | ○ | X | X |

As shown in Tables 3 and 4, with respect to all the properties obtained at 2x speed recording, considerably improved results were obtained in all the information recording media 1 (Disc Nos. 1-101 to 1-130) of this example as compared to the conventional examples 1-001 to 1-003 and 1-011 to 1-013.

As described above, information recording media having better properties than conventional ones were obtained in the present invention.

Example 2

An example of the information recording medium 2 shown in FIG. 3 is described in this example. A method for manufacturing the information recording medium 2 of this example is described below.

First, a polycarbonate substrate with a guide groove (with a depth of 20 nm and a track pitch of 0.32 μm) formed therein was prepared as the substrate 11. A 100-nm Ag—Pd—Cu film to serve as the reflective layer 12, a 12-nm $(ZrO_2)_{35}(SiO_2)_{15}(Cr_2O_3)_{40}(In_2O_3)_{10}$ (mol %) film to serve as the second dielectric layer 13, a 10-nm recording layer 15, a 5-nm $(ZrO_2)_{35}(SiO_2)_{15}(Cr_2O_3)_{50}$ (mol %) film to serve as the first interface layer 16, and a $(ZnS)_{80}(SiO_2)_{20}$ (mol %) film to serve as the first dielectric layer 17 were formed sequentially on the substrate by the sputtering method. Thereafter, an ultraviolet curable resin was applied to the first dielectric layer 17, and a polycarbonate substrate (with a diameter of 120 mm and a thickness of 70 μm) was allowed to adhere thereto, which was subjected to spin coating. After that, the resin was cured with ultraviolet rays and a cover layer 18 was formed. Thus the information recording medium 2 was produced. Finally, an initialization process was carried out for crystallizing the whole surface of the recording layer 15 with a laser beam.

The thickness of the first dielectric layer 17 was determined by the calculation based on the matrix method. Specifically, it was determined so that when a laser beam with a wavelength of 405 nm was incident, the reflectance of the information recording medium with the recording layer 15 being in a crystalline state (the mirror surface area of the substrate) was 15% to 25% and the reflectance of the information recording medium with the recording layer 15 being in an amorphous state (the mirror surface area of the substrate) was 1% to 7%.

The information recording media 2 produced as described above and information recording media of conventional examples were evaluated for the modulation degree of a 9T mark, the erasure rate of the 9T mark, the storage stability of the 9T mark, the CNR of a 2T mark, the erasure rate of the 2T mark, and the storage stability of the 2T mark, and the storage stability of the 2T mark at 2x and 4x speed recording in the same manner as in Example 1.

In examples of the information recording medium 2 of this example, the respective recording layers 15 used herein were those having the following compositions, which were expressed in terms of a coordinate (Ge, Sb, Te)=(x, y, z) on the triangular coordinate shown in FIG. 1: (x, y, z)=a (35, 65, 0), b (36.9, 60, 3.1), c (3.2, 60, 36.8), d (5, 95, 0), ① (30, 70, 0), ② (30, 65, 5), ③ (19, 62, 19), ④ (11, 62, 27), ⑤ (5, 75, 20), ⑥ (7.5, 90, 2.5), e (25, 75, 0), f (25, 65, 10), g (7.2, 65, 27.8), h (10, 90, 0), ⑦ (22.5, 77.5, 0), ⑧ (23, 70, 7), ⑨ (16, 68, 16), ⑩ (12, 68, 20), ⑪ (12.5, 75, 12.5), ⑫ (12, 81, 7), ⑬ (13, 87, 0), j (20.9, 70, 9.1), k (11.8, 70, 18.2), m (14.5, 85.5, 0), n (20, 80, 0), ⑭ (18, 82, 0), ⑮ (20, 75, 5), ⑯ (15, 70, 15), ⑰ (14, 79, 7), and ⑱ (17, 78, 5). These discs were numbered as 2-101 to 2-130, respectively.

Furthermore, in order to make a comparison with conventional recording layers, the following information recording media with the structure described above were produced: information recording media (Disc Nos. 2-001 to 2-003) in which $Ge_{35.3}Sb_{11.8}Te_{52.9}$, $Ge_{38.1}Sb_{9.5}Te_{52.4}$ and $Ge_{38.1}Bi_{9.5}Te_{52.4}$ were used for the recording layers 15, and information recording media (Disc Nos. 2-011 to 2-013) in which $Ge_{30}Sb_{55}Te_{15}$, $Ge_{20}Sb_{57}Te_{23}$ and $Ge_5Bi_{58}Te_{37}$ were used for the recording layers 15, respectively. They then were evaluated in the same manner.

Table 5 shows the evaluation results of the modulation degree of a 9T mark, the erasure rate of the 9T mark, and the storage stability of the 9T mark at 4x speed recording. Table 6 shows the evaluation results of the CNR of a 2T mark, the erasure rate of the 2T mark, and the storage stability of the 2T mark at 4x speed recording.

Furthermore, Table 7 shows the evaluation results of the modulation degree of a 9T mark, the erasure rate of the 9T mark, and the storage stability of the 9T mark at 2x speed recording. Table 8 shows the evaluation results of the CNR of a 2T mark, the erasure rate of the 2T mark, and the storage stability of the 2T mark at 2x speed recording.

TABLE 5

| | | 4x Speed | | |
|---|---|---|---|---|
| Disc No. | Recording layer 15 | 9T Modulation degree | 9T Erasure rate | 9T Storage stability | Overall evaluation |
| 2-101 | $Ge_{35}Sb_{65}$ | ○ | Δ | ◎ | Δ |
| 2-102 | $Ge_{36.9}Sb_{60}Te_{3.1}$ | ○ | Δ | ◎ | Δ |
| 2-103 | $Ge_{3.2}Sb_{60}Te_{36.8}$ | ○ | Δ | ○ | Δ |
| 2-104 | $Ge_5Sb_{95}$ | Δ | ◎ | Δ | Δ |
| 2-105 | $Ge_{30}Sb_{70}$ | ◎ | Δ | ◎ | Δ |
| 2-106 | $Ge_{30}Sb_{65}Te_5$ | ○ | Δ | ◎ | Δ |
| 2-107 | $Ge_{19}Sb_{62}Te_{19}$ | ○ | Δ | ○ | Δ |
| 2-108 | $Ge_{11}Sb_{62}Te_{27}$ | ○ | Δ | ○ | Δ |
| 2-109 | $Ge_5Sb_{75}Te_{20}$ | ○ | ○ | Δ | Δ |
| 2-110 | $Ge_{7.5}Sb_{90}Te_{2.5}$ | Δ | ◎ | Δ | Δ |
| 2-111 | $Ge_{25}Sb_{75}$ | ○ | ○ | ◎ | ○ |
| 2-112 | $Ge_{25}Sb_{65}Te_{10}$ | ○ | ○ | ◎ | ○ |
| 2-113 | $Ge_{7.2}Sb_{65}Te_{27.8}$ | ○ | ○ | ◎ | ○ |
| 2-114 | $Ge_{10}Sb_{90}$ | ○ | ◎ | ○ | ○ |
| 2-115 | $Ge_{22.5}Sb_{77.5}$ | ○ | ○ | ◎ | ○ |
| 2-116 | $Ge_{23}Sb_{70}Te_7$ | ○ | ○ | ◎ | ○ |
| 2-117 | $Ge_{16}Sb_{68}Te_{16}$ | ○ | ○ | ◎ | ○ |
| 2-118 | $Ge_{12}Sb_{68}Te_{20}$ | ○ | ○ | ○ | ○ |
| 2-119 | $Ge_{12.5}Sb_{75}Te_{12.5}$ | ○ | ○ | ◎ | ○ |
| 2-120 | $Ge_{12}Sb_{81}Te_7$ | ○ | ◎ | ○ | ○ |
| 2-121 | $Ge_{13}Sb_{87}$ | ○ | ◎ | ○ | ○ |
| 2-122 | $Ge_{20.9}Sb_{70}Te_{9.1}$ | ◎ | ○ | ◎ | ◎ |
| 2-123 | $Ge_{11.8}Sb_{70}Te_{18.2}$ | ◎ | ○ | ◎ | ◎ |
| 2-124 | $Ge_{14.5}Sb_{85.5}$ | ◎ | ◎ | ◎ | ◎ |
| 2-125 | $Ge_{20}Sb_{80}$ | ◎ | ○ | ◎ | ◎ |
| 2-126 | $Ge_{18}Sb_{82}$ | ◎ | ◎ | ◎ | ◎ |
| 2-127 | $Ge_{20}Sb_{75}Te_5$ | ◎ | ○ | ◎ | ◎ |
| 2-128 | $Ge_{15}Sb_{70}Te_{15}$ | ◎ | ○ | ◎ | ◎ |

TABLE 5-continued

4x Speed

| Disc No. | Recording layer 15 | 9T Modulation degree | 9T Erasure rate | 9T Storage stability | Overall evaluation |
|---|---|---|---|---|---|
| 2-129 | $Ge_{14}Sb_{79}Te_7$ | ⊚ | ○ | ⊚ | ⊚ |
| 2-130 | $Ge_{17}Sb_{78}Te_5$ | ⊚ | ○ | ⊚ | ⊚ |
| 2-001 | $Ge_{35.3}Sb_{11.8}Te_{52.9}$ | △ | X | △ | X |
| 2-002 | $Ge_{38.1}Sb_{9.5}Te_{52.4}$ | X | X | △ | X |
| 2-003 | $Ge_{38.1}Bi_{9.5}Te_{52.4}$ | △ | △ | X | X |
| 2-011 | $Ge_{30}Sb_{55}Te_{15}$ | △ | X | ○ | X |
| 2-012 | $Ge_{20}Sb_{57}Te_{23}$ | △ | X | △ | X |
| 2-013 | $Ge_5Sb_{58}Te_{37}$ | X | △ | X | X |

TABLE 6

4x Speed

| Disc No. | Recording layer 15 | 2T CNR | 2T Erasure rate | 2T Storage stability | Overall evaluation |
|---|---|---|---|---|---|
| 2-101 | $Ge_{35}Sb_{65}$ | ○ | △ | ⊚ | △ |
| 2-102 | $Ge_{36.9}Sb_{60}Te_{3.1}$ | ○ | △ | ⊚ | △ |
| 2-103 | $Ge_{3.2}Sb_{60}Te_{36.8}$ | ○ | △ | ○ | △ |
| 2-104 | $Ge_5Sb_{95}$ | △ | ⊚ | △ | △ |
| 2-105 | $Ge_{30}Sb_{70}$ | ⊚ | △ | ⊚ | △ |
| 2-106 | $Ge_{30}Sb_{65}Te_5$ | ○ | △ | ⊚ | △ |
| 2-107 | $Ge_{19}Sb_{62}Te_{19}$ | ○ | △ | ○ | △ |
| 2-108 | $Ge_{11}Sb_{62}Te_{27}$ | ○ | △ | ○ | △ |
| 2-109 | $Ge_5Sb_{75}Te_{20}$ | ○ | ○ | △ | △ |
| 2-110 | $Ge_{7.5}Sb_{90}Te_{2.5}$ | △ | ⊚ | △ | △ |
| 2-111 | $Ge_{25}Sb_{75}$ | ○ | ○ | ⊚ | ○ |
| 2-112 | $Ge_{25}Sb_{65}Te_{10}$ | ○ | ○ | ⊚ | ○ |
| 2-113 | $Ge_{7.2}Sb_{65}Te_{27.8}$ | ○ | ○ | ○ | ○ |
| 2-114 | $Ge_{10}Sb_{90}$ | ○ | ⊚ | ○ | ○ |
| 2-115 | $Ge_{22.5}Sb_{77.5}$ | ○ | ○ | ○ | ○ |
| 2-116 | $Ge_{23}Sb_{70}Te_7$ | ○ | ○ | ○ | ○ |
| 2-117 | $Ge_{16}Sb_{68}Te_{16}$ | ○ | ○ | ○ | ○ |
| 2-118 | $Ge_{12}Sb_{68}Te_{20}$ | ○ | ○ | ○ | ○ |
| 2-119 | $Ge_{12.5}Sb_{75}Te_{12.5}$ | ○ | ○ | ○ | ○ |
| 2-120 | $Ge_{12}Sb_{81}Te_7$ | ○ | ⊚ | ○ | ○ |
| 2-121 | $Ge_{13}Sb_{87}$ | ○ | ⊚ | ○ | ○ |
| 2-122 | $Ge_{20.9}Sb_{70}Te_{9.1}$ | ⊚ | ○ | ⊚ | ⊚ |
| 2-123 | $Ge_{11.8}Sb_{70}Te_{18.2}$ | ⊚ | ○ | ⊚ | ⊚ |
| 2-124 | $Ge_{14.5}Sb_{85.5}$ | ○ | ⊚ | ⊚ | ⊚ |
| 2-125 | $Ge_{20}Sb_{80}$ | ⊚ | ○ | ⊚ | ⊚ |
| 2-126 | $Ge_{18}Sb_{82}$ | ⊚ | ○ | ⊚ | ⊚ |
| 2-127 | $Ge_{20}Sb_{75}Te_5$ | ⊚ | ○ | ⊚ | ⊚ |
| 2-128 | $Ge_{15}Sb_{70}Te_{15}$ | ⊚ | ○ | ⊚ | ⊚ |
| 2-129 | $Ge_{14}Sb_{79}Te_7$ | ⊚ | ○ | ⊚ | ⊚ |
| 2-130 | $Ge_{17}Sb_{78}Te_5$ | ⊚ | ○ | ⊚ | ⊚ |
| 2-001 | $Ge_{35.3}Sb_{11.8}Te_{52.9}$ | △ | X | △ | X |
| 2-002 | $Ge_{38.1}Sb_{9.5}Te_{52.4}$ | X | X | △ | X |
| 2-003 | $Ge_{38.1}Bi_{9.5}Te_{52.4}$ | △ | △ | X | X |
| 2-011 | $Ge_{30}Sb_{55}Te_{15}$ | △ | X | ○ | X |
| 2-012 | $Ge_{20}Sb_{57}Te_{23}$ | △ | X | △ | X |
| 2-013 | $Ge_5Sb_{58}Te_{37}$ | X | △ | X | X |

TABLE 7

2x Speed

| Disc No. | Recording layer 15 | 9T Modulation degree | 9T Erasure rate | 9T Storage stability | Overall evaluation |
|---|---|---|---|---|---|
| 2-101 | $Ge_{35}Sb_{65}$ | ○ | ○ | ⊚ | ○ |
| 2-102 | $Ge_{36.9}Sb_{60}Te_{3.1}$ | ⊚ | ○ | ⊚ | ○ |
| 2-103 | $Ge_{3.2}Sb_{60}Te_{36.8}$ | ○ | ○ | ○ | ○ |
| 2-104 | $Ge_5Sb_{95}$ | △ | ⊚ | △ | △ |
| 2-105 | $Ge_{30}Sb_{70}$ | ⊚ | △ | ⊚ | △ |
| 2-106 | $Ge_{30}Sb_{65}Te_5$ | ○ | ○ | ⊚ | ○ |
| 2-107 | $Ge_{19}Sb_{62}Te_{19}$ | ⊚ | ○ | ⊚ | ⊚ |
| 2-108 | $Ge_{11}Sb_{62}Te_{27}$ | ○ | ○ | ○ | ○ |
| 2-109 | $Ge_5Sb_{75}Te_{20}$ | ○ | ⊚ | ○ | ○ |
| 2-110 | $Ge_{7.5}Sb_{90}Te_{2.5}$ | △ | ⊚ | △ | △ |
| 2-111 | $Ge_{25}Sb_{75}$ | ○ | ⊚ | ⊚ | ⊚ |
| 2-112 | $Ge_{25}Sb_{65}Te_{10}$ | ⊚ | ○ | ⊚ | ⊚ |
| 2-113 | $Ge_{7.2}Sb_{65}Te_{27.8}$ | ○ | ⊚ | ○ | ○ |
| 2-114 | $Ge_{10}Sb_{90}$ | ○ | ⊚ | ○ | ○ |
| 2-115 | $Ge_{22.5}Sb_{77.5}$ | ○ | ⊚ | ○ | ○ |
| 2-116 | $Ge_{23}Sb_{70}Te_7$ | ○ | ⊚ | ○ | ○ |
| 2-117 | $Ge_{16}Sb_{68}Te_{16}$ | ○ | ⊚ | ○ | ○ |
| 2-118 | $Ge_{12}Sb_{68}Te_{20}$ | ⊚ | ○ | ○ | ○ |
| 2-119 | $Ge_{12.5}Sb_{75}Te_{12.5}$ | ○ | ⊚ | ○ | ○ |
| 2-120 | $Ge_{12}Sb_{81}Te_7$ | ○ | ⊚ | ○ | ○ |
| 2-121 | $Ge_{13}Sb_{87}$ | ○ | ⊚ | ○ | ○ |
| 2-122 | $Ge_{20.9}Sb_{70}Te_{9.1}$ | ⊚ | ○ | ⊚ | ⊚ |
| 2-123 | $Ge_{11.8}Sb_{70}Te_{18.2}$ | ⊚ | ○ | ⊚ | ⊚ |
| 2-124 | $Ge_{14.5}Sb_{85.5}$ | ○ | ⊚ | ⊚ | ⊚ |
| 2-125 | $Ge_{20}Sb_{80}$ | ⊚ | ⊚ | ⊚ | ⊚ |
| 2-126 | $Ge_{18}Sb_{82}$ | ⊚ | ⊚ | ⊚ | ⊚ |
| 2-127 | $Ge_{20}Sb_{75}Te_5$ | ⊚ | ⊚ | ⊚ | ⊚ |
| 2-128 | $Ge_{15}Sb_{70}Te_{15}$ | ⊚ | ○ | ⊚ | ⊚ |
| 2-129 | $Ge_{14}Sb_{79}Te_7$ | ⊚ | ⊚ | ⊚ | ⊚ |
| 2-130 | $Ge_{17}Sb_{78}Te_5$ | ⊚ | ⊚ | ⊚ | ⊚ |
| 2-001 | $Ge_{35.3}Sb_{11.8}Te_{52.9}$ | △ | ○ | X | X |
| 2-002 | $Ge_{38.1}Sb_{9.5}Te_{52.4}$ | ○ | △ | △ | △ |
| 2-003 | $Ge_{38.1}Bi_{9.5}Te_{52.4}$ | ○ | ○ | X | X |
| 2-011 | $Ge_{30}Sb_{55}Te_{15}$ | ○ | X | ○ | X |
| 2-012 | $Ge_{20}Sb_{57}Te_{23}$ | △ | △ | △ | △ |
| 2-013 | $Ge_5Sb_{58}Te_{37}$ | X | ○ | X | X |

TABLE 8

2x Speed

| Disc No. | Recording layer 15 | 2T CNR | 2T Erasure rate | 2T Storage stability | Overall evaluation |
|---|---|---|---|---|---|
| 2-101 | $Ge_{35}Sb_{65}$ | ○ | ○ | ⊚ | ○ |
| 2-102 | $Ge_{36.9}Sb_{60}Te_{3.1}$ | ⊚ | ○ | ⊚ | ○ |
| 2-103 | $Ge_{3.2}Sb_{60}Te_{36.8}$ | ○ | ○ | ○ | ○ |
| 2-104 | $Ge_5Sb_{95}$ | △ | ⊚ | △ | △ |
| 2-105 | $Ge_{30}Sb_{70}$ | ⊚ | △ | ⊚ | △ |
| 2-106 | $Ge_{30}Sb_{65}Te_5$ | ○ | ○ | ⊚ | ○ |
| 2-107 | $Ge_{19}Sb_{62}Te_{19}$ | ⊚ | ○ | ⊚ | ⊚ |
| 2-108 | $Ge_{11}Sb_{62}Te_{27}$ | ○ | ○ | ○ | ○ |
| 2-109 | $Ge_5Sb_{75}Te_{20}$ | ○ | ⊚ | ○ | ○ |
| 2-110 | $Ge_{7.5}Sb_{90}Te_{2.5}$ | △ | ⊚ | △ | △ |
| 2-111 | $Ge_{25}Sb_{75}$ | ○ | ⊚ | ⊚ | ⊚ |
| 2-112 | $Ge_{25}Sb_{65}Te_{10}$ | ⊚ | ○ | ⊚ | ⊚ |
| 2-113 | $Ge_{7.2}Sb_{65}Te_{27.8}$ | ○ | ⊚ | ○ | ○ |
| 2-114 | $Ge_{10}Sb_{90}$ | ○ | ⊚ | ○ | ○ |
| 2-115 | $Ge_{22.5}Sb_{77.5}$ | ○ | ○ | ○ | ○ |
| 2-116 | $Ge_{23}Sb_{70}Te_7$ | ○ | ○ | ○ | ○ |
| 2-117 | $Ge_{16}Sb_{68}Te_{16}$ | ⊚ | ○ | ○ | ○ |
| 2-118 | $Ge_{12}Sb_{68}Te_{20}$ | ⊚ | ○ | ○ | ○ |
| 2-119 | $Ge_{12.5}Sb_{75}Te_{12.5}$ | ○ | ⊚ | ○ | ○ |
| 2-120 | $Ge_{12}Sb_{81}Te_7$ | ○ | ⊚ | ○ | ○ |
| 2-121 | $Ge_{13}Sb_{87}$ | ⊚ | ⊚ | ○ | ○ |
| 2-122 | $Ge_{20.9}Sb_{70}Te_{9.1}$ | ⊚ | ○ | ⊚ | ⊚ |
| 2-123 | $Ge_{11.8}Sb_{70}Te_{18.2}$ | ⊚ | ○ | ⊚ | ⊚ |
| 2-124 | $Ge_{14.5}Sb_{85.5}$ | ○ | ⊚ | ⊚ | ⊚ |
| 2-125 | $Ge_{20}Sb_{80}$ | ⊚ | ○ | ⊚ | ⊚ |
| 2-126 | $Ge_{18}Sb_{82}$ | ⊚ | ○ | ⊚ | ⊚ |
| 2-127 | $Ge_{20}Sb_{75}Te_5$ | ⊚ | ⊚ | ⊚ | ⊚ |
| 2-128 | $Ge_{15}Sb_{70}Te_{15}$ | ⊚ | ⊚ | ⊚ | ⊚ |
| 2-129 | $Ge_{14}Sb_{79}Te_7$ | ⊚ | ⊚ | ⊚ | ⊚ |
| 2-130 | $Ge_{17}Sb_{78}Te_5$ | ⊚ | ⊚ | ⊚ | ⊚ |
| 2-001 | $Ge_{35.3}Sb_{11.8}Te_{52.9}$ | △ | ○ | X | X |
| 2-002 | $Ge_{38.1}Sb_{9.5}Te_{52.4}$ | ○ | △ | △ | △ |
| 2-003 | $Ge_{38.1}Bi_{9.5}Te_{52.4}$ | ○ | ○ | X | X |

TABLE 8-continued

| | | 2x Speed | | |
|---|---|---|---|---|
| Disc No. | Recording layer 15 | 2T CNR | 2T Erasure rate | 2T Storage stability | Overall evaluation |
| 2-011 | $Ge_{30}Sb_{55}Te_{15}$ | ◯ | X | ◯ | X |
| 2-012 | $Ge_{20}Sb_{57}Te_{23}$ | Δ | Δ | Δ | Δ |
| 2-013 | $Ge_5Sb_{58}Te_{37}$ | X | ◯ | X | X |

As shown in Tables 5 to 8, with respect to all the properties obtained at 4× and 2× speed recording, considerably improved results were obtained in all the information recording media 2 (Disc Nos. 2-101 to 2-130) of this example as compared to the conventional examples 2-001 to 2-003 and 2-011 to 2-013. Furthermore, like Example 1, in the case of the compositions within the composition range (I) shown in FIG. 12, any one property selected from the modulation degree of a 9T mark, the erasure rate of the 9T mark, the storage stability of the 9T mark, the CNR of a 2T mark, the erasure rate of the 2T mark and the storage stability of the 2T mark was evaluated as Δ at 4× speed recording. Thus there were properties that were slightly unsatisfactory for the information recording media. However, in the case of the compositions within the composition range (II), no properties were evaluated as Δ and thus the composition range (II) was proved to be more suitable for 4× speed recording. Furthermore, in the case of the compositions within the composition range (III), two of the properties were evaluated as ⊚ and thus the composition range (III) was proved to be more suitable for 4× speed recording as compared to the composition range (II).

Example 3

An example of the information recording medium 3 shown in FIG. 4 is described in this example. In this example, an example (N=4 and n=3) having four information layers is described in which a recording layer material of the present invention was used for the recording layer of the third information layer. A method for manufacturing the information recording medium 3 of this example is described below.

The method for forming the first information layer 31 of the information recording medium 3 is the same as that used in Example 1. $Ge_5Sb_{79}Te_{16}$ was used for the recording layer 15. The thickness of the first dielectric layer 17 was adjusted so that the reflectance of the first information layer 31 with the recording layer 15 being in a crystalline state (the mirror surface area of the substrate) was 25% to 35% when no other information layer was present.

Subsequently, the optical separation layer 32 with a guide groove provided therein was formed on the first information layer 31. Thereafter, an initialization process was carried out for crystallizing the whole surface of the recording layer 15 with a laser beam.

Subsequently, the second information layer 33 was formed on the optical separation layer 32. The second information layer 33 was formed so that the reflectance of the second information layer 33 with the recording layer being in a crystalline state (the mirror surface area of the substrate) was 10% to 20% and the transmittance thereof (the mirror surface area of the substrate) was 60% to 70% when no other information layer was present.

Then the optical separation layer 35 with a guide groove provided therein was formed on the second information layer 33. Thereafter, an initialization process was carried out for crystallizing the whole surface of the recording layer of the second information layer 33 with a laser beam.

Subsequently, the third information layer 36 was formed on the optical separation layer 35. The third information layer 36 was produced by sequentially forming an 18-nm $TiO_2$ film to serve as the transmittance adjusting layer 301, a 5-nm Ag—Pd—Cu film to serve as the reflective layer 302, a 5-nm $(ZrO_2)_{35}(SiO_2)_{15}(Cr_2O_3)_{50}$ (mol %) film to serve as the second dielectric layer 303, a 5-nm recording layer 304, a 5-nm $(ZrO_2)_{35}(SiO_2)_{15}(Cr_2O_3)_{50}$ (mol %) film to serve as the first interface layer 305, and a $(ZnS)_{80}(SiO_2)_{20}$ (mol %) film to serve as the first dielectric layer 306 by the sputtering method.

The thickness of the first dielectric layer 306 was determined by the calculation based on the matrix method. Specifically, the thickness was determined so that when a laser beam with a wavelength of 405 nm was incident, the reflectance of the third information layer with the recording layer 304 being in a crystalline state (the mirror surface area of the substrate) was 5% to 12% and the transmittance thereof (the mirror surface area of the substrate) was 70% to 75% when no other information layer was present.

Subsequently, an optical separation layer 37 with a guide groove provided therein was formed on the third information layer 36. Thereafter, an initialization process was carried out for crystallizing the whole surface of the recording layer 304 of the third information layer 36 with a laser beam.

Subsequently, the fourth information layer 38 was formed on the optical separation layer 37. The forth information layer 38 was formed so that the reflectance of the fourth information layer 38 with the recording layer being in a crystalline state (the mirror surface area of the substrate) was 3% to 7% and the transmittance thereof (the mirror surface area of the substrate) was 70% to 80% when no other information layer was present.

Thereafter, an ultraviolet curable resin was applied onto the fourth information layer 38, and a polycarbonate substrate (with a diameter of 120 mm and a thickness of 70 μm) was allowed to adhere thereto, which was subjected to spin coating. After that, the resin was cured with ultraviolet rays and then the cover layer 18 was formed. Thus the information recording medium 3 was produced. Finally, an initialization process was carried out for crystallizing the whole surface of the recording layer of the fourth information layer 38 with a laser beam.

With respect to information recording media 3 produced as described above and conventional information recording media, the respective third information layers 36 were subjected to recording and reproduction operations and thereby they were evaluated for the modulation degree of a 9T mark, the erasure rate of the 9T mark, the storage stability of the 9T mark, the CNR of a 2T mark, the erasure rate of the 2T mark, and the storage stability of the 2T mark at 2× speed recording. In this example, reproduction was carried out at 1× speed and 0.70 mW in all the evaluations.

The modulation degree of the 9T mark was evaluated in the same manner as in Example 1. With respect to the modulation degree, ◯ denotes at least 35%, Δ at least 30%, and x lower than 30%.

The erasure rate of the 9T mark was evaluated in the same manner as in Example 1. With respect to the erasure rate, ◯ denotes at least 20 dB, Δ at least 15 dB, and x lower than 15 dB.

The storage stability of the 9T mark was evaluated in the same manner as in Example 1. With respect to the amount of reduction in CNR (CNR before acceleration–CNR after acceleration), ◯ denotes 0.0 dB or lower, Δ 3.0 dB or lower, and x higher than 3.0 dB.

The CNR of the 2T mark was evaluated in the same manner as in Example 1. With respect to the CNR, ○ denotes at least 35 dB, Δ at least 30 dB, and x lower than 30 dB.

The erasure rate of the 2T mark was evaluated in the same manner as in Example 1. With respect to the erasure rate, ○ denotes at least 20 dB, Δ at least 15 dB, and x lower than 15 dB.

The storage stability of the 2T mark was evaluated in the same manner as in Example 1. With respect to the amount of reduction in CNR (CNR before acceleration−CNR after acceleration), ○ denotes 0.0 dB or lower, Δ 3.0 dB or lower, and x higher than 3.0 dB.

In examples of the information recording medium 3 of this example, the respective recording layers 304 used herein were those having the following compositions, which were expressed in terms of a coordinate (Ge, Sb, Te)=(x, y, z) on the triangular coordinate shown in FIG. 1: (x, y, z)=a (35, 65, 0), b (36.9, 60, 3.1), c (3.2, 60, 36.8), d (5, 95, 0), ① (30, 70, 0), ② (30, 65, 5), ③ (19, 62, 19), ④ (11, 62, 27), ⑤ (5, 75, 20), ⑥ (7.5, 90, 2.5), e (25, 75, 0), f (25, 65, 10), g (7.2, 65, 27.8), h (10, 90, 0), ⑦ (22.5, 77.5, 0), ⑧ (23, 70, 7), ⑨ (16, 68, 16), ⑩ (12, 68, 20), ⑪ (12.5, 75, 12.5), ⑫ (12, 81, 7), ⑬ (13, 87, 0), j (20.9, 70, 9.1), k (11.8, 70, 18.2), m (14.5, 85.5, 0), n (20, 80, 0), ⑭ (18, 82, 0), ⑮ (20, 75, 5), ⑯ (15, 70, 15), ⑰ (14, 79, 7), and ⑱ (17, 78, 5). These discs were numbered as 3-101 to 3-130, respectively.

Furthermore, in order to make a comparison with conventional recording layers, the following information recording media with the structure described above were produced: information recording media (Disc Nos. 3-001 to 3-003) in which $Ge_{35.3}Sb_{11.8}Te_{52.9}$, $Ge_{38.1}Sb_{9.5}Te_{52.4}$ and $Ge_{38.1}Bi_{9.5}Te_{52.4}$ were used for the recording layers 304, and information recording media (Disc Nos. 3-011 to 3-013) in which $Ge_{30}Sb_{55}Te_{15}$, $Ge_{20}Sb_{57}Te_{23}$ and $Ge_{5}Bi_{58}Te_{37}$ were used for the recording layers 304, respectively. They were then evaluated in the same manner.

Table 9 shows the evaluation results of the modulation degree of a 9T mark, the erasure rate of the 9T mark, and the storage stability of the 9T mark at 2× speed recording. Table 10 shows the evaluation results of the CNR of a 2T mark, the erasure rate of the 2T mark, and the storage stability of the 2T mark at 2× speed recording.

TABLE 9

| | | 2x Speed | | |
| --- | --- | --- | --- | --- |
| Disc No. | Recording layer 304 | 9T Modulation degree | 9T Erasure rate | 9T Storage stability | Overall evaluation |
| 3-101 | $Ge_{35}Sb_{65}$ | Δ | Δ | ○ | Δ |
| 3-102 | $Ge_{36.9}Sb_{60}Te_{3.1}$ | Δ | Δ | ○ | Δ |
| 3-103 | $Ge_{3.2}Sb_{60}Te_{36.8}$ | ○ | Δ | Δ | Δ |
| 3-104 | $Ge_{5}Sb_{95}$ | Δ | ○ | Δ | Δ |
| 3-105 | $Ge_{30}Sb_{70}$ | Δ | Δ | ○ | Δ |
| 3-106 | $Ge_{30}Sb_{65}Te_{5}$ | Δ | Δ | ○ | Δ |
| 3-107 | $Ge_{19}Sb_{62}Te_{19}$ | ○ | Δ | ○ | Δ |
| 3-108 | $Ge_{11}Sb_{62}Te_{27}$ | ○ | Δ | Δ | Δ |
| 3-109 | $Ge_{5}Sb_{75}Te_{20}$ | ○ | Δ | ○ | Δ |
| 3-110 | $Ge_{7.5}Sb_{90}Te_{2.5}$ | Δ | ○ | Δ | Δ |
| 3-111 | $Ge_{25}Sb_{75}$ | Δ | ○ | ○ | Δ |
| 3-112 | $Ge_{25}Sb_{65}Te_{10}$ | ○ | Δ | ○ | Δ |
| 3-113 | $Ge_{7.2}Sb_{65}Te_{27.8}$ | ○ | Δ | ○ | Δ |
| 3-114 | $Ge_{10}Sb_{90}$ | ○ | ○ | Δ | Δ |
| 3-115 | $Ge_{22.5}Sb_{77.5}$ | Δ | ○ | ○ | Δ |
| 3-116 | $Ge_{23}Sb_{70}Te_{7}$ | ○ | ○ | ○ | ○ |
| 3-117 | $Ge_{16}Sb_{68}Te_{16}$ | ○ | Δ | ○ | Δ |
| 3-118 | $Ge_{12}Sb_{68}Te_{20}$ | ○ | Δ | ○ | Δ |
| 3-119 | $Ge_{12.5}Sb_{75}Te_{12.5}$ | ○ | ○ | ○ | ○ |
| 3-120 | $Ge_{12}Sb_{81}Te_{7}$ | ○ | ○ | ○ | ○ |
| 3-121 | $Ge_{13}Sb_{87}$ | ○ | ○ | Δ | Δ |
| 3-122 | $Ge_{20.9}Sb_{70}Te_{9.1}$ | ○ | ○ | ○ | ○ |
| 3-123 | $Ge_{11.8}Sb_{70}Te_{18.2}$ | ○ | ○ | ○ | ○ |
| 3-124 | $Ge_{14.5}Sb_{85.5}$ | ○ | ○ | ○ | ○ |
| 3-125 | $Ge_{20}Sb_{80}$ | Δ | ○ | ○ | Δ |
| 3-126 | $Ge_{18}Sb_{82}$ | ○ | ○ | Δ | Δ |
| 3-127 | $Ge_{20}Sb_{75}Te_{5}$ | ○ | ○ | ○ | ○ |
| 3-128 | $Ge_{15}Sb_{70}Te_{15}$ | ○ | ○ | ○ | ○ |
| 3-129 | $Ge_{14}Sb_{79}Te_{7}$ | ○ | ○ | ○ | ○ |
| 3-130 | $Ge_{17}Sb_{78}Te_{5}$ | ○ | ○ | ○ | ○ |
| 3-001 | $Ge_{35.3}Sb_{11.8}Te_{52.9}$ | X | Δ | Δ | X |
| 3-002 | $Ge_{38.1}Sb_{9.5}Te_{52.4}$ | X | X | Δ | X |
| 3-003 | $Ge_{38.1}Bi_{9.5}Te_{52.4}$ | X | Δ | Δ | X |
| 3-011 | $Ge_{30}Sb_{55}Te_{15}$ | Δ | X | Δ | X |
| 3-012 | $Ge_{20}Sb_{57}Te_{23}$ | Δ | X | Δ | X |
| 3-013 | $Ge_{5}Sb_{58}Te_{37}$ | X | Δ | X | X |

TABLE 10

| | | 2x Speed | | |
| --- | --- | --- | --- | --- |
| Disc No. | Recording layer 304 | 2T CNR | 2T Erasure rate | 2T Storage stability | Overall evaluation |
| 3-101 | $Ge_{35}Sb_{65}$ | Δ | Δ | ○ | Δ |
| 3-102 | $Ge_{36.9}Sb_{60}Te_{3.1}$ | Δ | Δ | ○ | Δ |
| 3-103 | $Ge_{3.2}Sb_{60}Te_{36.8}$ | ○ | Δ | Δ | Δ |
| 3-104 | $Ge_{5}Sb_{95}$ | Δ | ○ | Δ | Δ |
| 3-105 | $Ge_{30}Sb_{70}$ | Δ | Δ | ○ | Δ |
| 3-106 | $Ge_{30}Sb_{65}Te_{5}$ | Δ | Δ | ○ | Δ |
| 3-107 | $Ge_{19}Sb_{62}Te_{19}$ | ○ | Δ | ○ | Δ |
| 3-108 | $Ge_{11}Sb_{62}Te_{27}$ | ○ | Δ | Δ | Δ |
| 3-109 | $Ge_{5}Sb_{75}Te_{20}$ | ○ | Δ | Δ | Δ |
| 3-110 | $Ge_{7.5}Sb_{90}Te_{2.5}$ | Δ | ○ | Δ | Δ |
| 3-111 | $Ge_{25}Sb_{75}$ | Δ | ○ | ○ | Δ |
| 3-112 | $Ge_{25}Sb_{65}Te_{10}$ | ○ | Δ | ○ | Δ |
| 3-113 | $Ge_{7.2}Sb_{65}Te_{27.8}$ | ○ | Δ | ○ | Δ |
| 3-114 | $Ge_{10}Sb_{90}$ | ○ | ○ | Δ | Δ |
| 3-115 | $Ge_{22.5}Sb_{77.5}$ | Δ | ○ | ○ | Δ |
| 3-116 | $Ge_{23}Sb_{70}Te_{7}$ | ○ | ○ | ○ | ○ |
| 3-117 | $Ge_{16}Sb_{68}Te_{16}$ | ○ | Δ | ○ | Δ |
| 3-118 | $Ge_{12}Sb_{68}Te_{20}$ | ○ | Δ | ○ | Δ |
| 3-119 | $Ge_{12.5}Sb_{75}Te_{12.5}$ | ○ | ○ | ○ | ○ |
| 3-120 | $Ge_{12}Sb_{81}Te_{7}$ | ○ | ○ | ○ | ○ |
| 3-121 | $Ge_{13}Sb_{87}$ | ○ | ○ | Δ | Δ |
| 3-122 | $Ge_{20.9}Sb_{70}Te_{9.1}$ | ○ | ○ | ○ | ○ |
| 3-123 | $Ge_{11.8}Sb_{70}Te_{18.2}$ | ○ | ○ | ○ | ○ |
| 3-124 | $Ge_{14.5}Sb_{85.5}$ | ○ | ○ | ○ | ○ |
| 3-125 | $Ge_{20}Sb_{80}$ | Δ | ○ | ○ | Δ |
| 3-126 | $Ge_{18}Sb_{82}$ | ○ | ○ | Δ | Δ |
| 3-127 | $Ge_{20}Sb_{75}Te_{5}$ | ○ | ○ | ○ | ○ |
| 3-128 | $Ge_{15}Sb_{70}Te_{15}$ | ○ | ○ | ○ | ○ |
| 3-129 | $Ge_{14}Sb_{79}Te_{7}$ | ○ | ○ | ○ | ○ |
| 3-130 | $Ge_{17}Sb_{78}Te_{5}$ | ○ | ○ | ○ | ○ |
| 3-001 | $Ge_{35.3}Sb_{11.8}Te_{52.9}$ | X | Δ | Δ | X |
| 3-002 | $Ge_{38.1}Sb_{9.5}Te_{52.4}$ | X | X | Δ | X |
| 3-003 | $Ge_{38.1}Bi_{9.5}Te_{52.4}$ | X | Δ | Δ | X |
| 3-011 | $Ge_{30}Sb_{55}Te_{15}$ | Δ | X | Δ | X |
| 3-012 | $Ge_{20}Sb_{57}Te_{23}$ | Δ | X | Δ | X |
| 3-013 | $Ge_{5}Sb_{58}Te_{37}$ | X | Δ | X | X |

As shown in Tables 9 and 10, with respect to all the properties obtained at 2× speed recording, considerably improved results were obtained in all the information recording media 3 (Disc Nos. 3-101 to 3-130) of this example as compared to the conventional examples 3-001 to 3-003 and 3-011 to 3-013. In the case of the compositions within the composition range (I) shown in FIG. 12, any two properties selected from the modulation degree of a 9T mark, the erasure rate of the 9T mark, the storage stability of the 9T mark, the CNR of a 2T mark, the erasure rate of the 2T mark and the storage stability of the 2T mark were evaluated as Δ. Thus there were properties that were slightly unsatisfactory for the information recording media. However, in the case of the compositions within the composition range (II) and the composition range (III), one or no property was evaluated as Δ, and thus the composition ranges were proved to be more suitable for the recording layer of the third information layer 36.

Example 4

An example of the information recording medium 3 shown in FIG. 4 is described in this example. In this example, an example (N=4 and n=4) having four information layers is described in which a recording layer material of the present invention was used for the recording layer of the fourth information layer. A method for manufacturing the information recording medium 3 of this example is described below.

The method for forming the first information layer 31 to the third information layer of the information recording medium 3 is the same as that used in Example 3.

The optical separation layer 35 with a guide groove provided therein was formed on the third information layer. Thereafter, an initialization process was carried out for crystallizing the whole surface of the recording layer of the third information layer with a laser beam.

Subsequently, the fourth information layer 36 was formed on the optical separation layer 35. The fourth information layer 36 was produced by sequentially forming an 18-nm $TiO_2$ film to serve as the transmittance adjusting layer 301, a 3-nm Ag—Pd—Cu film to serve as the reflective layer 302, a 5-nm $(ZrO_2)_{35}(SiO_2)_{15}(Cr_2O_3)_{50}$ (mol %) film to serve as the second dielectric layer 303, a 3-nm recording layer 304, a 5-nm $(ZrO_2)_{35}(SiO_2)_{15}(Cr_2O_3)_{50}$ (mol %) film to serve as the first interface layer 305, and a $(ZnS)_{80}(SiO_2)_{20}$ (mol %) film to serve as the first dielectric layer 306 by the sputtering method.

The thickness of the first dielectric layer 306 was determined by the calculation based on the matrix method. Specifically, the thickness was determined so that when a laser beam with a wavelength of 405 nm was incident, the reflectance of the third information layer with the recording layer 304 being in a crystalline state (the mirror surface area of the substrate) was 3% to 7% and the transmittance thereof (the mirror surface area of the substrate) was 70% to 80% when no other information layer was present.

Thereafter, an ultraviolet curable resin was applied onto the fourth information layer 36, and a polycarbonate substrate (with a diameter of 120 mm and a thickness of 70 μm) was allowed to adhere thereto, which was subjected to spin coating. After that, the resin was cured with ultraviolet rays and then the cover layer 18 was formed. Thus the information recording medium 3 was produced. Finally, an initialization process was carried out for crystallizing the whole surface of the recording layer of the fourth information layer with a laser beam.

With respect to information recording media 3 produced as described above and conventional information recording media, the respective fourth information layers 36 were subjected to recording and reproduction operations and thereby they were evaluated for the modulation degree of a 9T mark, the erasure rate of the 9T mark, the storage stability of the 9T mark, the CNR of a 2T mark, the erasure rate of the 2T mark, and the storage stability of the 2T mark at 2× speed recording. In this example, reproduction was carried out at 1× speed and 0.70 mW in all the evaluations.

The modulation degree of the 9T mark was evaluated in the same manner as in Example 1. With respect to the modulation degree, ○ denotes at least 30%, Δ at least 25%, and x lower than 25%.

The erasure rate of the 9T mark was evaluated in the same manner as in Example 1. With respect to the erasure rate, ○ denotes at least 20 dB, Δ at least 15 dB, and x lower than 15 dB.

The storage stability of the 9T mark was evaluated in the same manner as in Example 1. With respect to the amount of reduction in CNR (CNR before acceleration−CNR after acceleration), ○ denotes 0.0 dB or lower, Δ 3.0 dB or lower, and x higher than 3.0 dB.

The CNR of the 2T mark was evaluated in the same manner as in Example 1. With respect to the CNR, ○ denotes at least 32 dB, Δ at least 27 dB, and x lower than 27 dB.

The erasure rate of the 2T mark was evaluated in the same manner as in Example 1. With respect to the erasure rate, ○ denotes at least 20 dB, Δ at least 15 dB, and x lower than 15 dB.

The storage stability of the 2T mark was evaluated in the same manner as in Example 1. With respect to the amount of reduction in CNR (CNR before acceleration−CNR after acceleration), ○ denotes 0.0 dB or lower, Δ 3.0 dB or lower, and x higher than 3.0 dB.

In examples of the information recording medium 3 of this example, the respective recording layers 304 used herein were those having the following compositions, which were expressed in terms of a coordinate (Ge, Sb, Te)=(x, y, z) on the triangular coordinate shown in FIG. 1: (x, y, z)=a (35, 65, 0), b (36.9, 60, 3.1), c (3.2, 60, 36.8), d (5, 95, 0), ① (30, 70, 0), ② (30, 65, 5), ③ (19, 62, 19), ④ (11, 62, 27), ⑤ (5, 75, 20), ⑥ (7.5, 90, 2.5), e (25, 75, 0), f (25, 65, 10), g (7.2, 65, 27.8), h (10, 90, 0), ⑦ (22.5, 77.5, 0), ⑧ (23, 70, 7), ⑨ (16, 68, 16), ⑩ (12, 68, 20), ⑪ (12.5, 75, 12.5), ⑫ (12, 81, 7), ⑬ (13, 87, 0), j (20.9, 70, 9.1), k (11.8, 70, 18.2), m (14.5, 85.5, 0), n (20, 80, 0), ⑭ (18, 82, 0), ⑮ (20, 75, 5), ⑯ (15, 70, 15), ⑰ (14, 79, 7), and ⑱ (17, 78, 5). These discs were numbered as 3-201 to 3-230, respectively.

Furthermore, in order to make a comparison with conventional recording layers, the following information recording media with the structure described above were produced: information recording media (Disc Nos. 3-004 to 3-006) in which $Ge_{35.3}Sb_{11.8}Te_{52.9}$, $Ge_{38.1}Sb_{9.5}Te_{52.4}$ and $Ge_{38.1}Bi_{9.5}Te_{52.4}$ were used for the recording layers 304, and information recording media (Disc Nos. 3-014 to 3-016) in which $Ge_{30}Sb_{55}Te_{15}$, $Ge_{20}Sb_{57}Te_{23}$ and $Ge_5Bi_{58}Te_{37}$ were used for the recording layers 304, respectively. They then were evaluated in the same manner.

Table 11 shows the evaluation results of the modulation degree of a 9T mark, the erasure rate of the 9T mark, and the storage stability of the 9T mark at 2× speed recording. Table 12 shows the evaluation results of the CNR of a 2T mark, the erasure rate of the 2T mark, and the storage stability of the 2T mark at 2× speed recording.

TABLE 11

| | | 2x Speed | | | |
| --- | --- | --- | --- | --- | --- |
| Disc No. | Recording layer 304 | 9T Modulation degree | 9T Erasure rate | 9T Storage stability | Overall evaluation |
| 3-201 | $Ge_{35}Sb_{65}$ | Δ | Δ | ○ | Δ |
| 3-202 | $Ge_{36.9}Sb_{60}Te_{3.1}$ | Δ | Δ | ○ | Δ |
| 3-203 | $Ge_{3.2}Sb_{60}Te_{36.8}$ | ○ | Δ | Δ | Δ |
| 3-204 | $Ge_5Sb_{95}$ | Δ | ○ | Δ | Δ |

TABLE 11-continued

| | | 2x Speed | | | |
|---|---|---|---|---|---|
| Disc No. | Recording layer 304 | 9T Modulation degree | 9T Erasure rate | 9T Storage stability | Overall evaluation |
| 3-205 | $Ge_{30}Sb_{70}$ | Δ | Δ | ○ | Δ |
| 3-206 | $Ge_{30}Sb_{65}Te_5$ | Δ | Δ | ○ | Δ |
| 3-207 | $Ge_{19}Sb_{62}Te_{19}$ | ○ | Δ | ○ | Δ |
| 3-208 | $Ge_{11}Sb_{62}Te_{27}$ | ○ | Δ | Δ | Δ |
| 3-209 | $Ge_5Sb_{75}Te_{20}$ | ○ | Δ | Δ | Δ |
| 3-210 | $Ge_{7.5}Sb_{90}Te_{2.5}$ | Δ | ○ | Δ | Δ |
| 3-211 | $Ge_{25}Sb_{75}$ | Δ | ○ | ○ | Δ |
| 3-212 | $Ge_{25}Sb_{65}Te_{10}$ | ○ | Δ | ○ | Δ |
| 3-213 | $Ge_{7.2}Sb_{65}Te_{27.8}$ | ○ | Δ | ○ | Δ |
| 3-214 | $Ge_{10}Sb_{90}$ | ○ | ○ | Δ | Δ |
| 3-215 | $Ge_{22.5}Sb_{77.5}$ | Δ | ○ | ○ | Δ |
| 3-216 | $Ge_{23}Sb_{70}Te_7$ | ○ | ○ | ○ | ○ |
| 3-217 | $Ge_{16}Sb_{68}Te_{16}$ | ○ | Δ | ○ | Δ |
| 3-218 | $Ge_{12}Sb_{68}Te_{20}$ | ○ | Δ | ○ | Δ |
| 3-219 | $Ge_{12.5}Sb_{75}Te_{12.5}$ | ○ | ○ | ○ | ○ |
| 3-220 | $Ge_{12}Sb_{81}Te_7$ | ○ | ○ | ○ | ○ |
| 3-221 | $Ge_{13}Sb_{87}$ | ○ | ○ | Δ | Δ |
| 3-222 | $Ge_{20.9}Sb_{70}Te_{9.1}$ | ○ | ○ | ○ | ○ |
| 3-223 | $Ge_{11.8}Sb_{70}Te_{18.2}$ | ○ | ○ | ○ | ○ |
| 3-224 | $Ge_{14.5}Sb_{85.5}$ | ○ | ○ | ○ | ○ |
| 3-225 | $Ge_{20}Sb_{80}$ | Δ | ○ | ○ | Δ |
| 3-226 | $Ge_{18}Sb_{82}$ | ○ | ○ | Δ | Δ |
| 3-227 | $Ge_{20}Sb_{75}Te_5$ | ○ | ○ | ○ | ○ |
| 3-228 | $Ge_{15}Sb_{70}Te_{15}$ | ○ | ○ | ○ | ○ |
| 3-229 | $Ge_{14}Sb_{79}Te_7$ | ○ | ○ | ○ | ○ |
| 3-230 | $Ge_{17}Sb_{78}Te_5$ | ○ | ○ | ○ | ○ |
| 3-004 | $Ge_{35.3}Sb_{11.8}Te_{52.9}$ | X | Δ | Δ | X |
| 3-005 | $Ge_{38.1}Sb_{9.5}Te_{52.4}$ | X | X | Δ | X |
| 3-006 | $Ge_{38.1}Bi_{9.5}Te_{52.4}$ | X | Δ | Δ | X |
| 3-014 | $Ge_{30}Sb_{55}Te_{15}$ | Δ | X | Δ | X |
| 3-015 | $Ge_{20}Sb_{57}Te_{23}$ | Δ | X | Δ | X |
| 3-016 | $Ge_5Sb_{58}Te_{37}$ | X | Δ | X | X |

TABLE 12

| | | 2x Speed | | |
|---|---|---|---|---|
| Disc No. | Recording layer 304 | 2T CNR | 2T Erasure rate | 2T Storage stability | Overall evaluation |
| 3-201 | $Ge_{35}Sb_{65}$ | Δ | Δ | ○ | Δ |
| 3-202 | $Ge_{36.9}Sb_{60}Te_{3.1}$ | Δ | Δ | ○ | Δ |
| 3-203 | $Ge_{3.2}Sb_{60}Te_{36.8}$ | ○ | Δ | Δ | Δ |
| 3-204 | $Ge_5Sb_{95}$ | Δ | ○ | Δ | Δ |
| 3-205 | $Ge_{30}Sb_{70}$ | Δ | Δ | ○ | Δ |
| 3-206 | $Ge_{30}Sb_{65}Te_5$ | Δ | Δ | ○ | Δ |
| 3-207 | $Ge_{19}Sb_{62}Te_{19}$ | ○ | Δ | ○ | Δ |
| 3-208 | $Ge_{11}Sb_{62}Te_{27}$ | ○ | Δ | Δ | Δ |
| 3-209 | $Ge_5Sb_{75}Te_{20}$ | ○ | Δ | Δ | Δ |
| 3-210 | $Ge_{7.5}Sb_{90}Te_{2.5}$ | Δ | ○ | Δ | Δ |
| 3-211 | $Ge_{25}Sb_{75}$ | Δ | ○ | ○ | Δ |
| 3-212 | $Ge_{25}Sb_{65}Te_{10}$ | ○ | Δ | ○ | Δ |
| 3-213 | $Ge_{7.2}Sb_{65}Te_{27.8}$ | ○ | Δ | ○ | Δ |
| 3-214 | $Ge_{10}Sb_{90}$ | ○ | ○ | Δ | Δ |
| 3-215 | $Ge_{22.5}Sb_{77.5}$ | Δ | ○ | ○ | Δ |
| 3-216 | $Ge_{23}Sb_{70}Te_7$ | ○ | ○ | ○ | ○ |
| 3-217 | $Ge_{16}Sb_{68}Te_{16}$ | ○ | Δ | ○ | Δ |
| 3-218 | $Ge_{12}Sb_{68}Te_{20}$ | ○ | Δ | ○ | Δ |
| 3-219 | $Ge_{12.5}Sb_{75}Te_{12.5}$ | ○ | ○ | ○ | ○ |
| 3-220 | $Ge_{12}Sb_{81}Te_7$ | ○ | ○ | ○ | ○ |
| 3-221 | $Ge_{13}Sb_{87}$ | ○ | ○ | Δ | Δ |
| 3-222 | $Ge_{20.9}Sb_{70}Te_{9.1}$ | ○ | ○ | ○ | ○ |
| 3-223 | $Ge_{11.8}Sb_{70}Te_{18.2}$ | ○ | ○ | ○ | ○ |
| 3-224 | $Ge_{14.5}Sb_{85.5}$ | ○ | ○ | ○ | ○ |
| 3-225 | $Ge_{20}Sb_{80}$ | Δ | ○ | ○ | Δ |
| 3-226 | $Ge_{18}Sb_{82}$ | ○ | ○ | Δ | Δ |
| 3-227 | $Ge_{20}Sb_{75}Te_5$ | ○ | ○ | ○ | ○ |
| 3-228 | $Ge_{15}Sb_{70}Te_{15}$ | ○ | ○ | ○ | ○ |
| 3-229 | $Ge_{14}Sb_{79}Te_7$ | ○ | ○ | ○ | ○ |
| 3-230 | $Ge_{17}Sb_{78}Te_5$ | ○ | ○ | ○ | ○ |
| 3-004 | $Ge_{35.3}Sb_{11.8}Te_{52.9}$ | X | Δ | Δ | X |
| 3-005 | $Ge_{38.1}Sb_{9.5}Te_{52.4}$ | X | X | Δ | X |
| 3-006 | $Ge_{38.1}Bi_{9.5}Te_{52.4}$ | X | Δ | Δ | X |
| 3-014 | $Ge_{30}Sb_{55}Te_{15}$ | Δ | X | Δ | X |
| 3-015 | $Ge_{20}Sb_{57}Te_{23}$ | Δ | X | Δ | X |
| 3-016 | $Ge_5Sb_{58}Te_{37}$ | X | Δ | X | X |

As shown in Tables 11 and 12, with respect to all the properties obtained at 2x speed recording, considerably improved results were obtained in all the information recording media 3 (Disc Nos. 3-201 to 3-230) of this example as compared to the conventional examples 3-004 to 3-006 and 3-014 to 3-016. In the case of the compositions within the composition range (I) shown in FIG. 12, any two properties selected from the modulation degree of a 9T mark, the erasure rate of the 9T mark, the storage stability of the 9T mark, the CNR of a 2T mark, the erasure rate of the 2T mark and the storage stability of the 2T mark were evaluated as Δ. Thus there were properties that were slightly unsatisfactory for the information recording media. However, in the case of the compositions within the composition range (II) and the composition range (III), one or no property was evaluated as Δ, and thus the composition ranges were proved to be more suitable for the recording layer of the fourth information layer 36.

Example 5

An example of the information recording medium 4 shown in FIG. 5 is described in this example. In this example, an example is described in which a recording layer material of the present invention was used for the recording layer 15 of the first information layer 31. A method for manufacturing the information recording medium 4 of this example is described below.

The method for forming the first information layer 31 of the information recording medium 4 is the same as that used in Example 1. The thickness of the first dielectric layer 17 was adjusted so that the reflectance of the first information layer 31 with the recording layer 15 being in a crystalline state (the mirror surface area of the substrate) was 15% to 30% when no other information layer was present.

Subsequently, the optical separation layer 32 provided with a guide groove was formed on the first information layer 31. Thereafter, an initialization process was carried out for crystallizing the whole surface of the recording layer of the first information layer 31 with a laser beam.

Subsequently, the second information layer 42 was formed on the optical separation layer 32. The second information layer 42 was produced by sequentially forming an 18-nm $TiO_2$ film to serve as the transmittance adjusting layer 401, a 10-nm Ag—Pd—Cu film to serve as the reflective layer 402, a 12-nm $(ZrO_2)_{35}(SiO_2)_{15}(Cr_2O_3)_{50}$ (mol %) film to serve as the second dielectric layer 403, a 6-nm $Ge_{16}Sb_{77}Te_7$ film to serve as the recording layer 404, a 5-nm $(ZrO_2)_{35}(SiO_2)_{15}(Cr_2O_3)_{50}$ (mol %) film to serve as the first interface layer 405, and a $(ZnS)_{80}(SiO_2)_{20}$ (mol %) film to serve as the first dielectric layer 406 by the sputtering method.

The thickness of the first dielectric layer 406 was determined by the calculation based on the matrix method. Specifically, the thickness was determined so that when a laser beam with a wavelength of 405 nm was incident, the reflectance of the second information layer 42 with the recording layer 404 being in a crystalline state (the mirror surface area of the substrate) was 3% to 8% and the transmittance thereof (the mirror surface area of the substrate) was 40% to 55% when no other information layer was present.

Thereafter, an ultraviolet curable resin was applied onto the first dielectric layer 406, and a polycarbonate substrate (with a diameter of 120 mm and a thickness of 70 μm) was allowed to adhere thereto, which was subjected to spin coating. After that, the resin was cured with ultraviolet rays and then the cover layer 18 was formed. Thus the information recording medium 4 was produced. Finally, an initialization process was carried out for crystallizing the whole surface of the recording layer of the second information layer 42 with a laser beam.

With respect to information recording media 4 produced as described above and conventional information recording media, the respective first information layers 31 were subjected to recording and reproduction operations and thereby they were evaluated for the modulation degree of a 9T mark, the erasure rate of the 9T mark, the storage stability of the 9T mark, the CNR of a 2T mark, the erasure rate of the 2T mark, and the storage stability of the 2T mark at 4× and 2× speed recording. In this example, reproduction was carried out at 1× speed and 0.70 mW in all the evaluations.

The modulation degree of the 9T mark was evaluated in the same manner as in Example 1. With respect to the modulation degree, ⊚ indicates at least 45%, ○ at least 40%, Δ at least 35%, and x lower than 35%.

The erasure rate of the 9T mark was evaluated in the same manner as in Example 1. With respect to the erasure rate, ⊚ indicates at least 30 dB, ○ at least 25 dB, Δ at least 20 dB, and x lower than 20 dB.

The storage stability of the 9T mark was evaluated in the same manner as in Example 1. With respect to the amount of reduction in CNR (CNR before acceleration−CNR after acceleration), ⊚ indicates 0.0 dB or lower, ○ 1.0 dB or lower, Δ 3.0 dB or lower, and x higher than 3.0 dB.

The CNR of the 2T mark was evaluated in the same manner as in Example 1. With respect to the CNR, ⊚ indicates at least 43 dB, ○ at least 40 dB, Δ at least 37 dB, and x lower than 37 dB.

The erasure rate of the 2T mark was evaluated in the same manner as in Example 1. With respect to the erasure rate, ⊚ indicates at least 30 dB, ○ at least 25 dB, Δ at least 20 dB, and x lower than 20 dB.

The storage stability of the 2T mark was evaluated in the same manner as in Example 1. With respect to the amount of reduction in CNR (CNR before acceleration−CNR after acceleration), ⊚ indicates 0.0 dB or lower, ○ 1.0 dB or lower, Δ 3.0 dB or lower, and x higher than 3.0 dB.

In examples of the information recording medium 4 of this example, the respective recording layers 15 used herein were those having the following compositions, which were expressed in terms of a coordinate (Ge, Sb, Te)=(x, y, z) on the triangular coordinate shown in FIG. 1: (x, y, z)=a (35, 65, 0), b (36.9, 60, 3.1), c (3.2, 60, 36.8), d (5, 95, 0), ① (30, 70, 0), ② (30, 65, 5), ③ (19, 62, 19), ④ (11, 62, 27), ⑤ (5, 75, 20), ⑥ (7.5, 90, 2.5), e (25, 75, 0), f (25, 65, 10), g (7.2, 65, 27.8), h (10, 90, 0), ⑦ (22.5, 77.5, 0), ⑧ (23, 70, 7), ⑨ (16, 68, 16), ⑩ (12, 68, 20), ⑪ (12.5, 75, 12.5), ⑫ (12, 81, 7), ⑬ (13, 87, 0), j (20.9, 70, 9.1), k (11.8, 70, 18.2), m (14.5, 85.5, 0), n (20, 80, 0), ⑭ (18, 82, 0), ⑮ (20, 75, 5), ⑯ (15, 70, 15), ⑰ (14, 79, 7), and ⑱ (17, 78, 5). These discs were numbered as 4-101 to 4-130, respectively.

Furthermore, in order to make a comparison with conventional recording layers, the following information recording media with the structure described above were produced: information recording media (Disc Nos. 4-001 to 4-003) in which $Ge_{35.3}Sb_{11.8}Te_{52.9}$, $Ge_{38.1}Sb_{9.5}Te_{52.4}$ and $Ge_{38.1}Bi_{9.5}Te_{52.4}$ were used for the recording layers 304, and information recording media (Disc Nos. 4-011 to 4-013) in which $Ge_{30}Sb_{55}Te_{15}$, $Ge_{20}Sb_{57}Te_{23}$ and $Ge_5Bi_{58}Te_{37}$ were used for the recording layers 304, respectively. They then were evaluated in the same manner.

Table 13 shows the evaluation results of the modulation degree of a 9T mark, the erasure rate of the 9T mark, and the storage stability of the 9T mark at 4× speed recording. Table 14 shows the evaluation results of the CNR of a 2T mark, the erasure rate of the 2T mark, and the storage stability of the 2T mark at 4× speed recording.

Moreover, Table 15 shows the evaluation results of the modulation degree of a 9T mark, the erasure rate of the 9T mark, and the storage stability of the 9T mark at 2× speed recording. Table 16 shows the evaluation results of the CNR of a 2T mark, the erasure rate of the 2T mark, and the storage stability of the 2T mark at 2× speed recording.

TABLE 13

| | | 4× Speed | | | |
| --- | --- | --- | --- | --- | --- |
| Disc No. | Recording layer 15 | 9T Modulation degree | 9T Erasure rate | 9T Storage stability | Overall evaluation |
| 4-101 | $Ge_{35}Sb_{65}$ | ○ | Δ | ⊚ | Δ |
| 4-102 | $Ge_{36.9}Sb_{60}Te_{3.1}$ | ○ | Δ | ⊚ | Δ |
| 4-103 | $Ge_{3.2}Sb_{60}Te_{36.8}$ | ○ | Δ | ○ | Δ |
| 4-104 | $Ge_5Sb_{95}$ | Δ | ⊚ | Δ | Δ |
| 4-105 | $Ge_{30}Sb_{70}$ | ⊚ | Δ | ⊚ | Δ |
| 4-106 | $Ge_{30}Sb_{65}Te_5$ | ○ | Δ | ⊚ | Δ |
| 4-107 | $Ge_{19}Sb_{62}Te_{19}$ | ○ | Δ | ○ | Δ |
| 4-108 | $Ge_{11}Sb_{62}Te_{27}$ | ○ | Δ | ○ | Δ |
| 4-109 | $Ge_5Sb_{75}Te_{20}$ | ○ | ○ | Δ | Δ |
| 4-110 | $Ge_{7.5}Sb_{90}Te_{2.5}$ | Δ | ⊚ | Δ | Δ |
| 4-111 | $Ge_{25}Sb_{75}$ | ○ | ○ | ⊚ | ○ |
| 4-112 | $Ge_{25}Sb_{65}Te_{10}$ | ○ | ○ | ⊚ | ○ |
| 4-113 | $Ge_{7.2}Sb_{65}Te_{27.8}$ | ○ | ○ | ○ | ○ |
| 4-114 | $Ge_{10}Sb_{90}$ | ○ | ⊚ | ○ | ○ |
| 4-115 | $Ge_{22.5}Sb_{77.5}$ | ○ | ○ | ⊚ | ○ |
| 4-116 | $Ge_{23}Sb_{70}Te_7$ | ○ | ○ | ⊚ | ○ |
| 4-117 | $Ge_{16}Sb_{68}Te_{16}$ | ○ | ○ | ⊚ | ○ |
| 4-118 | $Ge_{12}Sb_{68}Te_{20}$ | ○ | ○ | ○ | ○ |
| 4-119 | $Ge_{12.5}Sb_{75}Te_{12.5}$ | ○ | ○ | ○ | ○ |
| 4-120 | $Ge_{12}Sb_{81}Te_7$ | ○ | ⊚ | ○ | ○ |
| 4-121 | $Ge_{13}Sb_{87}$ | ○ | ⊚ | ○ | ○ |
| 4-122 | $Ge_{20.9}Sb_{70}Te_{9.1}$ | ⊚ | ○ | ⊚ | ⊚ |
| 4-123 | $Ge_{11.8}Sb_{70}Te_{18.2}$ | ⊚ | ○ | ⊚ | ⊚ |
| 4-124 | $Ge_{14.5}Sb_{85.5}$ | ○ | ⊚ | ⊚ | ⊚ |
| 4-125 | $Ge_{20}Sb_{80}$ | ⊚ | ○ | ⊚ | ⊚ |
| 4-126 | $Ge_{18}Sb_{82}$ | ⊚ | ○ | ⊚ | ⊚ |
| 4-127 | $Ge_{20}Sb_{75}Te_5$ | ⊚ | ○ | ⊚ | ⊚ |
| 4-128 | $Ge_{15}Sb_{70}Te_{15}$ | ⊚ | ○ | ⊚ | ⊚ |
| 4-129 | $Ge_{14}Sb_{79}Te_7$ | ⊚ | ○ | ⊚ | ⊚ |
| 4-130 | $Ge_{17}Sb_{78}Te_5$ | ⊚ | ○ | ⊚ | ⊚ |
| 4-001 | $Ge_{35.3}Sb_{11.8}Te_{52.9}$ | Δ | X | Δ | X |
| 4-002 | $Ge_{38.1}Sb_{9.5}Te_{52.4}$ | X | X | Δ | X |
| 4-003 | $Ge_{38.1}Bi_{9.5}Te_{52.4}$ | Δ | Δ | X | X |
| 4-011 | $Ge_{30}Sb_{55}Te_{15}$ | Δ | X | ○ | X |
| 4-012 | $Ge_{20}Sb_{57}Te_{23}$ | Δ | X | Δ | X |
| 4-013 | $Ge_5Sb_{58}Te_{37}$ | X | Δ | X | X |

TABLE 14

| | | 4x Speed | | | |
|---|---|---|---|---|---|
| Disc No. | Recording layer 15 | 2T CNR | 2T Erasure rate | 2T Storage stability | Overall evaluation |
| 4-101 | $Ge_{35}Sb_{65}$ | ○ | Δ | ◎ | Δ |
| 4-102 | $Ge_{36.9}Sb_{60}Te_{3.1}$ | ○ | Δ | ◎ | Δ |
| 4-103 | $Ge_{3.2}Sb_{60}Te_{36.8}$ | ○ | Δ | ○ | Δ |
| 4-104 | $Ge_5Sb_{95}$ | Δ | ◎ | Δ | Δ |
| 4-105 | $Ge_{30}Sb_{70}$ | ◎ | Δ | ◎ | Δ |
| 4-106 | $Ge_{30}Sb_{65}Te_5$ | ○ | Δ | ◎ | Δ |
| 4-107 | $Ge_{19}Sb_{62}Te_{19}$ | ○ | Δ | ○ | Δ |
| 4-108 | $Ge_{11}Sb_{62}Te_{27}$ | ○ | Δ | ○ | Δ |
| 4-109 | $Ge_5Sb_{75}Te_{20}$ | ○ | ○ | Δ | Δ |
| 4-110 | $Ge_{7.5}Sb_{90}Te_{2.5}$ | Δ | ◎ | Δ | Δ |
| 4-111 | $Ge_{25}Sb_{75}$ | ○ | ○ | ◎ | ○ |
| 4-112 | $Ge_{25}Sb_{65}Te_{10}$ | ○ | ○ | ◎ | ○ |
| 4-113 | $Ge_{7.2}Sb_{65}Te_{27.8}$ | ○ | ○ | ○ | ○ |
| 4-114 | $Ge_{10}Sb_{90}$ | ○ | ◎ | ○ | ○ |
| 4-115 | $Ge_{22.5}Sb_{77.5}$ | ○ | ○ | ◎ | ○ |
| 4-116 | $Ge_{23}Sb_{70}Te_7$ | ○ | ○ | ◎ | ○ |
| 4-117 | $Ge_{16}Sb_{68}Te_{16}$ | ○ | ○ | ◎ | ○ |
| 4-118 | $Ge_{12}Sb_{68}Te_{20}$ | ○ | ○ | ○ | ○ |
| 4-119 | $Ge_{12.5}Sb_{75}Te_{12.5}$ | ○ | ○ | ○ | ○ |
| 4-120 | $Ge_{12}Sb_{81}Te_7$ | ○ | ◎ | ○ | ○ |
| 4-121 | $Ge_{13}Sb_{87}$ | ○ | ◎ | ○ | ○ |
| 4-122 | $Ge_{20.9}Sb_{70}Te_{9.1}$ | ◎ | ○ | ◎ | ◎ |
| 4-123 | $Ge_{11.8}Sb_{70}Te_{18.2}$ | ◎ | ○ | ◎ | ◎ |
| 4-124 | $Ge_{14.5}Sb_{85.5}$ | ○ | ◎ | ◎ | ◎ |
| 4-125 | $Ge_{20}Sb_{80}$ | ◎ | ◎ | ◎ | ◎ |
| 4-126 | $Ge_{18}Sb_{82}$ | ◎ | ◎ | ◎ | ◎ |
| 4-127 | $Ge_{20}Sb_{75}Te_5$ | ◎ | ◎ | ◎ | ◎ |
| 4-128 | $Ge_{15}Sb_{70}Te_{15}$ | ◎ | ◎ | ◎ | ◎ |
| 4-129 | $Ge_{14}Sb_{79}Te_7$ | ◎ | ◎ | ◎ | ◎ |
| 4-130 | $Ge_{17}Sb_{78}Te_5$ | ◎ | ○ | ◎ | ◎ |
| 4-001 | $Ge_{35.3}Sb_{11.8}Te_{52.9}$ | Δ | X | Δ | X |
| 4-002 | $Ge_{38.1}Sb_{9.5}Te_{52.4}$ | X | X | Δ | X |
| 4-003 | $Ge_{38.1}Bi_{9.5}Te_{52.4}$ | Δ | Δ | X | X |
| 4-011 | $Ge_{30}Sb_{55}Te_{15}$ | Δ | X | ○ | X |
| 4-012 | $Ge_{20}Sb_{57}Te_{23}$ | Δ | X | Δ | X |
| 4-013 | $Ge_5Sb_{58}Te_{37}$ | X | Δ | X | X |

TABLE 15

| | | 2x Speed | | | |
|---|---|---|---|---|---|
| Disc No. | Recording layer 15 | 9T Modulation degree | 9T Erasure rate | 9T Storage stability | Overall evaluation |
| 4-101 | $Ge_{35}Sb_{65}$ | ○ | ○ | ◎ | ○ |
| 4-102 | $Ge_{36.9}Sb_{60}Te_{3.1}$ | ◎ | ○ | ◎ | ◎ |
| 4-103 | $Ge_{3.2}Sb_{60}Te_{36.8}$ | ○ | ○ | ○ | ○ |
| 4-104 | $Ge_5Sb_{95}$ | Δ | ◎ | Δ | Δ |
| 4-105 | $Ge_{30}Sb_{70}$ | ◎ | Δ | ◎ | Δ |
| 4-106 | $Ge_{30}Sb_{65}Te_5$ | ○ | ○ | ◎ | ○ |
| 4-107 | $Ge_{19}Sb_{62}Te_{19}$ | ◎ | ○ | ◎ | ◎ |
| 4-108 | $Ge_{11}Sb_{62}Te_{27}$ | ○ | ○ | ○ | ○ |
| 4-109 | $Ge_5Sb_{75}Te_{20}$ | ○ | ◎ | ○ | ○ |
| 4-110 | $Ge_{7.5}Sb_{90}Te_{2.5}$ | Δ | ◎ | Δ | Δ |
| 4-111 | $Ge_{25}Sb_{75}$ | ○ | ○ | ◎ | ◎ |
| 4-112 | $Ge_{25}Sb_{65}Te_{10}$ | ◎ | ○ | ◎ | ◎ |
| 4-113 | $Ge_{7.2}Sb_{65}Te_{27.8}$ | ◎ | ○ | ○ | ◎ |
| 4-114 | $Ge_{10}Sb_{90}$ | ○ | ◎ | ○ | ◎ |
| 4-115 | $Ge_{22.5}Sb_{77.5}$ | ◎ | ○ | ◎ | ◎ |
| 4-116 | $Ge_{23}Sb_{70}Te_7$ | ◎ | ○ | ◎ | ◎ |
| 4-117 | $Ge_{16}Sb_{68}Te_{16}$ | ◎ | ○ | ◎ | ◎ |
| 4-118 | $Ge_{12}Sb_{68}Te_{20}$ | ○ | ◎ | ○ | ◎ |
| 4-119 | $Ge_{12.5}Sb_{75}Te_{12.5}$ | ○ | ◎ | ○ | ○ |
| 4-120 | $Ge_{12}Sb_{81}Te_7$ | ○ | ◎ | ○ | ○ |
| 4-121 | $Ge_{13}Sb_{87}$ | ○ | ◎ | ○ | ○ |
| 4-122 | $Ge_{20.9}Sb_{70}Te_{9.1}$ | ◎ | ○ | ◎ | ◎ |
| 4-123 | $Ge_{11.8}Sb_{70}Te_{18.2}$ | ◎ | ○ | ◎ | ◎ |
| 4-124 | $Ge_{14.5}Sb_{85.5}$ | ○ | ◎ | ◎ | ◎ |
| 4-125 | $Ge_{20}Sb_{80}$ | ◎ | ◎ | ◎ | ◎ |
| 4-126 | $Ge_{18}Sb_{82}$ | ◎ | ◎ | ◎ | ◎ |
| 4-127 | $Ge_{20}Sb_{75}Te_5$ | ◎ | ◎ | ◎ | ◎ |
| 4-128 | $Ge_{15}Sb_{70}Te_{15}$ | ◎ | ○ | ◎ | ◎ |
| 4-129 | $Ge_{14}Sb_{79}Te_7$ | ◎ | ◎ | ◎ | ◎ |
| 4-130 | $Ge_{17}Sb_{78}Te_5$ | ◎ | ◎ | ◎ | ◎ |
| 4-001 | $Ge_{35.3}Sb_{11.8}Te_{52.9}$ | Δ | ○ | X | X |
| 4-002 | $Ge_{38.1}Sb_{9.5}Te_{52.4}$ | ○ | Δ | Δ | Δ |
| 4-003 | $Ge_{38.1}Bi_{9.5}Te_{52.4}$ | ○ | ○ | X | X |
| 4-011 | $Ge_{30}Sb_{55}Te_{15}$ | ○ | X | ○ | X |
| 4-012 | $Ge_{20}Sb_{57}Te_{23}$ | Δ | Δ | Δ | Δ |
| 4-013 | $Ge_5Sb_{58}Te_{37}$ | X | ○ | X | X |

TABLE 16

| | | 2x Speed | | | |
|---|---|---|---|---|---|
| Disc No. | Recording layer 15 | 2T CNR | 2T Erasure rate | 2T Storage stability | Overall evaluation |
| 4-101 | $Ge_{35}Sb_{65}$ | ○ | ○ | ◎ | ○ |
| 4-102 | $Ge_{36.9}Sb_{60}Te_{3.1}$ | ◎ | ○ | ◎ | ◎ |
| 4-103 | $Ge_{3.2}Sb_{60}Te_{36.8}$ | ○ | ○ | ○ | ○ |
| 4-104 | $Ge_5Sb_{95}$ | Δ | ◎ | Δ | Δ |
| 4-105 | $Ge_{30}Sb_{70}$ | ◎ | Δ | ◎ | Δ |
| 4-106 | $Ge_{30}Sb_{65}Te_5$ | ○ | ○ | ◎ | ○ |
| 4-107 | $Ge_{19}Sb_{62}Te_{19}$ | ◎ | ○ | ◎ | ◎ |
| 4-108 | $Ge_{11}Sb_{62}Te_{27}$ | ○ | ○ | ○ | ○ |
| 4-109 | $Ge_5Sb_{75}Te_{20}$ | ○ | ◎ | ○ | ○ |
| 4-110 | $Ge_{7.5}Sb_{90}Te_{2.5}$ | Δ | ◎ | Δ | Δ |
| 4-111 | $Ge_{25}Sb_{75}$ | ○ | ○ | ◎ | ◎ |
| 4-112 | $Ge_{25}Sb_{65}Te_{10}$ | ◎ | ○ | ◎ | ◎ |
| 4-113 | $Ge_{7.2}Sb_{65}Te_{27.8}$ | ◎ | ○ | ○ | ◎ |
| 4-114 | $Ge_{10}Sb_{90}$ | ○ | ◎ | ○ | ◎ |
| 4-115 | $Ge_{22.5}Sb_{77.5}$ | ◎ | ○ | ◎ | ◎ |
| 4-116 | $Ge_{23}Sb_{70}Te_7$ | ◎ | ○ | ◎ | ◎ |
| 4-117 | $Ge_{16}Sb_{68}Te_{16}$ | ◎ | ○ | ◎ | ◎ |
| 4-118 | $Ge_{12}Sb_{68}Te_{20}$ | ○ | ◎ | ○ | ◎ |
| 4-119 | $Ge_{12.5}Sb_{75}Te_{12.5}$ | ○ | ◎ | ○ | ○ |
| 4-120 | $Ge_{12}Sb_{81}Te_7$ | ○ | ◎ | ○ | ○ |
| 4-121 | $Ge_{13}Sb_{87}$ | ○ | ◎ | ○ | ○ |
| 4-122 | $Ge_{20.9}Sb_{70}Te_{9.1}$ | ◎ | ○ | ◎ | ◎ |
| 4-123 | $Ge_{11.8}Sb_{70}Te_{18.2}$ | ◎ | ○ | ◎ | ◎ |
| 4-124 | $Ge_{14.5}Sb_{85.5}$ | ○ | ◎ | ◎ | ◎ |
| 4-125 | $Ge_{20}Sb_{80}$ | ◎ | ◎ | ◎ | ◎ |
| 4-126 | $Ge_{18}Sb_{82}$ | ◎ | ◎ | ◎ | ◎ |
| 4-127 | $Ge_{20}Sb_{75}Te_5$ | ◎ | ◎ | ◎ | ◎ |
| 4-128 | $Ge_{15}Sb_{70}Te_{15}$ | ◎ | ○ | ◎ | ◎ |
| 4-129 | $Ge_{14}Sb_{79}Te7$ | ◎ | ◎ | ◎ | ◎ |
| 4-130 | $Ge_{17}Sb_{78}Te_5$ | ◎ | ◎ | ◎ | ◎ |
| 4-001 | $Ge_{35.3}Sb_{11.8}Te_{52.9}$ | Δ | ○ | X | X |
| 4-002 | $Ge_{38.1}Sb_{9.5}Te_{52.4}$ | ○ | Δ | Δ | Δ |
| 4-003 | $Ge_{38.1}Bi_{9.5}Te_{52.4}$ | ○ | ○ | X | X |
| 4-011 | $Ge_{30}Sb_{55}Te_{15}$ | ○ | X | ○ | X |
| 4-012 | $Ge_{20}Sb_{57}Te_{23}$ | Δ | Δ | Δ | Δ |
| 4-013 | $Ge_5Sb_{58}Te_{37}$ | X | ○ | X | X |

As shown in Tables 13 to 16, with respect to all the properties obtained at 4× and 2× speed recording, considerably improved results were obtained in all the information recording media 4 (Disc Nos. 4-101 to 4-130) of this example as compared to the conventional examples 4-001 to 4-003 and 4-011 to 4-013. Furthermore, like Example 1, in the case of the compositions within the composition range (I) shown in FIG. 12, any one property selected from the modulation degree of a 9T mark, the erasure rate of the 9T mark, the storage stability of the 9T mark, the CNR of a 2T mark, the erasure rate of the 2T mark and the storage stability of the 2T mark was evaluated as Δ at 4× speed recording. Thus there were properties that were slightly unsatisfactory for the information recording media. However, in the case of the compositions within the composition range (II), no properties were evaluated as Δ and thus the composition range (II) was proved to be more suitable for 4× speed recording. Furthermore, in the case of the compositions within the composition range (III), two of the properties were evaluated as ⊚ and thus the composition range (III) was proved to be more suitable for 4× speed recording as compared to the composition range (II).

Example 6

An example of the information recording medium 4 shown in FIG. 5 is described in this example. In this example, an example is described in which a recording layer material of the present invention was used for the recording layer 404 of the second information layer 42. A method for manufacturing the information recording medium 4 of this example is described below.

The method for forming the first information layer 31 of the information recording medium 4 is the same as that used in Example 1. $Ge_5Sb_{79}Te_{16}$ was used for the recording layer 15. The thickness of the first dielectric layer 17 was adjusted so that the reflectance of the first information layer 31 with the recording layer 15 being in a crystalline state (the mirror surface area of the substrate) was 15% to 30% when no other information layer was present. Subsequently, the optical separation layer 32 provided with a guide groove was formed on the first information layer 31. Thereafter, an initialization process was carried out for crystallizing the whole surface of the recording layer of the first information layer 31 with a laser beam.

Subsequently, the second information layer 42 is formed on the optical separation layer 32. The method for forming the second information layer 42 is the same as that used in Example 5.

The thickness of the first dielectric layer 406 was determined by the calculation based on the matrix method. Specifically, the thickness was determined so that when a laser beam with a wavelength of 405 nm was incident, the reflectance of the second information layer 42 with the recording layer 404 being in a crystalline state (the mirror surface area of the substrate) was 3% to 8% and the transmittance thereof (the mirror surface area of the substrate) was 40% to 55% when no other information layer was present.

Thereafter, an ultraviolet curable resin was applied onto the first dielectric layer 406, and a polycarbonate substrate (with a diameter of 120 mm and a thickness of 70 μm) was allowed to adhere thereto, which was subjected to spin coating. After that, the resin was cured with ultraviolet rays and then the cover layer 18 was formed. Thus the information recording medium 4 was produced. Finally, an initialization process was carried out for crystallizing the whole surface of the recording layer of the second information layer 42 with a laser beam.

With respect to the information recording media 4 produced as described above and conventional information recording media, the respective second information layers 42 were subjected to recording and reproduction operations and thereby they were evaluated for the modulation degree of a 9T mark, the erasure rate of the 9T mark, the storage stability of the 9T mark, the CNR of a 2T mark, the erasure rate of the 2T mark, and the storage stability of the 2T mark at 4× and 2× speed recording. In this example, reproduction was carried out at 1× speed and 0.70 mW in all the evaluations.

The modulation degree of the 9T mark was evaluated in the same manner as in Example 1. With respect to the modulation degree, ⊚ indicates at least 40%, ○ at least 35%, Δ at least 30%, and × lower than 30%.

The erasure rate of the 9T mark was evaluated in the same manner as in Example 1. With respect to the erasure rate, ⊚ indicates at least 28 dB, ○ at least 23 dB, Δ at least 18 dB, and × lower than 18 dB.

The storage stability of the 9T mark was evaluated in the same manner as in Example 1. With respect to the amount of reduction in CNR (CNR before acceleration−CNR after acceleration), ⊚ indicates 0.0 dB or lower, ○ 1.0 dB or lower, Δ 3.0 dB or lower, and × higher than 3.0 dB.

The CNR of the 2T mark was evaluated in the same manner as in Example 1. With respect to the CNR, ⊚ indicates at least 40 dB, ○ at least 37 dB, Δ at least 34 dB, and × lower than 34 dB.

The erasure rate of the 2T mark was evaluated in the same manner as in Example 1. With respect to the erasure rate, ⊚ indicates at least 28 dB, ○ at least 23 dB, Δ at least 18 dB, and × lower than 18 dB.

The storage stability of the 2T mark was evaluated in the same manner as in Example 1. With respect to the amount of reduction in CNR (CNR before acceleration−CNR after acceleration), ⊚ indicates 0.0 dB or lower, ○ 1.0 dB or lower, Δ 3.0 dB or lower, and × higher than 3.0 dB.

In examples of the information recording medium 4 of this example, the respective recording layers 404 used herein were those having the following compositions, which were expressed in terms of a coordinate (Ge, Sb, Te)=(x, y, z) on the triangular coordinate shown in FIG. 1: (x, y, z)=a (35, 65, 0), b (36.9, 60, 3.1), c (3.2, 60, 36.8), d (5, 95, 0), ①(30, 70, 0), ②(30, 65, 5), ③(19, 62, 19), ④(11, 62, 27), ⑤(5, 75, 20), ⑥(7.5, 90, 2.5), e (25, 75, 0), f (25, 65, 10), g (7.2, 65, 27.8), h (10, 90, 0), ⑦(22.5, 77.5, 0), ⑧(23, 70, 7), ⑨(16, 68, 16), ⑩(12, 68, 20), ⑪(12.5, 75, 12.5), ⑫(12, 81, 7), ⑬(13, 87, 0), j (20.9, 70, 9.1), k (11.8, 70, 18.2), m (14.5, 85.5, 0), n (20, 80, 0), ⑭(18, 82, 0), ⑮(20, 75, 5), ⑯(15, 70, 15), ⑰(14, 79, 7), and ⑱(17, 78, 5). These discs were numbered as 4-201 to 4-230, respectively.

Furthermore, in order to make a comparison with conventional recording layers, the following information recording media with the structure described above were produced: information recording media (Disc Nos. 4-004 to 4-006) in which $Ge_{35.3}Sb_{11.8}Te_{52.9}$, $Ge_{38.1}Sb_{9.5}Te_{52.4}$ and $Ge_{38.1}Bi_{9.5}Te_{52.4}$ were used for the recording layers 304, and information recording media (Disc Nos. 4-014 to 4-016) in which $Ge_{30}Sb_{55}Te_{15}$, $Ge_{20}Sb_{57}Te_{23}$ and $Ge_5Bi_{58}Te_{37}$ were used for the recording layers 304, respectively. They then were evaluated in the same manner.

Table 17 shows the evaluation results of the modulation degree of a 9T mark, the erasure rate of the 9T mark, and the storage stability of the 9T mark at 4× speed recording. Table 18 shows the evaluation results of the CNR of a 2T mark, the erasure rate of the 2T mark, and the storage stability of the 2T mark at 4× speed recording.

Moreover, Table 19 shows the evaluation results of the modulation degree of a 9T mark, the erasure rate of the 9T mark, and the storage stability of the 9T mark at 2× speed recording. Table 20 shows the evaluation results of the CNR of a 2T mark, the erasure rate of the 2T mark, and the storage stability of the 2T mark at 2× speed recording.

TABLE 17

| | | 4x Speed | | | |
|---|---|---|---|---|---|
| Disc No. | Recording layer 404 | 9T Modulation degree | 9T Erasure rate | 9T Storage stability | Overall evaluation |
| 4-201 | $Ge_{35}Sb_{65}$ | ○ | △ | ◎ | △ |
| 4-202 | $Ge_{36.9}Sb_{60}Te_{3.1}$ | ○ | △ | ◎ | △ |
| 4-203 | $Ge_{3.2}Sb_{60}Te_{36.8}$ | ○ | △ | ○ | △ |
| 4-204 | $Ge_5Sb_{95}$ | △ | ◎ | △ | △ |
| 4-205 | $Ge_{30}Sb_{70}$ | ◎ | △ | ◎ | △ |
| 4-206 | $Ge_{30}Sb_{65}Te_5$ | ○ | △ | ◎ | △ |
| 4-207 | $Ge_{19}Sb_{62}Te_{19}$ | ○ | △ | ○ | △ |
| 4-208 | $Ge_{11}Sb_{62}Te_{27}$ | ○ | △ | ○ | △ |
| 4-209 | $Ge_5Sb_{75}Te_{20}$ | ○ | ○ | △ | △ |
| 4-210 | $Ge_{7.5}Sb_{90}Te_{2.5}$ | △ | ◎ | △ | △ |
| 4-211 | $Ge_{25}Sb_{75}$ | ○ | ○ | ◎ | ○ |
| 4-212 | $Ge_{25}Sb_{65}Te_{10}$ | ○ | ○ | ◎ | ○ |
| 4-213 | $Ge_{7.2}Sb_{65}Te_{27.8}$ | ○ | ○ | ○ | ○ |
| 4-214 | $Ge_{10}Sb_{90}$ | ○ | ◎ | ○ | ○ |
| 4-215 | $Ge_{22.5}Sb_{77.5}$ | ○ | ◎ | ○ | ○ |
| 4-216 | $Ge_{23}Sb_{70}Te_7$ | ○ | ○ | ○ | ○ |
| 4-217 | $Ge_{16}Sb_{68}Te_{16}$ | ○ | ○ | ○ | ○ |
| 4-218 | $Ge_{12}Sb_{68}Te_{20}$ | ○ | ○ | ○ | ○ |
| 4-219 | $Ge_{12.5}Sb_{75}Te_{12.5}$ | ○ | ○ | ○ | ○ |
| 4-220 | $Ge_{12}Sb_{81}Te_7$ | ○ | ◎ | ○ | ○ |
| 4-221 | $Ge_{13}Sb_{87}$ | ○ | ◎ | ○ | ○ |
| 4-222 | $Ge_{20.9}Sb_{70}Te_{9.1}$ | ◎ | ○ | ◎ | ◎ |
| 4-223 | $Ge_{11.8}Sb_{70}Te_{18.2}$ | ◎ | ○ | ◎ | ◎ |
| 4-224 | $Ge_{14.5}Sb_{85.5}$ | ○ | ◎ | ○ | ◎ |
| 4-225 | $Ge_{20}Sb_{80}$ | ◎ | ○ | ◎ | ◎ |
| 4-226 | $Ge_{18}Sb_{82}$ | ◎ | ○ | ◎ | ◎ |
| 4-227 | $Ge_{20}Sb_{75}Te_5$ | ◎ | ○ | ◎ | ◎ |
| 4-228 | $Ge_{15}Sb_{70}Te_{15}$ | ◎ | ○ | ◎ | ◎ |
| 4-229 | $Ge_{14}Sb_{79}Te_7$ | ◎ | ○ | ◎ | ◎ |
| 4-230 | $Ge_{17}Sb_{78}Te_5$ | ◎ | ○ | ◎ | ◎ |
| 4-004 | $Ge_{35.3}Sb_{11.8}Te_{52.9}$ | △ | X | △ | X |
| 4-005 | $Ge_{38.1}Sb_{9.5}Te_{52.4}$ | X | X | △ | X |
| 4-006 | $Ge_{38.1}Bi_{9.5}Te_{52.4}$ | △ | △ | X | X |
| 4-014 | $Ge_{30}Sb_{55}Te_{15}$ | △ | X | ○ | X |
| 4-015 | $Ge_{20}Sb_{57}Te_{23}$ | △ | X | △ | X |
| 4-016 | $Ge_5Sb_{58}Te_{37}$ | X | △ | X | X |

TABLE 18

| | | 4x Speed | | | |
|---|---|---|---|---|---|
| Disc No. | Recording layer 404 | 2T CNR | 2T Erasure rate | 2T Storage stability | Overall evaluation |
| 4-201 | $Ge_{35}Sb_{65}$ | ○ | △ | ◎ | △ |
| 4-202 | $Ge_{36.9}Sb_{60}Te_{3.1}$ | ○ | △ | ◎ | △ |
| 4-203 | $Ge_{3.2}Sb_{60}Te_{36.8}$ | ○ | △ | ○ | △ |
| 4-204 | $Ge_5Sb_{95}$ | △ | ◎ | △ | △ |
| 4-205 | $Ge_{30}Sb_{70}$ | ◎ | △ | ◎ | △ |
| 4-206 | $Ge_{30}Sb_{65}Te_5$ | ○ | △ | ◎ | △ |
| 4-207 | $Ge_{19}Sb_{62}Te_{19}$ | ○ | △ | ○ | △ |
| 4-208 | $Ge_{11}Sb_{62}Te_{27}$ | ○ | △ | ○ | △ |
| 4-209 | $Ge_5Sb_{75}Te_{20}$ | ○ | ○ | △ | △ |
| 4-210 | $Ge_{7.5}Sb_{90}Te_{2.5}$ | △ | ◎ | △ | △ |
| 4-211 | $Ge_{25}Sb_{75}$ | ○ | ○ | ◎ | ○ |
| 4-212 | $Ge_{25}Sb_{65}Te_{10}$ | ○ | ○ | ◎ | ○ |
| 4-213 | $Ge_{7.2}Sb_{65}Te_{27.8}$ | ○ | ○ | ○ | ○ |
| 4-214 | $Ge_{10}Sb_{90}$ | ○ | ◎ | ○ | ○ |
| 4-215 | $Ge_{22.5}Sb_{77.5}$ | ○ | ◎ | ○ | ○ |
| 4-216 | $Ge_{23}Sb_{70}Te_7$ | ○ | ○ | ○ | ○ |
| 4-217 | $Ge_{16}Sb_{68}Te_{16}$ | ○ | ○ | ○ | ○ |
| 4-218 | $Ge_{12}Sb_{68}Te_{20}$ | ○ | ○ | ○ | ○ |
| 4-219 | $Ge_{12.5}Sb_{75}Te_{12.5}$ | ○ | ○ | ○ | ○ |
| 4-220 | $Ge_{12}Sb_{81}Te_7$ | ○ | ◎ | ○ | ○ |
| 4-221 | $Ge_{13}Sb_{87}$ | ○ | ◎ | ○ | ○ |
| 4-222 | $Ge_{20.9}Sb_{70}Te_{9.1}$ | ◎ | ○ | ◎ | ◎ |
| 4-223 | $Ge_{11.8}Sb_{70}Te_{18.2}$ | ◎ | ○ | ◎ | ◎ |
| 4-224 | $Ge_{14.5}Sb_{85.5}$ | ○ | ◎ | ○ | ◎ |
| 4-225 | $Ge_{20}Sb_{80}$ | ◎ | ○ | ◎ | ◎ |
| 4-226 | $Ge_{18}Sb_{82}$ | ◎ | ○ | ◎ | ◎ |
| 4-227 | $Ge_{20}Sb_{75}Te_5$ | ◎ | ○ | ◎ | ◎ |
| 4-228 | $Ge_{15}Sb_{70}Te_{15}$ | ◎ | ○ | ◎ | ◎ |
| 4-229 | $Ge_{14}Sb_{79}Te_7$ | ◎ | ○ | ◎ | ◎ |
| 4-230 | $Ge_{17}Sb_{78}Te_5$ | ◎ | ○ | ◎ | ◎ |
| 4-004 | $Ge_{35.3}Sb_{11.8}Te_{52.9}$ | △ | X | △ | X |
| 4-005 | $Ge_{38.1}Sb_{9.5}Te_{52.4}$ | X | X | △ | X |
| 4-006 | $Ge_{38.1}Bi_{9.5}Te_{52.4}$ | △ | △ | X | X |
| 4-014 | $Ge_{30}Sb_{55}Te_{15}$ | △ | X | ○ | X |
| 4-015 | $Ge_{20}Sb_{57}Te_{23}$ | △ | X | △ | X |
| 4-016 | $Ge_5Sb_{58}Te_{37}$ | X | △ | X | X |

TABLE 19

| | | 2x Speed | | | |
|---|---|---|---|---|---|
| Disc No. | Recording layer 404 | 9T Modulation degree | 9T Erasure rate | 9T Storage stability | Overall evaluation |
| 4-201 | $Ge_{35}Sb_{65}$ | ○ | ○ | ◎ | ○ |
| 4-202 | $Ge_{36.9}Sb_{60}Te_{3.1}$ | ◎ | ○ | ◎ | ◎ |
| 4-203 | $Ge_{3.2}Sb_{60}Te_{36.8}$ | ○ | ○ | ○ | △ |
| 4-204 | $Ge_5Sb_{95}$ | △ | ◎ | △ | △ |
| 4-205 | $Ge_{30}Sb_{70}$ | ◎ | △ | ◎ | △ |
| 4-206 | $Ge_{30}Sb_{65}Te_5$ | ○ | ○ | ◎ | ○ |
| 4-207 | $Ge_{19}Sb_{62}Te_{19}$ | ◎ | ○ | ◎ | ◎ |
| 4-208 | $Ge_{11}Sb_{62}Te_{27}$ | ○ | ○ | ○ | ○ |
| 4-209 | $Ge_5Sb_{75}Te_{20}$ | ○ | ◎ | ○ | ○ |
| 4-210 | $Ge_{7.5}Sb_{90}Te_{2.5}$ | △ | ◎ | △ | △ |
| 4-211 | $Ge_{25}Sb_{75}$ | ○ | ◎ | ◎ | ◎ |
| 4-212 | $Ge_{25}Sb_{65}Te_{10}$ | ◎ | ○ | ◎ | ◎ |
| 4-213 | $Ge_{7.2}Sb_{65}Te_{27.8}$ | ○ | ◎ | ○ | ◎ |
| 4-214 | $Ge_{10}Sb_{90}$ | ○ | ◎ | ○ | ◎ |
| 4-215 | $Ge_{22.5}Sb_{77.5}$ | ○ | ◎ | ○ | ◎ |
| 4-216 | $Ge_{23}Sb_{70}Te_7$ | ○ | ◎ | ○ | ◎ |
| 4-217 | $Ge_{16}Sb_{68}Te_{16}$ | ○ | ○ | ○ | ○ |
| 4-218 | $Ge_{12}Sb_{68}Te_{20}$ | ○ | ◎ | ○ | ◎ |
| 4-219 | $Ge_{12.5}Sb_{75}Te_{12.5}$ | ○ | ◎ | ○ | ◎ |
| 4-220 | $Ge_{12}Sb_{81}Te_7$ | ○ | ◎ | ○ | ○ |
| 4-221 | $Ge_{13}Sb_{87}$ | ○ | ◎ | ○ | ○ |
| 4-222 | $Ge_{20.9}Sb_{70}Te_{9.1}$ | ◎ | ○ | ◎ | ◎ |
| 4-223 | $Ge_{11.8}Sb_{70}Te_{18.2}$ | ◎ | ○ | ◎ | ◎ |
| 4-224 | $Ge_{14.5}Sb_{85.5}$ | ○ | ◎ | ○ | ◎ |
| 4-225 | $Ge_{20}Sb_{80}$ | ◎ | ○ | ◎ | ◎ |
| 4-226 | $Ge_{18}Sb_{82}$ | ◎ | ○ | ◎ | ◎ |
| 4-227 | $Ge_{20}Sb_{75}Te_5$ | ◎ | ○ | ◎ | ◎ |
| 4-228 | $Ge_{15}Sb_{70}Te_{15}$ | ◎ | ○ | ◎ | ◎ |
| 4-229 | $Ge_{14}Sb_{79}Te_7$ | ◎ | ○ | ◎ | ◎ |
| 4-230 | $Ge_{17}Sb_{78}Te_5$ | ◎ | ○ | ◎ | ◎ |
| 4-004 | $Ge_{35.3}Sb_{11.8}Te_{52.9}$ | △ | ○ | X | X |
| 4-005 | $Ge_{38.1}Sb_{9.5}Te_{52.4}$ | ○ | △ | △ | △ |
| 4-006 | $Ge_{38.1}Bi_{9.5}Te_{52.4}$ | ○ | ○ | X | X |
| 4-014 | $Ge_{30}Sb_{55}Te_{15}$ | ○ | X | ○ | X |
| 4-015 | $Ge_{20}Sb_{57}Te_{23}$ | △ | △ | △ | △ |
| 4-016 | $Ge_5Sb_{58}Te_{37}$ | X | ○ | X | X |

TABLE 20

| | | 2x Speed | | | |
|---|---|---|---|---|---|
| Disc No. | Recording layer 404 | 2T CNR | 2T Erasure rate | 2T Storage stability | Overall evaluation |
| 4-201 | $Ge_{35}Sb_{65}$ | ○ | ○ | ◎ | ○ |
| 4-202 | $Ge_{36.9}Sb_{60}Te_{3.1}$ | ◎ | ○ | ◎ | ◎ |
| 4-203 | $Ge_{3.2}Sb_{60}Te_{36.8}$ | ○ | ○ | ○ | △ |
| 4-204 | $Ge_5Sb_{95}$ | △ | ◎ | △ | △ |
| 4-205 | $Ge_{30}Sb_{70}$ | ◎ | △ | ◎ | △ |

TABLE 20-continued

| | | 2x Speed | | | |
|---|---|---|---|---|---|
| Disc No. | Recording layer 404 | 2T CNR | 2T Erasure rate | 2T Storage stability | Overall evaluation |
| 4-206 | $Ge_{30}Sb_{65}Te_5$ | ○ | ○ | ⊚ | ○ |
| 4-207 | $Ge_{19}Sb_{62}Te_{19}$ | ⊚ | ○ | ⊚ | ⊚ |
| 4-208 | $Ge_{11}Sb_{62}Te_{27}$ | ○ | ○ | ○ | ○ |
| 4-209 | $Ge_5Sb_{75}Te_{20}$ | ○ | ⊚ | ○ | ○ |
| 4-210 | $Ge_{7.5}Sb_{90}Te_{2.5}$ | Δ | ⊚ | Δ | Δ |
| 4-211 | $Ge_{25}Sb_{75}$ | ○ | ⊚ | ⊚ | ⊚ |
| 4-212 | $Ge_{25}Sb_{65}Te_{10}$ | ⊚ | ○ | ⊚ | ⊚ |
| 4-213 | $Ge_{7.2}Sb_{65}Te_{27.8}$ | ○ | ⊚ | ○ | ○ |
| 4-214 | $Ge_{10}Sb_{90}$ | ○ | ⊚ | ○ | ○ |
| 4-215 | $Ge_{22.5}Sb_{77.5}$ | ○ | ⊚ | ⊚ | ⊚ |
| 4-216 | $Ge_{23}Sb_{70}Te_7$ | ○ | ⊚ | ⊚ | ⊚ |
| 4-217 | $Ge_{16}Sb_{68}Te_{16}$ | ⊚ | ○ | ⊚ | ⊚ |
| 4-218 | $Ge_{12}Sb_{68}Te_{20}$ | ⊚ | ○ | ⊚ | ⊚ |
| 4-219 | $Ge_{12.5}Sb_{75}Te_{12.5}$ | ○ | ⊚ | ○ | ○ |
| 4-220 | $Ge_{12}Sb_{81}Te_7$ | ○ | ⊚ | ○ | ○ |
| 4-221 | $Ge_{13}Sb_{87}$ | ○ | ⊚ | ○ | ○ |
| 4-222 | $Ge_{20.9}Sb_{70}Te_{9.1}$ | ⊚ | ○ | ⊚ | ⊚ |
| 4-223 | $Ge_{11.8}Sb_{70}Te_{18.2}$ | ⊚ | ○ | ⊚ | ⊚ |
| 4-224 | $Ge_{14.5}Sb_{85.5}$ | ○ | ⊚ | ⊚ | ⊚ |
| 4-225 | $Ge_{20}Sb_{80}$ | ⊚ | ⊚ | ⊚ | ⊚ |
| 4-226 | $Ge_{18}Sb_{82}$ | ⊚ | ⊚ | ⊚ | ⊚ |
| 4-227 | $Ge_{20}Sb_{75}Te_5$ | ⊚ | ⊚ | ⊚ | ⊚ |
| 4-228 | $Ge_{15}Sb_{70}Te_{15}$ | ⊚ | ○ | ⊚ | ⊚ |
| 4-229 | $Ge_{14}Sb_{79}Te_7$ | ⊚ | ⊚ | ⊚ | ⊚ |
| 4-230 | $Ge_{17}Sb_{78}Te_5$ | ⊚ | ⊚ | ⊚ | ⊚ |
| 4-004 | $Ge_{35.3}Sb_{11.8}Te_{52.9}$ | Δ | ○ | X | X |
| 4-005 | $Ge_{38.1}Sb_{9.5}Te_{52.4}$ | ○ | Δ | Δ | Δ |
| 4-006 | $Ge_{38.1}Bi_{9.5}Te_{52.4}$ | ○ | ○ | X | X |
| 4-014 | $Ge_{30}Sb_{55}Te_{15}$ | ○ | X | ○ | X |
| 4-015 | $Ge_{20}Sb_{57}Te_{23}$ | Δ | Δ | Δ | Δ |
| 4-016 | $Ge_5Sb_{58}Te_{37}$ | X | ○ | X | X |

As shown in Tables 17 to 20, with respect to all the properties obtained at 4× and 2× speed recording, considerably improved results were obtained in all the information recording media 4 (Disc Nos. 4-201 to 4-230) of this example as compared to the conventional examples 4-004 to 4-006 and 4-014 to 4-016. Furthermore, like Example 1, in the case of the compositions within the composition range (I) shown in FIG. 12, any one property selected from the modulation degree of a 9T mark, the erasure rate of the 9T mark, and the storage stability of the 9T mark, the CNR of a 2T mark, the erasure rate of the 2T mark and the storage stability of the 2T mark was evaluated as Δ at 4× speed recording. Thus there were properties that were slightly unsatisfactory for the information recording media. However, in the case of the compositions within the composition range (II), no properties were evaluated as Δ and thus the composition range (II) was proved to be more suitable for 4× speed recording. Furthermore, in the case of the compositions within the composition range (III), two of the properties evaluated as ⊚ were included and thus the composition range (III) was proved to be more suitable for 4× speed recording as compared to the composition range (II).

Example 7

In this example, an example is described in which an element M (where M is at least one element selected from N, Bi, C, Si, Sn, Ga, In, Zn, Cu, Ag, Au, Ni, Pd, Pt, Co, Rh, Ru, Mn, Cr, Mo, W, V, Nb, Ta, Ti, Zr, Hf, Y, La, Ce, Pr, Nd, Gd, Tb, and Dy) further was added to $Ge_{16}Sb_{79}Te_5$ used for the recording layer 404 of the second information layer 42 of the information recording medium 4 described in Example 6. The method for manufacturing the information recording medium 4 of this example is the same as that used in Example 6. The thickness of the recording layer 404 is 6 nm.

In examples of the information recording medium 4 of this example, the recording layers 404 were used that contained C, Si, Sn, Bi, In, Mn, Zn, Ag, Au, Pd, Cr, W, Ta, Zr, and Tb added thereto, respectively, with the amount of each element being 7 atom %. These discs were numbered as 4-301 to 4-315, respectively. Furthermore, with respect to those containing Mn, Zn, and Tb, those further containing 15 atom % of Mn, Zn, and Tb added thereto, respectively, were produced and these discs were numbered as 4-316 to 4-318, respectively. Moreover, those further containing 20 atom % of Mn, Zn, and Tb added thereto, respectively, were produced and these discs were numbered as 4-319 to 4-321, respectively. In order to be compared with these information recording media 4, those containing Ca and Ir in an amount of 15 atom %, respectively, (Disc Nos. 4-007 and 4-008) were produced as information recording media of conventional examples (comparative examples).

With respect to the information recording media 4 produced as described above and conventional information recording media, as in Example 6, the respective second information layers 42 were subjected to recording and reproduction operations and thereby they were evaluated for the modulation degree of a 9T mark, the erasure rate of the 9T mark, the storage stability of the 9T mark, the CNR of a 2T mark, the erasure rate of the 2T mark, and the storage stability of the 2T mark at 4× speed recording.

Table 21 shows the evaluation results of the modulation degree of a 9T mark, the erasure rate of the 9T mark, and the storage stability of the 9T mark at 4× speed recording. Table 22 shows the evaluation results of the CNR of a 2T mark, the erasure rate of the 2T mark, and the storage stability of the 2T mark at 4× speed recording.

TABLE 21

| | | | 4x Speed | | |
|---|---|---|---|---|---|
| Disc No. | Additive element | Additive amount (atom %) | 9T Modulation degree | 9T Erasure rate | 9T Storage stability |
| 4-301 | C | 7 | ⊚ | ○ | ⊚ |
| 4-302 | Si | 7 | ⊚ | ○ | ⊚ |
| 4-303 | Sn | 7 | ○ | ⊚ | ⊚ |
| 4-304 | Bi | 7 | ○ | ⊚ | ⊚ |
| 4-305 | In | 7 | ⊚ | ○ | ⊚ |
| 4-306 | Mn | 7 | ⊚ | ○ | ⊚ |
| 4-307 | Zn | 7 | ○ | ○ | ⊚ |
| 4-308 | Ag | 7 | ○ | ○ | ⊚ |
| 4-309 | Au | 7 | ○ | ⊚ | ○ |
| 4-310 | Pd | 7 | ○ | ○ | ⊚ |
| 4-311 | Cr | 7 | ○ | ○ | ⊚ |
| 4-312 | W | 7 | ○ | ○ | ⊚ |
| 4-313 | Ta | 7 | ○ | ○ | ⊚ |
| 4-314 | Zr | 7 | ○ | ○ | ⊚ |
| 4-315 | Tb | 7 | ○ | ○ | ⊚ |
| 4-316 | Mn | 15 | ⊚ | ○ | ⊚ |
| 4-317 | Zn | 15 | ○ | ○ | ⊚ |
| 4-318 | Tb | 15 | ○ | ○ | ⊚ |
| 4-319 | Mn | 20 | ○ | ○ | ⊚ |
| 4-320 | Zn | 20 | ○ | Δ | ⊚ |
| 4-321 | Tb | 20 | ○ | Δ | ⊚ |
| 4-007 | Ca | 15 | Δ | Δ | ○ |
| 4-008 | Ir | 15 | ○ | X | ⊚ |

TABLE 22

| Disc No. | Additive element | Additive amount (atom %) | 4x Speed | | |
|---|---|---|---|---|---|
| | | | 2T CNR | 2T Erasure rate | 2T Storage stability |
| 4-301 | C | 7 | ⊚ | ○ | ⊚ |
| 4-302 | Si | 7 | ⊚ | ○ | ⊚ |
| 4-303 | Sn | 7 | ○ | ⊚ | ⊚ |
| 4-304 | Bi | 7 | ○ | ⊚ | ⊚ |
| 4-305 | In | 7 | ⊚ | ○ | ⊚ |
| 4-306 | Mn | 7 | ⊚ | ○ | ⊚ |
| 4-307 | Zn | 7 | ○ | ○ | ⊚ |
| 4-308 | Ag | 7 | ○ | ○ | ⊚ |
| 4-309 | Au | 7 | ○ | ⊚ | ○ |
| 4-310 | Pd | 7 | ○ | ○ | ⊚ |
| 4-311 | Cr | 7 | ○ | ○ | ⊚ |
| 4-312 | W | 7 | ○ | ○ | ⊚ |
| 4-313 | Ta | 7 | ○ | ○ | ⊚ |
| 4-314 | Zr | 7 | ○ | ○ | ⊚ |
| 4-315 | Tb | 7 | ○ | ○ | ⊚ |
| 4-316 | Mn | 15 | ⊚ | ○ | ⊚ |
| 4-317 | Zn | 15 | ○ | ○ | ⊚ |
| 4-318 | Tb | 15 | ○ | ○ | ⊚ |
| 4-319 | Mn | 20 | ○ | ○ | ⊚ |
| 4-320 | Zn | 20 | ○ | △ | ⊚ |
| 4-321 | Tb | 20 | ○ | △ | ⊚ |
| 4-007 | Ca | 15 | △ | △ | ○ |
| 4-008 | Ir | 15 | ○ | × | ⊚ |

As shown in Tables 21 and 22, similarly in all the information recording media 4 (Disc Nos. 4-301 to 4-321) of this example, better properties were obtained as compared to Comparative Examples 4-007 and 4-008. Furthermore, it was proved that C, Si, Sn, Bi, In, and Mn were more preferable as additive elements, and with respect to every element M, the amount thereof to be added was more preferably 15 atom % or less.

Moreover, the evaluation also was carried out at 2× speed recording in the same manner. As in the case of 4× speed recording, better properties were obtained as compared to the comparative examples.

Example 8

In this example, an example of the information recording media 4 described in Example 6 is described in which $Ge_{16}Sb_{79}Te_5$ was used for the recording layer 404 of the second information layer 42 and some dielectric materials were used for the first interface layer 405 and the second dielectric layer 403. The method for manufacturing the information recording media 4 of this example is the same as that used in Example 6.

In examples of the information recording media 4 of this example, the following compositions were used for the first interface layer 405 and the second dielectric layer 403 that were disposed adjacent to the recording layer: [the first interface layer 405, the second dielectric layer 403]=[$(ZrO_2)_{50}(Cr_2O_3)_{50}$, $(ZrO_2)_{50}(Cr_2O_3)_{50}$], [$(ZrO_2)_{50}(Cr_2O_3)_{50}$, $(HfO_2)_{50}(Cr_2O_3)_{50}$], [$(ZrO_2)_{50}(Cr_2O_3)_{50}$, $(ZrO_2)_{50}(TiO_2)_{50}$], [$(ZrO_2)_{50}(Cr_2O_3)_{50}$, $(ZrO_2)_{50}(Nb_2O_5)_{50}$], [$(ZrO_2)_{50}(Cr_2O_3)_{50}$, $(ZrO_2)_{50}(Dy_2O_3)_{50}$], [$(ZrO_2)_{50}(Cr_2O_3)_{50}$, $(ZrO_2)_{65}(In_2O_3)_{35}$], [$(ZrO_2)_{50}(Cr_2O_3)_{50}$, $(ZrO_2)_{65}(Ga_2O_3)_{35}$], [$(ZrO_2)_{50}(Cr_2O_3)_{50}$, $(ZrO_2)_{65}(Al_2O_3)_{35}$], [$(ZrO_2)_{50}(Cr_2O_3)_{50}$, $(ZrO_2)_{35}(SiO_2)_{15}(Cr_2O_3)_{50}$], [$(ZrO_2)_{50}(Cr_2O_3)_{50}$, $(ZrO_2)_{50}(SiO_2)_{50}(In_2O_3)_{35}$], [$(ZrO_2)_{50}(Cr_2O_3)_{50}$, $(ZrO_2)_{50}(SiO_2)_{50}(Ga_2O_3)_{35}$], [$(ZrO_2)_{50}(Cr_2O_3)_{50}$, $(ZrO_2)_{30}(SiO_2)_{10}(In_2O_3)_{20}(Cr_2O_3)_{40}$], [$(ZrO_2)_{35}(SiO_2)_{15}(Cr_2O_3)_{50}$, $(ZrO_2)_{50}(Cr_2O_3)_{50}$], [$(ZrO_2)_{35}(SiO_2)_{15}(Cr_2O_3)_{50}$, $(ZrO_2)_{50}(TiO_2)_{50}$], [$(ZrO_2)_{35}(SiO_2)_{15}(Cr_2O_3)_{50}$, $(ZrO_2)_{50}(Dy_2O_3)_{50}$], [$(ZrO_2)_{35}(SiO_2)_{15}(Cr_2O_3)_{50}$, $(ZrO_2)_{35}(SiO_2)_{15}(Cr_2O_3)_{50}$], [$(ZrO_2)_{35}(SiO_2)_{15}(Cr_2O_3)_{50}$, $(ZrO_2)_{30}(SiO_2)_{10}(In_2O_3)_{20}(Cr_2O_3)_{40}$], [$(ZrO_2)_{45}(Y_2O_3)_5(Cr_2O_3)_{50}$, $(ZrO_2)_{50}(Cr_2O_3)_{50}$], [$(ZrO_2)_{45}(Y_2O_3)_5(Cr_2O_3)_{50}$, $(ZrO_2)_{50}(TiO_2)_{50}$], [$(ZrO_2)_{45}(Y_2O_3)_5(Cr_2O_3)_{50}$, $(ZrO_2)_{50}(Dy_2O_3)_{50}$], [$(ZrO_2)_{45}(Y_2O_3)_5(Cr_2O_3)_{50}$, $(ZrO_2)_{35}(SiO_2)_{15}(Cr_2O_3)_{50}$], [$(ZrO_2)_{45}(Y_2O_3)_5(Cr_2O_3)_{50}$, $(ZrO_2)_{30}(SiO_2)_{10}(In_2O_3)_{20}(Cr_2O_3)_{40}$], [$(ZrO_2)_{50}(Cr_2O_3)_{50}$, $(ZnS)_{50}(SiO_2)_{20}$], [$(ZnS)_{80}(SiO_2)_{20}$, $(ZrO_2)_{50}(Cr_2O_3)_{50}$], and [$(ZnS)_{80}(SiO_2)_{20}$, $(ZnS)_{80}(SiO_2)_{20}$]. These discs were numbered as 4-401 to 4-425, respectively. These information recording media 4 were compared with conventional examples 4-004 to 4-006.

With respect to the information recording media 4 produced as described above and conventional information recording media, as in Example 6, the respective second information layers 42 were subjected to recording and reproduction operations and thereby they were evaluated for the modulation degree of a 9T mark, the erasure rate of the 9T mark, the storage stability of the 9T mark, the CNR of a 2T mark, the erasure rate of the 2T mark, and the storage stability of the 2T mark at 4× speed recording.

Table 23 shows the evaluation results of the modulation degree of a 9T mark, the erasure rate of the 9T mark, and the storage stability of the 9T mark at 4× speed recording. Table 24 shows the evaluation results of the CNR of a 2T mark, the erasure rate of the 2T mark, and the storage stability of the 2T mark at 4× speed recording.

TABLE 23

| Disc No. | First interface layer 405 | Recording layer 404 | Second dielectric layer 403 | 4x Speed | | |
|---|---|---|---|---|---|---|
| | | | | 9T Modulation degree | 9T Erasure rate | 9T Storage stability |
| 4-401 | $(ZrO_2)_{50}(Cr_2O_3)_{50}$ | $Ge_{16}Sb_{79}Te_5$ | $(ZrO_2)_{50}(Cr_2O_3)_{50}$ | ⊚ | ○ | ⊚ |
| 4-402 | $(ZrO_2)_{50}(Cr_2O_3)_{50}$ | $Ge_{16}Sb_{79}Te_5$ | $(HfO_2)_{50}(Cr_2O_3)_{50}$ | ⊚ | ○ | ⊚ |
| 4-403 | $(ZrO_2)_{50}(Cr_2O_3)_{50}$ | $Ge_{16}Sb_{79}Te_5$ | $(ZrO_2)_{50}(TiO_2)_{50}$ | ⊚ | ○ | ⊚ |
| 4-404 | $(ZrO_2)_{50}(Cr_2O_3)_{50}$ | $Ge_{16}Sb_{79}Te_5$ | $(ZrO_2)_{50}(Nb_2O_5)_{50}$ | ⊚ | ○ | ⊚ |
| 4-405 | $(ZrO_2)_{50}(Cr_2O_3)_{50}$ | $Ge_{16}Sb_{79}Te_5$ | $(ZrO_2)_{50}(Dy_2O_3)_{50}$ | ⊚ | ○ | ⊚ |
| 4-406 | $(ZrO_2)_{50}(Cr_2O_3)_{50}$ | $Ge_{16}Sb_{79}Te_5$ | $(ZrO_2)_{65}(In_2O_3)_{35}$ | ⊚ | ○ | ⊚ |
| 4-407 | $(ZrO_2)_{50}(Cr_2O_3)_{50}$ | $Ge_{16}Sb_{79}Te_5$ | $(ZrO_2)_{65}(Ga_2O_3)_{35}$ | ⊚ | ○ | ⊚ |
| 4-408 | $(ZrO_2)_{50}(Cr_2O_3)_{50}$ | $Ge_{16}Sb_{79}Te_5$ | $(ZrO_2)_{65}(Al_2O_3)_{35}$ | ⊚ | ○ | ⊚ |
| 4-409 | $(ZrO_2)_{50}(Cr_2O_3)_{50}$ | $Ge_{16}Sb_{79}Te_5$ | $(ZrO_2)_{35}(SiO_2)_{15}(Cr_2O_3)_{50}$ | ⊚ | ○ | ⊚ |
| 4-410 | $(ZrO_2)_{50}(Cr_2O_3)_{50}$ | $Ge_{16}Sb_{79}Te_5$ | $(ZrO_2)_{50}(SiO_2)_{15}(In_2O_3)_{35}$ | ⊚ | ○ | ⊚ |
| 4-411 | $(ZrO_2)_{50}(Cr_2O_3)_{50}$ | $Ge_{16}Sb_{79}Te_5$ | $(ZrO_2)_{50}(SiO_2)_{15}(Ga_2O_3)_{35}$ | ⊚ | ○ | ⊚ |
| 4-412 | $(ZrO_2)_{50}(Cr_2O_3)_{50}$ | $Ge_{16}Sb_{79}Te_5$ | $(ZrO_2)_{30}(SiO_2)_{10}(In_2O_3)_{20}(Cr_2O_3)_{40}$ | ⊚ | ○ | ⊚ |
| 4-413 | $(ZrO_2)_{35}(SiO_2)_{15}(Cr_2O_3)_{50}$ | $Ge_{16}Sb_{79}Te_5$ | $(ZrO_2)_{50}(Cr_2O_3)_{50}$ | ⊚ | ○ | ⊚ |
| 4-414 | $(ZrO_2)_{35}(SiO_2)_{15}(Cr_2O_3)_{50}$ | $Ge_{16}Sb_{79}Te_5$ | $(ZrO_2)_{50}(TiO_2)_{50}$ | ⊚ | ○ | ⊚ |

TABLE 23-continued

| | | | | 4x Speed | | |
|---|---|---|---|---|---|---|
| Disc No. | First interface layer 405 | Recording layer 404 | Second dielectric layer 403 | 9T Modulation degree | 9T Erasure rate | 9T Storage stability |
| 4-415 | $(ZrO_2)_{35}(SiO_2)_{15}(Cr_2O_3)_{50}$ | $Ge_{16}Sb_{79}Te_5$ | $(ZrO_2)_{50}(Dy_2O_3)_{50}$ | ◉ | ○ | ◉ |
| 4-416 | $(ZrO_2)_{35}(SiO_2)_{15}(Cr_2O_3)_{50}$ | $Ge_{16}Sb_{79}Te_5$ | $(ZrO_2)_{35}(SiO_2)_{15}(Cr_2O_3)_{50}$ | ◉ | ○ | ◉ |
| 4-417 | $(ZrO_2)_{35}(SiO_2)_{15}(Cr_2O_3)_{50}$ | $Ge_{16}Sb_{79}Te_5$ | $(ZrO_2)_{30}(SiO_2)_{10}(In_2O_3)_{20}(Cr_2O_3)_{40}$ | ◉ | ○ | ◉ |
| 4-418 | $(ZrO_2)_{45}(Y_2O_3)_5(Cr_2O_3)_{50}$ | $Ge_{16}Sb_{79}Te_5$ | $(ZrO_2)_{50}(Cr_2O_3)_{50}$ | ◉ | ○ | ◉ |
| 4-419 | $(ZrO2)_{45}(Y_2O_3)_5(Cr_2O_3)_{50}$ | $Ge_{16}Sb_{79}Te_5$ | $(ZrO_2)_{50}(TiO_2)_{50}$ | ◉ | ○ | ◉ |
| 4-420 | $(ZrO_2)_{45}(Y_2O_3)_5(Cr_2O_3)_{50}$ | $Ge_{16}Sb_{79}Te_5$ | $(ZrO_2)_{50}(Dy_2O_3)_{50}$ | ◉ | ○ | ◉ |
| 4-421 | $(ZrO_2)_{45}(Y_2O_3)_5(Cr_2O_3)_{50}$ | $Ge_{16}Sb_{79}Te_5$ | $(ZrO_2)_{35}(SiO_2)_{15}(Cr_2O_3)_{50}$ | ◉ | ○ | ◉ |
| 4-422 | $(ZrO2)_{45}(Y_2O_3)_5(Cr_2O_3)_{50}$ | $Ge_{16}Sb_{79}Te_5$ | $(ZrO_2)_{30}(SiO_2)_{10}(In_2O_3)_{20}(Cr_2O_3)_{40}$ | ◉ | ○ | ◉ |
| 4-423 | $(ZnS)_{80}(SiO_2)_{20}$ | $Ge_{16}Sb_{79}Te_5$ | $(ZrO_2)_{50}(Cr_2O_3)_{50}$ | ◉ | ○ | ◉ |
| 4-424 | $(ZrO_2)_{50}(Cr_2O_3)_{50}$ | $Ge_{16}Sb_{79}Te_5$ | $(ZnS)_{80}(SiO_2)_{20}$ | ◉ | ○ | ◉ |
| 4-425 | $(ZnS)_{80}(SiO_2)_{20}$ | $Ge_{16}Sb_{79}Te_5$ | $(ZnS)_{80}(SiO_2)_{20}$ | Δ | Δ | Δ |
| 4-004 | $(ZrO_2)_{35}(SiO_2)_{15}(Cr_2O_3)_{50}$ | $Ge_{35.3}Sb_{11.8}Te_{52.9}$ | $(ZrO_2)_{35}(SiO_2)_{15}(Cr_2O_3)_{50}$ | X | X | Δ |
| 4-005 | $(ZrO_2)_{35}(SiO_2)_{15}(Cr_2O_3)_{50}$ | $Ge_{38.1}Sb_{9.5}Te_{52.4}$ | $(ZrO_2)_{35}(SiO_2)_{15}(Cr_2O_3)_{50}$ | Δ | Δ | X |
| 4-006 | $(ZrO_2)_{35}(SiO_2)_{15}(Cr_2O_3)_{50}$ | $Ge_{38.1}Bi_{9.5}Te_{52.4}$ | $(ZrO_2)_{35}(SiO_2)_{15}(Cr_2O_3)_{50}$ | Δ | Δ | X |

TABLE 24

| | | | | 4x Speed | | |
|---|---|---|---|---|---|---|
| Disc No. | First interface layer 405 | Recording layer 404 | Second dielectric layer 403 | 2T CNR | 2T Erasure rate | 2T Storage stability |
| 4-401 | $(ZrO_2)_{50}(Cr_2O_3)_{50}$ | $Ge_{16}Sb_{79}Te_5$ | $(ZrO_2)_{50}(Cr_2O_3)_{50}$ | ○ | ◉ | ◉ |
| 4-402 | $(ZrO_2)_{50}(Cr_2O_3)_{50}$ | $Ge_{16}Sb_{79}Te_5$ | $(HfO_2)_{50}(Cr_2O_3)_{50}$ | ○ | ◉ | ◉ |
| 4-403 | $(ZrO_2)_{50}(Cr_2O_3)_{50}$ | $Ge_{16}Sb_{79}Te_5$ | $(ZrO_2)_{50}(TiO_2)_{50}$ | ○ | ◉ | ◉ |
| 4-404 | $(ZrO_2)_{50}(Cr_2O_3)_{50}$ | $Ge_{16}Sb_{79}Te_5$ | $(ZrO_2)_{50}(Nb_2O_5)_{50}$ | ○ | ◉ | ◉ |
| 4-405 | $(ZrO_2)_{50}(Cr_2O_3)_{50}$ | $Ge_{16}Sb_{79}Te_5$ | $(ZrO_2)_{50}(Dy_2O_3)_{50}$ | ○ | ◉ | ◉ |
| 4-406 | $(ZrO_2)_{50}(Cr_2O_3)_{50}$ | $Ge_{16}Sb_{79}Te_5$ | $(ZrO_2)_{65}(In_2O_3)_{35}$ | ◉ | ○ | ◉ |
| 4-407 | $(ZrO_2)_{50}(Cr_2O_3)_{50}$ | $Ge_{16}Sb_{79}Te_5$ | $(ZrO_2)_{65}(Ga_2O_3)_{35}$ | ◉ | ○ | ◉ |
| 4-408 | $(ZrO_2)_{50}(Cr_2O_3)_{50}$ | $Ge_{16}Sb_{79}Te_5$ | $(ZrO_2)_{65}(Al_2O_3)_{35}$ | ◉ | ○ | ◉ |
| 4-409 | $(ZrO_2)_{50}(Cr_2O_3)_{50}$ | $Ge_{16}Sb_{79}Te_5$ | $(ZrO_2)_{35}(SiO_2)_{15}(Cr_2O_3)_{50}$ | ○ | ◉ | ◉ |
| 4-410 | $(ZrO_2)_{50}(Cr_2O_3)_{50}$ | $Ge_{16}Sb_{79}Te_5$ | $(ZrO_2)_{50}(SiO_2)_{15}(In_2O_3)_{35}$ | ◉ | ○ | ◉ |
| 4-411 | $(ZrO_2)_{50}(Cr_2O_3)_{50}$ | $Ge_{16}Sb_{79}Te_5$ | $(ZrO_2)_{50}(SiO_2)_{15}(Ga_2O_3)_{35}$ | ◉ | ○ | ◉ |
| 4-412 | $(ZrO_2)_{50}(Cr_2O_3)_{50}$ | $Ge_{16}Sb_{79}Te_5$ | $(ZrO_2)_{30}(SiO_2)_{10}(In_2O_3)_{20}(Cr_2O_3)_{40}$ | ○ | ◉ | ◉ |
| 4-413 | $(ZrO_2)_{35}(SiO_2)_{15}(Cr_2O_3)_{50}$ | $Ge_{16}Sb_{79}Te_5$ | $(ZrO_2)_{50}(Cr_2O_3)_{50}$ | ○ | ◉ | ◉ |
| 4-414 | $(ZrO_2)_{35}(SiO_2)_{15}(Cr_2O_3)_{50}$ | $Ge_{16}Sb_{79}Te_5$ | $(ZrO_2)_{50}(TiO_2)_{50}$ | ○ | ◉ | ◉ |
| 4-415 | $(ZrO_2)_{35}(SiO_2)_{15}(Cr_2O_3)_{50}$ | $Ge_{16}Sb_{79}Te_5$ | $(ZrO_2)_{50}(Dy_2O_3)_{50}$ | ○ | ◉ | ◉ |
| 4-416 | $(ZrO_2)_{35}(SiO_2)_{15}(Cr_2O_3)_{50}$ | $Ge_{16}Sb_{79}Te_5$ | $(ZrO_2)_{35}(SiO_2)_{15}(Cr_2O_3)_{50}$ | ○ | ◉ | ◉ |
| 4-417 | $(ZrO_2)_{35}(SiO_2)_{15}(Cr_2O_3)_{50}$ | $Ge_{16}Sb_{79}Te_5$ | $(ZrO_2)_{30}(SiO_2)_{10}(In_2O_3)_{20}(Cr_2O_3)_{40}$ | ◉ | ○ | ◉ |
| 4-418 | $(ZrO_2)_{45}(Y_2O_3)_5(Cr_2O_3)_{50}$ | $Ge_{16}Sb_{79}Te_5$ | $(ZrO_2)_{50}(Cr_2O_3)_{50}$ | ○ | ◉ | ◉ |
| 4-419 | $(ZrO2)_{45}(Y_2O_3)_5(Cr_2O_3)_{50}$ | $Ge_{16}Sb_{79}Te_5$ | $(ZrO_2)_{50}(TiO_2)_{50}$ | ○ | ◉ | ◉ |
| 4-420 | $(ZrO_2)_{45}(Y_2O_3)_5(Cr_2O_3)_{50}$ | $Ge_{16}Sb_{79}Te_5$ | $(ZrO_2)_{50}(Dy_2O_3)_{50}$ | ○ | ◉ | ◉ |
| 4-421 | $(ZrO_2)_{45}(Y_2O_3)_5(Cr_2O_3)_{50}$ | $Ge_{16}Sb_{79}Te_5$ | $(ZrO_2)_{35}(SiO_2)_{15}(Cr_2O_3)_{50}$ | ○ | ◉ | ◉ |
| 4-422 | $(ZrO2)_{45}(Y_2O_3)_5(Cr_2O_3)_{50}$ | $Ge_{16}Sb_{79}Te_5$ | $(ZrO_2)_{30}(SiO_2)_{10}(In_2O_3)_{20}(Cr_2O_3)_{40}$ | ◉ | ○ | ◉ |
| 4-423 | $(ZnS)_{80}(SiO_2)_{20}$ | $Ge_{16}Sb_{79}Te_5$ | $(ZrO_2)_{50}(Cr_2O_3)_{50}$ | ○ | ○ | ◉ |
| 4-424 | $(ZrO_2)_{50}(Cr_2O_3)_{50}$ | $Ge_{16}Sb_{79}Te_5$ | $(ZnS)_{80}(SiO_2)_{20}$ | ○ | Δ | ◉ |
| 4-425 | $(ZnS)_{80}(SiO_2)_{20}$ | $Ge_{16}Sb_{79}Te_5$ | $(ZnS)_{80}(SiO_2)_{20}$ | ○ | Δ | ◉ |
| 4-004 | $(ZrO_2)_{35}(SiO_2)_{15}(Cr_2O_3)_{50}$ | $Ge_{35.3}Sb_{11.8}Te_{52.9}$ | $(ZrO_2)_{35}(SiO_2)_{15}(Cr_2O_3)_{50}$ | Δ | X | Δ |
| 4-005 | $(ZrO_2)_{35}(SiO_2)_{15}(Cr_2O_3)_{50}$ | $Ge_{38.1}Sb_{9.5}Te_{52.4}$ | $(ZrO_2)_{35}(SiO_2)_{15}(Cr_2O_3)_{50}$ | X | X | Δ |
| 4-006 | $(ZrO_2)_{35}(SiO_2)_{15}(Cr_2O_3)_{50}$ | $Ge_{38.1}Bi_{9.5}Te_{52.4}$ | $(ZrO_2)_{35}(SiO_2)_{15}(Cr_2O_3)_{50}$ | Δ | Δ | X |

As shown in Tables 23 and 24, in all the information recording media 4 (Disc Nos. 4-401 to 4-425) of this example, considerably improved results were obtained as compared to the conventional examples 4-004 to 4-006. Furthermore, it was proved that the properties of Disc Nos. 4-401 to 4-422 were better than those of Disc Nos. 4-423 to 4-425, and the first interface layer 405 and the second dielectric layer 403 each were composed of more preferably an oxide of at least one selected from Si, Zr, Hf, Cr, In, Ga, Al, Ti, Nb, Y, and Dy.

Example 9

An example of the information recording medium 5 shown in FIG. 6 is described in this example.

A method for manufacturing the information recording medium of this example is described below.

First, a polycarbonate substrate with a guide groove (with a depth of 40 nm and a track pitch of 0.62 μm) formed therein was prepared as the substrate 53. A $(ZnS)_{80}(SiO_2)_{20}$ (mol %) film to serve as the first dielectric layer 17, a 5-nm $(ZrO_2)_{35}(SiO_2)_{15}(Cr_2O_3)_{50}$ (mol %) film to serve as the first interface layer 16, a 10-nm recording layer 15, a 5-nm $(ZrO_2)_{35}(SiO_2)_{15}(Cr_2O_3)_{50}$ (mol %) film to serve as the second interface layer 14, a 20-nm $TiO_2$ film to serve as the second dielectric layer 13, and a 120-nm Ag—Pd—Cu film to serve as the reflective layer 12 were formed sequentially on the substrate by the sputtering method. Thereafter, an ultraviolet curable resin was applied onto the dummy substrate 51, and the reflective layer 12 of the substrate 53 was allowed to adhere to the dummy substrate 51, which was rotated. Thus a uniform resin layer (with a thickness of 20 μm) was formed. After that, the resin was irradiated with ultraviolet rays to be cured. Thus the substrate 53 and the dummy substrate 51 were bonded to each other, with the adhesive layer 52 being interposed therebetween. Finally, an initialization process was carried out for crystallizing the whole surface of the recording layer 15 with a laser beam.

The thickness of the first dielectric layer 17 was determined by the calculation based on the matrix method. Specifically, it was determined so that when a laser beam with a wavelength of 660 nm was incident, the reflectance of the information recording medium with the recording layer 15 being in a crystalline state (the mirror surface area of the substrate) was 13% to 20% and the reflectance of the information recording medium with the recording layer 15 being in an amorphous state (the mirror surface area of the substrate) was 0.5% to 4%.

The information recording media 5 produced as described above and conventional information recording media were evaluated for the modulation degree of a 11T mark, the erasure rate of the 11T mark, the storage stability of the 11T mark, the CNR of a 3T mark, the erasure rate of the 3T mark, and the storage stability of the 3T mark at 8× speed recording. The evaluation method is described below in detail.

All the evaluations were made using the recording and reproducing apparatus 9 shown in FIG. 7. The wavelength of the laser beam was 660 nm, the numerical aperture NA of the objective lens was 0.65, the linear velocity at 1× speed was 4.1 m/s, and the shortest mark length (3T) was 0.42 μm. Information was recorded in the groove and land. Reproduction was carried out at 8.2 m/s at 2× speed and at 1.0 mW in all the evaluations. Furthermore, the accelerated test was carried out in a thermostatic bath for 50 hours at 80° C. and 20% RH.

The modulation degree of the 11T mark was evaluated by capturing reproduced signals with an oscilloscope, reading the difference between a crystal (unrecorded) level and an amorphous (recorded) level, which is followed by calculation. With respect to the modulation degrees, ⊚ indicates at least 50%, ○ at least 45%, Δ at least 40%, and x lower than 40%.

The erasure rate of the 11T mark denotes the degree of erasure of the 11T mark obtained when a 11T mark is recorded ten times and a 3T mark is recorded once thereon. The evaluation was made using a spectrum analyzer. With respect to the erasure rate, ⊚ indicates at least 30 dB, ○ at least 25 dB, Δ at least 20 dB, and x lower than 20 dB.

The storage stability of the 11T mark denotes the degree of degradation of the 11T mark recorded ten times in the accelerated test. The evaluation was made by using the spectrum analyzer and measuring the difference in CNR obtained before and after the accelerated test. With respect to the amount of reduction in CNR(CNR before acceleration−CNR after acceleration), ⊚ indicates 0.0 dB or lower, ○ 1.0 dB or lower, Δ 3.0 dB or lower, and x higher than 3.0 dB.

The CNR of the 3T mark was evaluated using the spectrum analyzer. With respect to the CNR, ⊚ indicates at least 50 dB, ○ at least 47 dB, Δ at least 44 dB, and x lower than 44 dB.

The erasure rate of the 3T mark denotes the degree of erasure of the 3T mark obtained when a 3T mark is recorded ten times and a 11T mark is recorded once thereon. The evaluation was made using the spectrum analyzer. With respect to the erasure rate, ⊚ indicates at least 30 dB, ○ at least 25 dB, Δ at least 20 dB, and x lower than 20 dB.

The storage stability of the 3T mark denotes the degree of degradation of the 3T mark recorded ten times in the accelerated test. The evaluation was made by using the spectrum analyzer and measuring the difference in CNR obtained before and after the accelerated test. With respect to the amount of reduction in CNR(CNR before acceleration−CNR after acceleration), ⊚ indicates 0.0 dB or lower, ○ 1.0 dB or lower, Δ 3.0 dB or lower, and x higher than 3.0 dB.

In examples of the information recording medium 5 of this example, the respective recording layers 15 used herein were those having the following compositions, which were expressed in terms of a coordinate (Ge, Sb, Te)=(x, y, z) on the triangular coordinate shown in FIG. 1: (x, y, z)=(x, y, z)=a (35, 65, 0), b (36.9, 60, 3.1), c (3.2, 60, 36.8), d (5, 95, 0), ① (30, 70, 0), ② (30, 65, 5), ③ (19, 62, 19), ④ (11, 62, 27), ⑤ (5, 75, 20), ⑥ (7.5, 90, 2.5), e (25, 75, 0), f (25, 65, 10), g (7.2, 65, 27.8), h (10, 90, 0), ⑦ (22.5, 77.5, 0), ⑧ (23, 70, 7), ⑨ (16, 68, 16), ⑩ (12, 68, 20), ⑪ (12.5, 75, 12.5), ⑫ (12, 81, 7), ⑬ (13, 87, 0), j (20.9, 70, 9.1), k (11.8, 70, 18.2), m (14.5, 85.5, 0), n (20, 80, 0), ⑭ (18, 82, 0), ⑮ (20, 75, 5), ⑯ (15, 70, 15), ⑰ (14, 79, 7), and ⑱ (17, 78, 5). These discs were numbered as 5-101 to 5-130, respectively.

Furthermore, in order to make a comparison with conventional recording layers, the following information recording media with the structure described above were produced: information recording media (Disc Nos. 5-001 to 5-003) in which $Ge_{35.3}Sb_{11.8}Te_{52.9}$, $Ge_{38.1}Sb_{9.5}Te_{52.4}$, and $Ge_{38.1}Bi_{9.5}Te_{52.4}$ were used for the recording layers 15, respectively. They then were evaluated in the same manner.

In the evaluations in this example, the same results were obtained at groove recording and land recording. Therefore, these evaluation results are indicated together in one table. Table 25 shows the evaluation results of the modulation degree of an 11T mark, the erasure rate of the 11T mark, and the storage stability of the 11T mark at 8× speed recording. Table 26 shows the evaluation results of the CNR of a 3T mark, the erasure rate of the 3T mark, and the storage stability of the 3T mark at 8× speed recording.

TABLE 25

| | | 8×-Speed (groove and land) | | |
| --- | --- | --- | --- | --- |
| Disc No. | Recording layer 15 | 11T Modulation degree | 11T Erasure rate | 11T Storage stability |
| 5-101 | $Ge_{35}Sb_{65}$ | ○ | Δ | ⊚ |
| 5-102 | $Ge_{36.9}Sb_{60}Te_{3.1}$ | ○ | Δ | ⊚ |
| 5-103 | $Ge_{3.2}Sb_{60}Te_{36.8}$ | ○ | Δ | ○ |
| 5-104 | $Ge_5Sb_{95}$ | Δ | ⊚ | Δ |
| 5-105 | $Ge_{30}Sb_{70}$ | ⊚ | Δ | ⊚ |
| 5-106 | $Ge_{30}Sb_{65}Te_5$ | ○ | Δ | ⊚ |
| 5-107 | $Ge_{19}Sb_{62}Te_{19}$ | ○ | Δ | ○ |
| 5-108 | $Ge_{11}Sb_{62}Te_{27}$ | ○ | Δ | ○ |
| 5-109 | $Ge_5Sb_{75}Te_{20}$ | ○ | ○ | Δ |
| 5-110 | $Ge_{7.5}Sb_{90}Te_{2.5}$ | Δ | ⊚ | Δ |
| 5-111 | $Ge_{25}Sb_{75}$ | ○ | ○ | ⊚ |
| 5-112 | $Ge_{25}Sb_{65}Te_{10}$ | ○ | ○ | ⊚ |
| 5-113 | $Ge_{7.2}Sb_{65}Te_{27.8}$ | ○ | ○ | ○ |
| 5-114 | $Ge_{10}Sb_{90}$ | ○ | ⊚ | ○ |
| 5-115 | $Ge_{22.5}Sb_{77.5}$ | ○ | ○ | ⊚ |
| 5-116 | $Ge_{23}Sb_{70}Te_7$ | ○ | ○ | ⊚ |
| 5-117 | $Ge_{16}Sb_{68}Te_{16}$ | ○ | ○ | ⊚ |
| 5-118 | $Ge_{12}Sb_{68}Te_{20}$ | ○ | ○ | ○ |
| 5-119 | $Ge_{12.5}Sb_{75}Te_{12.5}$ | ○ | ○ | ○ |
| 5-120 | $Ge_{12}Sb_{81}Te_7$ | ○ | ⊚ | ○ |
| 5-121 | $Ge_{13}Sb_{87}$ | ○ | ⊚ | ○ |
| 5-122 | $Ge_{20.9}Sb_{70}Te_{9.1}$ | ⊚ | ○ | ⊚ |
| 5-123 | $Ge_{11.8}Sb_{70}Te_{18.2}$ | ⊚ | ○ | ⊚ |
| 5-124 | $Ge_{14.5}Sb_{85.5}$ | ○ | ⊚ | ⊚ |
| 5-125 | $Ge_{20}Sb_{80}$ | ⊚ | ○ | ⊚ |
| 5-126 | $Ge_{18}Sb_{82}$ | ⊚ | ○ | ⊚ |
| 5-127 | $Ge_{20}Sb_{75}Te_5$ | ⊚ | ○ | ⊚ |
| 5-128 | $Ge_{15}Sb_{70}Te_{15}$ | ⊚ | ○ | ⊚ |

TABLE 25-continued

| | | 8x-Speed (groove and land) | | |
|---|---|---|---|---|
| Disc No. | Recording layer 15 | 11T Modulation degree | 11T Erasure rate | 11T Storage stability |
| 5-129 | $Ge_{14}Sb_{79}Te_7$ | ⊚ | ○ | ⊚ |
| 5-130 | $Ge_{17}Sb_{78}Te_5$ | ⊚ | ○ | ⊚ |
| 5-001 | $Ge_{35.3}Sb_{11.8}Te_{52.9}$ | △ | X | △ |
| 5-002 | $Ge_{38.1}Sb_{9.5}Te_{52.4}$ | X | X | △ |
| 5-003 | $Ge_{38.1}Bi_{9.5}Te_{52.4}$ | △ | △ | X |

TABLE 26

| | | 8x-Speed (groove and land) | | |
|---|---|---|---|---|
| Disc No. | Recording layer 15 | 3TCNR | 3T Erasure rate | 3T Storage stability |
| 5-101 | $Ge_{35}Sb_{65}$ | ○ | △ | ⊚ |
| 5-102 | $Ge_{36.9}Sb_{60}Te_{3.1}$ | ○ | △ | ⊚ |
| 5-103 | $Ge_{3.2}Sb_{60}Te_{36.8}$ | ○ | △ | ○ |
| 5-104 | $Ge_5Sb_{95}$ | △ | ⊚ | △ |
| 5-105 | $Ge_{30}Sb_{70}$ | ⊚ | △ | ⊚ |
| 5-106 | $Ge_{30}Sb_{65}Te_5$ | ○ | △ | ⊚ |
| 5-107 | $Ge_{19}Sb_{62}Te_{19}$ | ○ | △ | ○ |
| 5-108 | $Ge_{11}Sb_{62}Te_{27}$ | ○ | △ | ○ |
| 5-109 | $Ge_5Sb_{75}Te_{20}$ | ○ | ○ | △ |
| 5-110 | $Ge_{7.5}Sb_{90}Te_{2.5}$ | △ | ⊚ | △ |
| 5-111 | $Ge_{25}Sb_{75}$ | ○ | ○ | ⊚ |
| 5-112 | $Ge_{25}Sb_{65}Te_{10}$ | ○ | ○ | ⊚ |
| 5-113 | $Ge_{7.2}Sb_{65}Te_{27.8}$ | ○ | ○ | ○ |
| 5-114 | $Ge_{10}Sb_{90}$ | ○ | ⊚ | ○ |
| 5-115 | $Ge_{22.5}Sb_{77.5}$ | ○ | ○ | ⊚ |
| 5-116 | $Ge_{23}Sb_{70}Te_7$ | ○ | ○ | ⊚ |
| 5-117 | $Ge_{16}Sb_{68}Te_{16}$ | ○ | ○ | ○ |
| 5-118 | $Ge_{12}Sb_{68}Te_{20}$ | ○ | ○ | ○ |
| 5-119 | $Ge_{12.5}Sb_{75}Te_{12.5}$ | ○ | ○ | ○ |
| 5-120 | $Ge_{12}Sb_{81}Te_7$ | ○ | ⊚ | ○ |
| 5-121 | $Ge_{13}Sb_{87}$ | ○ | ⊚ | ○ |
| 5-122 | $Ge_{20.9}Sb_{70}Te_{9.1}$ | ⊚ | ○ | ⊚ |
| 5-123 | $Ge_{11.8}Sb_{70}Te_{18.2}$ | ⊚ | ○ | ⊚ |
| 5-124 | $Ge_{14.5}Sb_{85.5}$ | ○ | ⊚ | ⊚ |
| 5-125 | $Ge_{20}Sb_{80}$ | ⊚ | ○ | ⊚ |
| 5-126 | $Ge_{18}Sb_{82}$ | ⊚ | ○ | ⊚ |
| 5-127 | $Ge_{20}Sb_{75}Te_5$ | ⊚ | ○ | ⊚ |
| 5-128 | $Ge_{15}Sb_{70}Te_{15}$ | ⊚ | ○ | ⊚ |
| 5-129 | $Ge_{14}Sb_{79}Te_7$ | ⊚ | ○ | ⊚ |
| 5-130 | $Ge_{17}Sb_{78}Te_5$ | ⊚ | ○ | ⊚ |
| 5-001 | $Ge_{35.3}Sb_{11.8}Te_{52.9}$ | △ | X | △ |
| 5-002 | $Ge_{38.1}Sb_{9.5}Te_{52.4}$ | X | X | △ |
| 5-003 | $Ge_{38.1}Bi_{9.5}Te_{52.4}$ | △ | △ | X |

As shown in Tables 25 and 26, with respect to all the properties obtained at 8x speed recording, considerably improved results were obtained in all the information recording media 5 (Disc Nos. 5-101 to 5-130) of this example as compared to the conventional examples 5-001 to 5-003. Furthermore, in the case of the compositions within the composition range (I) shown in FIG. 12, any one property selected from the modulation degree of a 11T mark, the erasure rate of the 11T mark, the storage stability of the 11T mark, the CNR of a 3T mark, the erasure rate of the 3T mark and the storage stability of the 3T mark was evaluated as △. Thus there were properties that were slightly unsatisfactory for the information recording media. However, in the case of the compositions within the composition range (II), no properties were evaluated as △, and thus the composition range (II) was proved to be more suitable. Furthermore, in the case of the compositions within the composition range (III), two of the properties were evaluated as ⊚ and thus the composition range (III) was proved to be more suitable as compared to the composition range (II).

As described above, information recording media with better properties than conventional ones were obtained in the present invention.

Example 10

An example of the information recording medium (see FIGS. 2 and 3) described in Embodiment 6 is described in this example. A method for manufacturing the information recording medium of this example is described below.

The manufacturing method is the same as that employed in Example 1 except for the step of forming the recording layer 15.

The recording layer 15 was formed by the method described in Embodiment 6.

The information recording media of this example of the present invention produced as described above and conventional information recording media were evaluated for the modulation degree of a 9T mark, the erasure rate of the 9T mark, the storage stability of the 9T mark, the CNR of a 2T mark, the erasure rate of the 2T mark, and the storage stability of the 2T mark at 4x speed recording by the same method as that used in Example 1.

The recording layer 15 of this example was configured with $Ge_{17}Sb_{83}$ and Te stacked alternately to form the first to X-th layers. Information recording media were produced, with the first component layer being formed of $Ge_{17}Sb_{83}$ and with X being 2, 3, 5, and 7. The information recording media thus produced had the following relationships between X and the thickness of $Ge_{17}Sb_{83}$ as well as Te that composed the recording layer 15:

(X, $Ge_{17}Sb_{83}$, Te)=(2, 9.5 nm, 0.5 nm), (2, 9.0 nm, 1.0 nm), (3, 4.8 nm, 0.5 nm), (3, 4.5 nm, 1.0 nm), (5, 3.2 nm, 0.25 nm), (5, 3.0 nm, 0.5 nm), (7, 2.4 nm, 0.17 nm), and (7, 2.3 nm, 0.34 nm)

These discs were numbered as 6-101 to 6-108, respectively.

With respect to 6-101, 6-103, and 6-105 of the above-mentioned discs, the structure of the recording layer 15 is specified from the substrate side as follows:

6-101 (2, 9.5 nm, 0.5 nm): $Ge_{17}Sb_{83}$ (9.5 nm)/Te (0.5 nm), 6-103 (3, 4.8 nm, 0.5 nm): $Ge_{17}Sb_{83}$ (4.8 nm)/Te (0.5 nm)/$Ge_{17}Sb_{83}$ (4.8 nm), and 6-105 (5, 3.2 nm, 0.25 nm): $Ge_{17}Sb_{83}$ (3.2 nm)/Te (0.25 nm)/$Ge_{17}Sb_{83}$ (3.2 nm)/Te (0.25 nm)/$Ge_{17}Sb_{83}$ (3.2 nm).

Similarly, information recording media were produced in which the recording layer 15 was configured with component layers made of $Ge_{17}Sb_{83}$ and component layers made of $Ge_{50}Te_{50}$ that were stacked alternately to form the first to X-th layers. The first component layer was formed of $Ge_{17}Sb_{83}$. X was 2, 3, 5, and 7. The information recording media thus produced had the following relationships between X and the thickness of the component layer made of $Ge_{17}Sb_{83}$ as well as the component layer made of $Ge_{50}Te_{50}$ that composed the recording layer 15:

(X, $Ge_{17}Sb_{83}$, $Ge_{50}Te_{50}$)=(2, 9.0 nm, 1.0 nm), (2, 8.0 nm, 2.0 nm), (3, 4.5 nm, 1.0 nm), (3, 4.0 nm, 2.0 nm), (5, 3.0 nm, 0.5 nm), (5, 2.7 nm, 1.0 nm), (7, 2.3 nm, 0.33 nm), and (7, 2.0 nm, 0.67 nm).

These discs were numbered as 6-109 to 6-116, respectively.

Similarly, information recording media were produced, in which the recording layer 15 was configured with component layers made of $Ge_{50}Te_{50}$ and component layers made of $Ge_{17}Sb_{83}$ that were stacked alternately to form the first to X-th layers. The first component layer was formed of $Ge_{50}Te_{50}$. X was 2, 3, 5, and 7. The information recording media thus produced had the following relationships between X and the thickness of the component layer made of $Ge_{50}Te_{50}$ as well as the component layer made of $Ge_{17}Sb_{83}$ that composed the recording layer 15:

(X, $Ge_{50}Te_{50}$, $Ge_{17}Sb_{83}$)=(2, 1.0 nm, 9.0 nm), (2, 2.0 nm, 8.0 nm), (3, 0.5 nm, 9.0 nm), (3, 1.0 nm, 8.0 nm), (5, 0.33 nm, 4.5 nm), (5, 0.67 nm, 4.0 nm), (7, 0.25 nm, 3.0 nm), and (7, 0.5 nm, 2.7 nm).

These discs were numbered as 6-117 to 6-124, respectively.

Information recording media of the examples of the present invention described above were compared with the information recording media of conventional examples 1-001 to 1-003.

Table 27 shows the evaluation results of the modulation degree of a 9T mark, the erasure rate of the 9T mark, and the storage stability of the 9T mark at 4× speed recording. Table 28 shows the evaluation results of the CNR of a 2T mark, the erasure rate of the 2T mark, and the storage stability of the 2T mark at 4× speed recording.

TABLE 27

| | | | 4x Speed | | |
|---|---|---|---|---|---|
| Disc No. | X | First component layer | 9T Modulation degree | 9T Erasure rate | 9T Storage stability |
| 6-101 | 2 | $Ge_{17}Sb_{83}$ | ⊚ | ○ | ⊚ |
| 6-102 | 2 | $Ge_{17}Sb_{83}$ | ⊚ | ○ | ⊚ |
| 6-103 | 3 | $Ge_{17}Sb_{83}$ | ⊚ | ○ | ⊚ |
| 6-104 | 3 | $Ge_{17}Sb_{83}$ | ⊚ | ○ | ⊚ |
| 6-105 | 5 | $Ge_{17}Sb_{83}$ | ⊚ | ○ | ⊚ |
| 6-106 | 5 | $Ge_{17}Sb_{83}$ | ⊚ | ○ | ⊚ |
| 6-107 | 7 | $Ge_{17}Sb_{83}$ | ⊚ | ○ | ⊚ |
| 6-108 | 7 | $Ge_{17}Sb_{83}$ | ⊚ | ○ | ⊚ |
| 6-109 | 2 | $Ge_{17}Sb_{83}$ | ⊚ | ○ | ⊚ |
| 6-110 | 2 | $Ge_{17}Sb_{83}$ | ⊚ | ○ | ⊚ |
| 6-111 | 3 | $Ge_{17}Sb_{83}$ | ⊚ | ○ | ⊚ |
| 6-112 | 3 | $Ge_{17}Sb_{83}$ | ⊚ | ○ | ⊚ |
| 6-113 | 5 | $Ge_{17}Sb_{83}$ | ⊚ | ○ | ⊚ |
| 6-114 | 5 | $Ge_{17}Sb_{83}$ | ⊚ | ○ | ⊚ |
| 6-115 | 7 | $Ge_{17}Sb_{83}$ | ⊚ | ○ | ⊚ |
| 6-116 | 7 | $Ge_{17}Sb_{83}$ | ⊚ | ○ | ⊚ |
| 6-117 | 2 | $Ge_{50}Te_{50}$ | ⊚ | ○ | ⊚ |
| 6-118 | 2 | $Ge_{50}Te_{50}$ | ⊚ | ○ | ⊚ |
| 6-119 | 3 | $Ge_{50}Te_{50}$ | ⊚ | ○ | ⊚ |
| 6-120 | 3 | $Ge_{50}Te_{50}$ | ⊚ | ○ | ⊚ |
| 6-121 | 5 | $Ge_{50}Te_{50}$ | ⊚ | ○ | ⊚ |
| 6-122 | 5 | $Ge_{50}Te_{50}$ | ⊚ | ○ | ⊚ |
| 6-123 | 7 | $Ge_{50}Te_{50}$ | ⊚ | ○ | ⊚ |
| 6-124 | 7 | $Ge_{50}Te_{50}$ | ⊚ | ○ | ⊚ |
| 1-001 | 1 | $Ge_{35.3}Sb_{11.8}Te_{52.9}$ | Δ | X | Δ |
| 1-002 | 1 | $Ge_{38.1}Sb_{9.5}Te_{52.4}$ | X | X | Δ |
| 1-003 | 1 | $Ge_{38.1}Bi_{9.5}Te_{52.4}$ | Δ | Δ | X |

TABLE 28

| | | | 4x Speed | | |
|---|---|---|---|---|---|
| Disc No. | X | First component layer | 2T CNR | 2T Erasure rate | 2T Storage stability |
| 6-101 | 2 | $Ge_{17}Sb_{83}$ | ⊚ | ○ | ⊚ |
| 6-102 | 2 | $Ge_{17}Sb_{83}$ | ⊚ | ○ | ⊚ |
| 6-103 | 3 | $Ge_{17}Sb_{83}$ | ⊚ | ○ | ⊚ |
| 6-104 | 3 | $Ge_{17}Sb_{83}$ | ⊚ | ○ | ⊚ |
| 6-105 | 5 | $Ge_{17}Sb_{83}$ | ⊚ | ○ | ⊚ |
| 6-106 | 5 | $Ge_{17}Sb_{83}$ | ⊚ | ○ | ⊚ |
| 6-107 | 7 | $Ge_{17}Sb_{83}$ | ⊚ | ○ | ⊚ |
| 6-108 | 7 | $Ge_{17}Sb_{83}$ | ⊚ | ○ | ⊚ |
| 6-109 | 2 | $Ge_{17}Sb_{83}$ | ⊚ | ○ | ⊚ |
| 6-110 | 2 | $Ge_{17}Sb_{83}$ | ⊚ | ○ | ⊚ |
| 6-111 | 3 | $Ge_{17}Sb_{83}$ | ⊚ | ○ | ⊚ |
| 6-112 | 3 | $Ge_{17}Sb_{83}$ | ⊚ | ○ | ⊚ |
| 6-113 | 5 | $Ge_{17}Sb_{83}$ | ⊚ | ○ | ⊚ |
| 6-114 | 5 | $Ge_{17}Sb_{83}$ | ⊚ | ○ | ⊚ |
| 6-115 | 7 | $Ge_{17}Sb_{83}$ | ⊚ | ○ | ⊚ |
| 6-116 | 7 | $Ge_{17}Sb_{83}$ | ⊚ | ○ | ⊚ |
| 6-117 | 2 | $Ge_{50}Te_{50}$ | ⊚ | ○ | ⊚ |
| 6-118 | 2 | $Ge_{50}Te_{50}$ | ⊚ | ○ | ⊚ |
| 6-119 | 3 | $Ge_{50}Te_{50}$ | ⊚ | ○ | ⊚ |
| 6-120 | 3 | $Ge_{50}Te_{50}$ | ⊚ | ○ | ⊚ |
| 6-121 | 5 | $Ge_{50}Te_{50}$ | ⊚ | ○ | ⊚ |
| 6-122 | 5 | $Ge_{50}Te_{50}$ | ⊚ | ○ | ⊚ |
| 6-123 | 7 | $Ge_{50}Te_{50}$ | ⊚ | ○ | ⊚ |
| 6-124 | 7 | $Ge_{50}Te_{50}$ | ⊚ | ○ | ⊚ |
| 1-001 | 1 | $Ge_{35.3}Sb_{11.8}Te_{52.9}$ | Δ | X | Δ |
| 1-002 | 1 | $Ge_{38.1}Sb_{9.5}Te_{52.4}$ | X | X | Δ |
| 1-003 | 1 | $Ge_{38.1}Bi_{9.5}Te_{52.4}$ | Δ | Δ | X |

As shown in Tables 27 and 28, with respect to all the properties obtained at 4× speed recording, considerably improved results were obtained in all the information recording media (Disc Nos. 6-101 to 6-124) of this example as compared to the conventional examples 1-001 to 1-003. Similarly, they also were evaluated at 2× speed recording and better results than those of conventional examples were obtained as in the case of 4× speed recording.

As described above, information recording media with better properties than those of conventional ones were obtained in the present invention.

Example 11

Examples of the information recording medium (see FIG. 4) described in Embodiment 7 are described in this example. In this example, examples of the information recording media having four information layers are described, in each of which the recording layer of the fourth information layer was formed by the method described in Embodiment 7. The method for manufacturing the information recording media of this example is described below.

The manufacturing method is the same as that employed in Example 4 except for the step of forming the recording layer 304 of the fourth information layer.

The recording layer 304 was formed by the method described in Embodiment 7.

The information recording media of this example of the present invention produced as described above and conventional information recording media were evaluated for the modulation degree of a 9T mark, the erasure rate of the 9T mark, the storage stability of the 9T mark, the CNR of a 2T mark, the erasure rate of the 2T mark, and the storage stability of the 2T mark at 2× speed recording by the same method as that used in Example 4.

Information recording media were produced, as examples of the information recording medium of this example, in each of which the recording layer 304 was configured with component layers made of $Ge_{17}Sb_{83}$ and component layers made of Te that were stacked alternately to form the first to X-th layers. The first component layer was formed of $Ge_{17}Sb_{83}$. X was 2, 3, 5, and 7. The information recording media thus produced had the following relationships between X and the thickness of the component layer made of $Ge_{17}Sb_{83}$ as well as the component layer made of Te that composed the recording layer 304:

(X, $Ge_{17}Sb_{83}$, Te)=(2, 2.8 nm, 0.2 nm), (3, 1.4 nm, 0.2 nm), (5, 0.9 nm, 0.1 nm), and (7, 0.7 nm, 0.067 nm).

These discs were numbered as 7-101 to 7-104, respectively.

Similarly, information recording media were produced, in each of which the recording layer 304 was configured with component layers made of $Ge_{17}Sb_{83}$ and component layers made of $Ge_{50}Te_{50}$ that were stacked alternately to form the first to X-th layers. The first component layer was formed of $Ge_{17}Sb_{83}$. X was 2, 3, 5, and 7. The information recording media thus produced had the following relationships between X and the thickness of the component layer made of $Ge_{17}Sb_{83}$ as well as the component layer made of $Ge_{50}Te_{50}$ that composed the recording layer 304:

(X, $Ge_{17}Sb_{83}$, $Ge_{50}Te_{50}$)=(2, 2.6 nm, 0.4 nm), (3, 1.3 nm, 0.4 nm), (5, 0.9 nm, 0.2 nm), and (7, 0.65 nm, 0.13 nm).

These discs were numbered as 7-105 to 7-108, respectively.

Similarly, information recording media were produced, in each of which the recording layer 15 was configured with component layers made of $Ge_{50}Te_{50}$ and component layers made of $Ge_{17}Sb_{83}$ that were stacked alternately to form the first to X-th layers. The first component layer was formed of $Ge_{50}Te_{50}$. X was 2, 3, 5, and 7. The information recording media thus produced had the following relationships between X and the thickness of the component layer made of $Ge_{50}Te_{50}$ as well as the component layer made of $Ge_{17}Sb_{83}$ that composed the recording layer 304:

(X, $Ge_{50}Te_{50}$, $Ge_{17}Sb_3$)=(2, 0.4 nm, 2.6 nm), (3, 0.2 nm, 2.6 nm), (5, 0.13 nm, 1.3 nm), and (7, 0.1 nm, 0.9 nm).

These discs were numbered as 7-109 to 7-112, respectively.

Information recording media of this example described above were compared with the information recording media of conventional examples 3-004 to 3-006.

Table 29 shows the evaluation results of the modulation degree of a 9T mark, the erasure rate of the 9T mark, and the storage stability of the 9T mark at 2× speed recording. Table 30 shows the evaluation results of the CNR of a 2T mark, the erasure rate of the 2T mark, and the storage stability of the 2T mark at 4× speed recording.

TABLE 29

| | | | 2x Speed | | |
|---|---|---|---|---|---|
| Disc No. | X | First component layer | 9T Modulation degree | 9T Erasure rate | 9T Storage stability |
| 7-101 | 2 | $Ge_{17}Sb_{83}$ | ○ | ○ | ○ |
| 7-102 | 3 | $Ge_{17}Sb_{83}$ | ○ | ○ | ○ |
| 7-103 | 5 | $Ge_{17}Sb_{83}$ | ○ | ○ | ○ |
| 7-104 | 7 | $Ge_{17}Sb_{83}$ | ○ | ○ | ○ |
| 7-105 | 2 | $Ge_{17}Sb_{83}$ | ○ | ○ | ○ |
| 7-106 | 3 | $Ge_{17}Sb_{83}$ | ○ | ○ | ○ |
| 7-107 | 5 | $Ge_{17}Sb_{83}$ | ○ | ○ | ○ |
| 7-108 | 7 | $Ge_{17}Sb_{83}$ | ○ | ○ | ○ |
| 7-109 | 2 | $Ge_{50}Te_{50}$ | ○ | ○ | ○ |
| 7-110 | 3 | $Ge_{50}Te_{50}$ | ○ | ○ | ○ |
| 7-111 | 5 | $Ge_{50}Te_{50}$ | ○ | ○ | ○ |
| 7-112 | 7 | $Ge_{50}Te_{50}$ | ○ | ○ | ○ |
| 3-004 | 1 | $Ge_{35.3}Sb_{11.8}Te_{52.9}$ | X | Δ | Δ |
| 3-005 | 1 | $Ge_{38.1}Sb_{9.5}Te_{52.4}$ | X | X | Δ |
| 3-006 | 1 | $Ge_{38.1}Bi_{9.5}Te_{52.4}$ | X | Δ | Δ |

TABLE 30

| | | | 2x Speed | | |
|---|---|---|---|---|---|
| Disc No. | X | First component layer | 2T CNR | 2T Erasure rate | 2T Storage stability |
| 7-101 | 2 | $Ge_{17}Sb_{83}$ | ○ | ○ | ○ |
| 7-102 | 3 | $Ge_{17}Sb_{83}$ | ○ | ○ | ○ |
| 7-103 | 5 | $Ge_{17}Sb_{83}$ | ○ | ○ | ○ |
| 7-104 | 7 | $Ge_{17}Sb_{83}$ | ○ | ○ | ○ |
| 7-105 | 2 | $Ge_{17}Sb_{83}$ | ○ | ○ | ○ |
| 7-106 | 3 | $Ge_{17}Sb_{83}$ | ○ | ○ | ○ |
| 7-107 | 5 | $Ge_{17}Sb_{83}$ | ○ | ○ | ○ |
| 7-108 | 7 | $Ge_{17}Sb_{83}$ | ○ | ○ | ○ |
| 7-109 | 2 | $Ge_{50}Te_{50}$ | ○ | ○ | ○ |
| 7-110 | 3 | $Ge_{50}Te_{50}$ | ○ | ○ | ○ |
| 7-111 | 5 | $Ge_{50}Te_{50}$ | ○ | ○ | ○ |
| 7-112 | 7 | $Ge_{50}Te_{50}$ | ○ | ○ | ○ |
| 3-004 | 1 | $Ge_{35.3}Sb_{11.8}Te_{52.9}$ | X | Δ | Δ |
| 3-005 | 1 | $Ge_{38.1}Sb_{9.5}Te_{52.4}$ | X | X | Δ |
| 3-006 | 1 | $Ge_{38.1}Bi_{9.5}Te_{52.4}$ | X | Δ | Δ |

As shown in Tables 29 and 30, with respect to all the properties obtained at 2× speed recording, considerably improved results were obtained in all the information recording media (Disc Nos. 7-101 to 7-112) of this example as compared to the conventional examples 3-004 to 3-006.

As described above, information recording media with better properties than those of conventional ones were obtained in the present invention.

Example 12

Examples of the information recording medium (see FIG. 5) described in Embodiment 8 are described in this example. In this example, examples of the information recording media of Embodiment 8 are described, in each of which the recording layer 404 of the second information layer 42 was formed by the method described in Embodiment 8. The method for manufacturing the information recording media of this example is described below.

The manufacturing method is the same as that employed in Example 6 except for the step of forming the recording layer 404 of the second information layer 42.

The recording layer 404 was formed by the method described in Embodiment 8.

The information recording media of this example produced as described above and conventional information recording media were evaluated for the modulation degree of a 9T mark, the erasure rate of the 9T mark, the storage stability of the 9T mark, the CNR of a 2T mark, the erasure rate of the 2T mark, and the storage stability of the 2T mark at 4× speed recording by the same method as that used in Example 6.

Information recording media were produced, as examples of the information recording medium of this example, in each of which the recording layer 404 was configured with component layers made of $Ge_{17}Sb_{83}$ and component layers made of Te that were stacked alternately to form the first to X-th layers. The first component layer was formed of $Ge_{17}Sb_{83}$. X was 2, 3, 5, and 7. The information recording media thus produced had the following relationships between X and the thickness of the component layer made of $Ge_{17}Sb_{83}$ as well as the component layer made of Te that composed the recording layer 404:

(X, $Ge_{17}Sb_{83}$, Te)=(2, 5.7 nm, 0.3 nm), (2, 5.4 nm, 0.6 nm), (3, 2.9 nm, 0.3 nm), (3, 2.7 nm, 0.6 nm), (5, 1.9 nm, 0.15 nm), (5, 1.8 nm, 0.3 nm), (7, 1.43 nm, 0.1 nm), and (7, 1.35 nm, 0.2 nm).

These discs were numbered as 8-101 to 8-108, respectively.

Similarly, information recording media were produced, in each of which the recording layer 404 was configured with component layers made of $Ge_{17}Sb_{83}$ and component layers made of $Ge_{50}Te_{50}$ that were stacked alternately to form the first to X-th layers. The first component layer was formed of $Ge_{17}Sb_{83}$. X was 2, 3, 5, and 7. The information recording media thus produced had the following relationships between X and the thickness of the component layer made of $Ge_{17}Sb_{83}$ as well as the component layer made of $Ge_{50}Te_{50}$ that composed the recording layer 404:

(X, $Ge_{17}Sb_{83}$, $Ge_{50}Te_{50}$)=(2, 5.5 nm, 0.5 nm), (2, 5.0 nm, 1.0 nm), (3, 2.8 nm, 0.5 nm), (3, 2.5 nm, 1.0 nm), (5, 1.8 nm, 0.25 nm), (5, 1.7 nm, 0.5 nm), (7, 1.38 nm, 0.17 nm), and (7, 1.25 nm, 0.33 nm).

These discs were numbered as 8-109 to 8-116, respectively.

Similarly, information recording media were produced, in each of which the recording layer 404 was configured with component layers made of $Ge_{50}Te_{50}$ and component layers made of $Ge_{17}Sb_{83}$ that were stacked alternately to form the first to X-th layers. The first component layer was formed of $Ge_{50}Te_{50}$. X was 2, 3, 5, and 7. The information recording media thus produced had the following relationships between X and the thickness of the component layer made of $Ge_{50}Te_{50}$ as well as the component layer made of $Ge_{17}Sb_{83}$ that composed the recording layer 404:

(X, $Ge_{50}Te_{50}$, $Ge_{17}Sb_{83}$)=(2, 0.5 nm, 5.5 nm), (2, 1.0 nm, 5.0 nm), (3, 0.25 nm, 5.5 nm), (3, 1.0 nm, 5.0 nm), (5, 0.17 nm, 2.8 nm), (5, 0.33 nm, 2.5 nm), (7, 0.13 nm, 1.83 nm), and (7, 0.25 nm, 1.67 nm).

These discs were numbered as 8-117 to 8-124, respectively.

Information recording media 8 described above were compared with the conventional examples 4-004 to 4-006.

Table 31 shows the evaluation results of the modulation degree of a 9T mark, the erasure rate of the 9T mark, and the storage stability of the 9T mark at 4× speed recording. Table 32 shows the evaluation results of the CNR of a 2T mark, the erasure rate of the 2T mark, and the storage stability of the 2T mark at 4× speed recording.

TABLE 31

| Disc No. | X | First component Layer | 4x Speed 9T Modulation degree | 9T Erasure rate | 9T Storage stability |
|---|---|---|---|---|---|
| 8-101 | 2 | $Ge_{17}Sb_{83}$ | ◎ | ○ | ◎ |
| 8-102 | 2 | $Ge_{17}Sb_{83}$ | ◎ | ○ | ◎ |
| 8-103 | 3 | $Ge_{17}Sb_{83}$ | ◎ | ○ | ◎ |
| 8-104 | 3 | $Ge_{17}Sb_{83}$ | ◎ | ○ | ◎ |
| 8-105 | 5 | $Ge_{17}Sb_{83}$ | ◎ | ○ | ◎ |
| 8-106 | 5 | $Ge_{17}Sb_{83}$ | ◎ | ○ | ◎ |
| 8-107 | 7 | $Ge_{17}Sb_{83}$ | ◎ | ○ | ◎ |
| 8-108 | 7 | $Ge_{17}Sb_{83}$ | ◎ | ○ | ◎ |
| 8-109 | 2 | $Ge_{17}Sb_{83}$ | ◎ | ○ | ◎ |
| 8-110 | 2 | $Ge_{17}Sb_{83}$ | ◎ | ○ | ◎ |
| 8-111 | 3 | $Ge_{17}Sb_{83}$ | ◎ | ○ | ◎ |
| 8-112 | 3 | $Ge_{17}Sb_{83}$ | ◎ | ○ | ◎ |
| 8-113 | 5 | $Ge_{17}Sb_{83}$ | ◎ | ○ | ◎ |
| 8-114 | 5 | $Ge_{17}Sb_{83}$ | ◎ | ○ | ◎ |
| 8-115 | 7 | $Ge_{17}Sb_{83}$ | ◎ | ○ | ◎ |
| 8-116 | 7 | $Ge_{17}Sb_{83}$ | ◎ | ○ | ◎ |
| 8-117 | 2 | $Ge_{50}Te_{50}$ | ◎ | ○ | ◎ |
| 8-118 | 2 | $Ge_{50}Te_{50}$ | ◎ | ○ | ◎ |
| 8-119 | 3 | $Ge_{50}Te_{50}$ | ◎ | ○ | ◎ |
| 8-120 | 3 | $Ge_{50}Te_{50}$ | ◎ | ○ | ◎ |
| 8-121 | 5 | $Ge_{50}Te_{50}$ | ◎ | ○ | ◎ |
| 8-122 | 5 | $Ge_{50}Te_{50}$ | ◎ | ○ | ◎ |
| 8-123 | 7 | $Ge_{50}Te_{50}$ | ◎ | ○ | ◎ |
| 8-124 | 7 | $Ge_{50}Te_{50}$ | ◎ | ○ | ◎ |
| 4-004 | 1 | $Ge_{35.3}Sb_{11.8}Te_{52.9}$ | Δ | X | Δ |
| 4-005 | 1 | $Ge_{38.1}Sb_{9.5}Te_{52.4}$ | X | X | Δ |
| 4-006 | 1 | $Ge_{38.1}Bi_{9.5}Te_{52.4}$ | Δ | Δ | X |

TABLE 32

| Disc No. | X | First component layer | 4x Speed 2T CNR | 2T Erasure rate | 2T Storage stability |
|---|---|---|---|---|---|
| 8-101 | 2 | $Ge_{17}Sb_{83}$ | ◎ | ○ | ◎ |
| 8-102 | 2 | $Ge_{17}Sb_{83}$ | ◎ | ○ | ◎ |
| 8-103 | 3 | $Ge_{17}Sb_{83}$ | ◎ | ○ | ◎ |
| 8-104 | 3 | $Ge_{17}Sb_{83}$ | ◎ | ○ | ◎ |
| 8-105 | 5 | $Ge_{17}Sb_{83}$ | ◎ | ○ | ◎ |
| 8-106 | 5 | $Ge_{17}Sb_{83}$ | ◎ | ○ | ◎ |
| 8-107 | 7 | $Ge_{17}Sb_{83}$ | ◎ | ○ | ◎ |
| 8-108 | 7 | $Ge_{17}Sb_{83}$ | ◎ | ○ | ◎ |
| 8-109 | 2 | $Ge_{17}Sb_{83}$ | ◎ | ○ | ◎ |
| 8-110 | 2 | $Ge_{17}Sb_{83}$ | ◎ | ○ | ◎ |
| 8-111 | 3 | $Ge_{17}Sb_{83}$ | ◎ | ○ | ◎ |
| 8-112 | 3 | $Ge_{17}Sb_{83}$ | ◎ | ○ | ◎ |
| 8-113 | 5 | $Ge_{17}Sb_{83}$ | ◎ | ○ | ◎ |
| 8-114 | 5 | $Ge_{17}Sb_{83}$ | ◎ | ○ | ◎ |
| 8-115 | 7 | $Ge_{17}Sb_{83}$ | ◎ | ○ | ◎ |
| 8-116 | 7 | $Ge_{17}Sb_{83}$ | ◎ | ○ | ◎ |
| 8-117 | 2 | $Ge_{50}Te_{50}$ | ◎ | ○ | ◎ |
| 8-118 | 2 | $Ge_{50}Te_{50}$ | ◎ | ○ | ◎ |
| 8-119 | 3 | $Ge_{50}Te_{50}$ | ◎ | ○ | ◎ |
| 8-120 | 3 | $Ge_{50}Te_{50}$ | ◎ | ○ | ◎ |
| 8-121 | 5 | $Ge_{50}Te_{50}$ | ◎ | ○ | ◎ |
| 8-122 | 5 | $Ge_{50}Te_{50}$ | ◎ | ○ | ◎ |
| 8-123 | 7 | $Ge_{50}Te_{50}$ | ◎ | ○ | ◎ |
| 8-124 | 7 | $Ge_{50}Te_{50}$ | ◎ | ○ | ◎ |
| 4-004 | 1 | $Ge_{35.3}Sb_{11.8}Te_{52.9}$ | Δ | X | Δ |
| 4-005 | 1 | $Ge_{38.1}Sb_{9.5}Te_{52.4}$ | X | X | Δ |
| 4-006 | 1 | $Ge_{38.1}Bi_{9.5}Te_{52.4}$ | Δ | Δ | X |

As shown in Tables 31 and 32, with respect to all the properties obtained at 4× speed recording, considerably improved results were obtained in all the information recording media (Disc Nos. 8-101 to 8-124) of this example as compared to the conventional examples 4-004 to 4-006. Similarly, they also were evaluated at 2× speed recording and better results than those of conventional examples were obtained as in the case of 4× speed recording.

As described above, information recording media with better properties than those of conventional ones were obtained in the present invention.

Example 13

Examples of the information recording medium (see FIG. 5) described in Embodiment 8 are described in this example. In this example, information recording media in which the third component layer of the recording layer 404 of the second information layer 42 contained an element M (where M is at least one element selected from N, Bi, C, Si, Sn, Ga, In, Zn, Cu, Ag, Au, Ni, Pd, Pt, Co, Rh, Ru, Mn, Cr, Mo, W, V, Nb, Ta, Ti, Zr, Hf; Y, La, Ce, Pr, Nd, Gd, Tb, and Dy) were produced by the method described in Embodiment 8. The method for manufacturing the information recording media of this example is described below.

The manufacturing method is the same as that employed in Example 6 except for the step of forming the recording layer 404 of the second information layer 42 of each information recording medium.

The recording layer 404 was formed by the method described in Embodiment 8.

The information recording media of this example produced as described above and conventional information recording media were evaluated for the modulation degree of a 9T mark, the erasure rate of the 9T mark, the storage stability of the 9T mark, the CNR of a 2T mark, the erasure rate of the 2T mark, and the storage stability of the 2T mark at 4× speed recording by the same method as that used in Example 6.

Information recording media were produced, as examples of the information recording medium of this example, in each of which the recording layer 404 was configured with a component layer made of $Ge_{17}Sb_{83}$, a component layer made of Te, and a component layer made of metal/semiconductor containing the element M that were stacked sequentially from the first component layer. The thickness of $Ge_{17}Sb_{83}$ of the first component layer and the fourth component layer was 2.8 nm. The thickness of Te of the second component layer and the fifth component layer was 0.1 nm. The thickness of the third component layer was 0.3 nm. Bi, C, Si, $Sn_{50}Te_{50}$, $In_{40}Te_{60}$, Ag, Au, Pd, Mn, Cr, W, V, Ta, Ti, Zr, Tb and Dy were used for the third component layer. These discs were numbered as 8-201 to 8-217, respectively. In order to compare with these information recording media, those formed using Ca and Ir (Disc Nos. 8-001 and 8-002) were produced.

Table 33 shows the evaluation results of the modulation degree of a 9T mark, the erasure rate of the 9T mark, and the storage stability of the 9T mark at 4× speed recording. Table 34 shows the evaluation results of the CNR of a 2T mark, the erasure rate of the 2T mark, and the storage stability of the 2T mark at 4× speed recording.

TABLE 33

| | | 4× Speed | | |
|---|---|---|---|---|
| Disc No. | Third component layer | 9T Modulation degree | 9T Erasure rate | 9T Storage stability |
| 8-201 | Bi | ○ | ◎ | ◎ |
| 8-202 | C | ◎ | ○ | ◎ |
| 8-203 | Si | ◎ | ○ | ◎ |
| 8-204 | $Sn_{50}Te_{50}$ | ○ | ◎ | ◎ |
| 8-205 | $In_{40}Te_{60}$ | ◎ | ○ | ◎ |
| 8-206 | Ag | ◎ | ○ | ◎ |
| 8-207 | Au | ○ | ◎ | ◎ |
| 8-208 | Pd | ◎ | ○ | ◎ |
| 8-209 | Mn | ◎ | ○ | ◎ |
| 8-210 | Cr | ◎ | ○ | ◎ |
| 8-211 | W | ◎ | ○ | ◎ |
| 8-212 | V | ◎ | ○ | ◎ |
| 8-213 | Ta | ◎ | ○ | ◎ |
| 8-214 | Ti | ◎ | ○ | ◎ |
| 8-215 | Zr | ◎ | ○ | ◎ |
| 8-216 | Tb | ◎ | ○ | ◎ |
| 8-217 | Dy | ◎ | ○ | ◎ |
| 8-001 | Ca | Δ | Δ | ○ |
| 8-002 | Ir | ○ | X | ◎ |

TABLE 34

| | | 4× Speed | | |
|---|---|---|---|---|
| Disc No. | Third component layer | 2T CNR | 2T Erasure rate | 2T Storage stability |
| 8-201 | Bi | ○ | ◎ | ◎ |
| 8-202 | C | ◎ | ○ | ◎ |
| 8-203 | Si | ◎ | ○ | ◎ |
| 8-204 | $Sn_{50}Te_{50}$ | ○ | ◎ | ◎ |
| 8-205 | $In_{40}Te_{60}$ | ◎ | ○ | ◎ |
| 8-206 | Ag | ◎ | ○ | ◎ |
| 8-207 | Au | ○ | ◎ | ◎ |
| 8-208 | Pd | ◎ | ○ | ◎ |
| 8-209 | Mn | ◎ | ○ | ◎ |
| 8-210 | Cr | ◎ | ○ | ◎ |
| 8-211 | W | ◎ | ○ | ◎ |
| 8-212 | V | ◎ | ○ | ◎ |
| 8-213 | Ta | ◎ | ○ | ◎ |
| 8-214 | Ti | ◎ | ○ | ◎ |
| 8-215 | Zr | ◎ | ○ | ◎ |
| 8-216 | Tb | ◎ | ○ | ◎ |
| 8-217 | Dy | ◎ | ○ | ◎ |
| 8-001 | Ca | Δ | Δ | ○ |
| 8-002 | Ir | ○ | X | ◎ |

As shown in Tables 33 and 34, with respect to all the properties obtained at 4× speed recording, better results were obtained in all the information recording media (Disc Nos. 8-201 to 8-217) of this example as compared to the conventional examples 8-001 to 8-002. Similarly, they also were evaluated at 2× speed recording and better results than those of conventional examples were obtained as in the case of 4× speed recording.

As described above, information recording media with good properties were obtained in the present invention.

Example 14

Examples of the electrical information recording medium (memory) 86 shown in FIG. 8 are described in this example.

The method for manufacturing the information recording media of this example is described below.

A Si substrate was prepared as the substrate 81, with the surface thereof being subjected to a nitriding treatment, on which the following layers were deposited sequentially by the sputtering method: a Pt film with an area of 6 μm×6 μm and a thickness of 0.1 μm to serve as the lower electrode 82, a $(ZrO_2)_{35}(SiO_2)_{15}(Cr_2O_3)_{50}$ film with an area of 4.5 μm×5 μm and a thickness of 0.01 μm to serve as the first interface layer 801, the first recording layer 83 with an area of 5 μm×5 μm and a thickness of 0.1 μm, a $(ZrO_2)_{35}(SiO_2)_{15}(Cr_2O_3)_{50}$ film with an area of 4.5 μm×5 μm and a thickness of 0.01 μm to serve as the second interface layer 802, a $(ZrO_2)_{35}(SiO_2)_{15}(Cr_2O_3)_{50}$ film with an area of 4.5 μm×5 μm and a thickness of 0.01 μm to serve as the third interface layer 803, the second recording layer 84 with an area of 5 μm×5 μm and a thickness of 0.1 μm, a $(ZrO_2)_{35}(SiO_2)_{15}(Cr_2O_3)_{50}$ film with an area of 4.5 μm×5 μm and a thickness of 0.01 μm to serve as the fourth interface layer 804, and a Pt film with an area of 5 μm×5 μm and a thickness of 0.1 μm to serve as the upper electrode 85. The first interface layer 801, the second interface layer 802, the third interface layer 803, and the fourth interface layer 804 are insulators. Therefore in order to pass an electric current through the first recording layer 83 and the second recording layer 84, the first interface layer 801, the second interface layer 802, the third interface layer 803, and the fourth interface layer 804 are formed, with their areas being smaller than those of the first recording layer 83 and the second recording layer 84, so as to provide regions where the lower electrode 82, the first recording layer 83, the second recording layer 84, and the upper electrode 85 are in contact.

Thereafter, an Au lead was bonded to the lower electrode 82 and the upper electrode 85, and the electrical information recording and reproducing apparatus 92 was connected to the electrical information recording medium 86 via the application unit 87. With this electrical information recording and reproducing apparatus 92, the pulse power supply 90 is connected between the lower electrode 82 and the upper electrode 85 via the switch 89. The change in resistance caused by the phase changes of the first recording layer 83 and the second recording layer 84 is detected by the resistance measuring device 88 connected between the lower electrode 82 and the upper electrode 85 via the switch 91.

In examples of the information recording medium 86 of this example, the first recording layers 83 and second recording layer 84 used herein were those having the following compositions, which were expressed in terms of a coordinate (Ge, Sb, Te)=(x, y, z) on the triangular coordinate shown in FIG. 1: (x, y, z)=a (35, 65, 0), b (36.9, 60, 3.1), c (3.2, 60, 36.8), d (5, 95, 0), ①(30, 70, 0), ②(30, 65, 5), ③(19, 62, 19), ④(11, 62, 27), ⑤(5, 75, 20), ⑥(7.5, 90, 2.5), e (25, 75, 0), f (25, 65, 10), g (7.2, 65, 27.8), h (10, 90, 0), ⑦(22.5, 77.5, 0), ⑧(23, 70, 7), ⑨(16, 68, 16), ⑩(12, 68, 20), ⑪(12.5, 75, 12.5), ⑫(12, 81, 7), ⑬(13, 87, 0), j (20.9, 70, 9.1), k (11.8, 70, 18.2), m (14.5, 85.5, 0), n (20, 80, 0), ⑭(18, 82, 0), ⑮(20, 75, 5), ⑯(15, 70, 15), ⑰(14, 79, 7), and ⑱(17, 78, 5).

As a result, both the first recording layers 83 and the second recording layers 84 were each reversibly changed electrically between the crystalline state and the amorphous state. Furthermore, the number of rewriting repeated in the electrical information recording medium 86 was counted. In both the first recording layers 83 and the second recording layers 84, the number of rewriting was at least $10^{10}$ times. Thus it was proved that they had good properties as the electrical information recording medium.

As described above, examples of the embodiments according to the present invention were used and described. However, as described above, the present invention is not limited to the aforementioned embodiments but can be applied to other embodiments based on the technical idea of the present invention.

The information recording media and the methods of manufacturing the same of the present invention are useful, for example, for DVDs (Digital Versatile Discs) such as Blu-ray Disc and DVD-RAM, as high-capacity optical information recording media that contain excellent recording layer materials and are capable of high-speed recording. Furthermore, they also can be used for small disks with a diameter of 6 cm or 8 cm. Moreover, when used as the electrical information recording media, they are useful as electrical switching elements.

Specific embodiments or examples described in the section of "DETAILED DESCRIPTION OF THE INVENTION" are intended merely to clarify the technical contents of the present invention. Accordingly, they should not be interpreted narrowly to limit the present invention to such specific examples alone. They can be changed variously to be implemented within the spirit of the present invention and the range of the following claims.

What is claimed is:

1. An information recording medium, comprising a recording layer whose phase changes by irradiation with a laser beam or application of current,
   wherein the recording layer contains, as its main component, a composite composed of Ge, Sb, and Te, and
   the composite has a composition within a region enclosed by:
   point (e) (25, 75, 0),
   point (f) (25, 65, 10),
   point (g) (7.2, 65, 27.8), and
   point (h) (10, 90, 0)
   in terms of a coordinate (Ge, Sb, Te)=(x, y, z) on a triangular coordinate shown in FIG. 1, wherein point (g) corresponds to a point at Sb=65 on Te—$Ge_{10}Sb_{90}$, and the region includes lines extending between point (e) and point (f), point (f) and point (g), and point (g) and point (h), and the region excludes a line extending between point (h) and point (e).

2. The information recording medium according to claim 1, wherein the composite has a composition within a region enclosed by:
   point (j) (20.9, 70, 9.1),
   point (k) (11.8, 70, 18.2),
   point (m) (14.5, 85.5, 0), and
   point (n) (20, 80, 0)
   on the triangular coordinate shown in FIG. 1, where point (j) corresponds to a point at Sb=70 on $Ge_{50}Te_{50}$—$Ge_{14.5}Sb_{85.5}$, point (k) corresponds to a point at Sb=70 on Te—$Ge_{14.5}Sb_{85.5}$, and the region includes lines extending between point (j) and point (k), point (k) and point (m), and point (n) and point (j), and the region excludes a line extending between point (n) and point (m).

3. The information recording medium according to claim 1, wherein the recording layer further contains an element M, where M denotes at least one element selected from N, Bi, C, Si, In, Zn, Cu, Ag, Au, Ni, Pd, Pt, Co, Rh, Ru, Mn, Cr, Mo, W, V, Nb, Ta, Ti, Zr, Hf, Y, La, Ce, Pr, Nd, Gd, Tb, and Dy.

4. The information recording medium according to claim 3, wherein the content of the element M in the recording layer is 15 atom % or lower.

5. The information recording medium according to claim 3, wherein the element M is at least one element selected from C, Si, Bi, In and Mn.

6. The information recording medium according to claim 1, comprising a first information layer to an N-th information layer that are disposed in that order from an opposite side to a laser beam incident side,
   wherein at least one information layer selected from the first information layer to the N-th information layer includes the recording layer.

7. The information recording medium according to claim 6, wherein the first information layer includes the recording layer, and the recording layer has a thickness of 30 nm or less.

8. The information recording medium according to claim 6, wherein at least one of the second information layer and the third information layer includes the recording layer, and the recording layer has a thickness of 15 nm or less.

9. The information recording medium according to claim 6, wherein the N is at least 4, and
   at least one information layer selected from the fourth information layer to the N-th information layer includes the recording layer, and the recording layer has a thickness of 4 nm or less.

10. The information recording medium according to claim 1, further comprising a first adjacent layer and a second adjacent layer that are disposed adjacent to the recording layer, wherein at least one of the first adjacent layer and the second adjacent layer contains an oxide of at least one element selected from Si, Zr, Hf, Cr, In, Ga, Al, Ti, Nb, Y, and Dy.

11. The information recording medium according to claim 1, wherein the recording layer is formed substantially of the composite.

12. The information recording medium according to claim 1, wherein the composite is a ternary composite composed of Ge, Sb, and Te.

13. An information recording medium, comprising a recording layer whose phase changes by irradiation with a laser beam or application of current,
wherein the recording layer is formed with a first component layer to an X-th component layer that are disposed in that order in a thickness direction of the recording layer, where X is an integer of 2 or more,
an m-th component layer, which is at least one component layer selected from the first component layer to the X-th component layer, contains Ge—Sb or Te, where m is an integer that satisfies $1 \leq m \leq X$, and each thickness dm (nm) of the first component layer to the X-th component layer satisfies $0.05 \leq dm \leq 5$.

14. The information recording medium according to claim 13, wherein the m-th component layer further contains an element M, where M is at least one element selected from N, Bi, C, Si, Sn, Ga, In, Zn, Cu, Ag, Au, Ni, Pd, Pt, Co, Rh, Ru, Mn, Cr, Mo, W, V, Nb, Ta, Ti, Zr, Hf, Y, La, Ce, Pr, Nd, Gd, Tb, and Dy.

15. The information recording medium according to claim 14, wherein the content of the element M in the m-th component layer is 15 atom % or less.

16. The information recording medium according to claim 14, wherein the element M is at least one element selected from C, Si, Sn, Bi, In, and Mn.

17. The information recording medium according to claim 13, wherein the m-th component layer contains a material that is represented by a composition formula, $Ge_pSb_{100-p}$ (atom %), where p satisfies $0<p<100$, or $Ge_qTe_{100-q}$ (atom %), where q satisfies $0 \leq q<100$.

18. The information recording medium according to claim 17, wherein p satisfies $5 \leq p \leq 35$ or q satisfies $0 \leq q \leq 60$.

19. The information recording medium according to claim 17, wherein p satisfies $10 \leq p \leq 20$ or q satisfies $0 \leq q \leq 60$.

20. The information recording medium according to claim 13, comprising a first information layer to an N-th information layer that are disposed sequentially from an opposite side to a laser beam incident side,
wherein at least one information layer selected from the first information layer to the N-th information layer includes the recording layer.

21. The information recording medium according to claim 13, further comprising a first adjacent layer and a second adjacent layer that are disposed adjacent to the recording layer,
wherein at least one of the first adjacent layer and the second adjacent layer contains an oxide of at least one element selected from Si, Zr, Hf, Cr, In, Ga, Al, Ti, Nb, Y, and Dy.

22. A target having a composition within a region enclosed by:
point (e) (25, 75, 0),
point (f) (25, 65, 10),
point (g) (7.2, 65, 27.8), and
point (h) (10, 90, 0)
in terms of a coordinate (Ge, Sb, Te)=(x, y, z) on a triangular coordinate shown in FIG. 1, wherein point (g) corresponds to a point at Sb=65 on Te—$Ge_{10}Sb_{90}$, and the region includes lines extending between point (e) and point (f), point (f) and point (g), and point (g) and point (h), and the region excludes a line extending between point (h) and point (e).

23. A method for manufacturing an information recording medium including a recording layer whose phase changes by irradiation with a laser beam or application of current, the method comprising:
forming the recording layer using a target according to claim 22, the recording layer containing, as its main component, a composite having a composition within a region enclosed by:
point (e) (25, 75, 0),
point (f) (25, 65, 10),
point (g) (7.2, 65, 27.8), and
point (h) (10, 90, 0)
in terms of a coordinate (Ge, Sb, Te)=(x, y, z) on a triangular coordinate shown in FIG. 1, wherein point (g) corresponds to a point at Sb=65 on Te—$Ge_{10}Sb_{90}$, and the region includes lines extending between point (e) and point (f), point (f) and point (g), and point (g) and point (h), and the region excludes a line extending between point (h) and point (e).

24. The method for manufacturing an information recording medium according to claim 23, wherein the target further contains an element M, where M denotes at least one element selected from N, Bi, C, Si, Sn, Ga, In, Zn, Cu, Ag, Au, Ni, Pd, Pt, Co, Rh, Ru, Mn, Cr, Mo, W, V, Nb, Ta, Ti, Zr, Hf, Y, La, Ce, Pr, Nd, Gd, Tb, and Dy, and
in the process of forming the recording layer, the recording layer is formed using the target.

25. The method for manufacturing an information recording medium according to claim 23, wherein the information recording medium comprises a first information layer to an N-th information layer that are disposed in that order from an opposite side to a laser beam incident side, and at least one information layer selected from the first information layer to the N-th information layer includes the recording layer, and
in the process of forming the recording layer, the recording layer is formed using the target.

26. The method for manufacturing an information recording medium according to claim 23, wherein the information recording medium further comprises a first adjacent layer and a second adjacent layer that are disposed adjacent to the recording layer, and
the method further comprises forming at least one of the first adjacent layer and the second adjacent layer using a target containing an oxide of at least one element selected from Si, Zr, Hf, Cr, In, Ga, Al, Ti, Nb, Y, and Dy.

27. A method for manufacturing an information recording medium having a recording layer whose phase changes by irradiation with a laser beam or application of current,
wherein the recording layer is formed with a first component layer to an X-th component layer that are disposed in that order in a thickness direction of the recording layer, where X is an integer of 2 or more,
the method comprises forming an m-th component layer, which is at least one component layer selected from the first component layer to the X-th component layer, using a target containing Ge—Sb or Te, where m is an integer that satisfies $1 \leq m \leq X$, and each thickness dm (nm) of the first component layer to the X-th component layer satisfies $0.05 \leq dm \leq 5$.

28. The method for manufacturing an information recording medium according to claim 27, wherein the target further contains an element M, where M is at least one element selected from N, Bi, C, Si, Sn, Ga, In, Zn, Cu, Ag, Au, Ni, Pd, Pt, Co, Rh, Ru, Mn, Cr, Mo, W, V, Nb, Ta, Ti, Zr, Hf, Y, La, Ce, Pr, Nd, Gd, Tb, and Dy, and in the step of forming the m-th component layer, the m-th component layer is formed using the target.

29. The method for manufacturing an information recording medium according to claim 27, wherein in the step of forming the m-th component layer, the m-th component layer containing a material that is represented by a composition formula, $Ge_pSb_{100-p}$ (atom %), where p satisfies $0 \leq p \leq 100$, or $Ge_qTe_{100-q}$ (atom %), where q satisfies $0 \leq q \leq 100$, is formed using the target.

30. The method for manufacturing an information recording medium according to claim 27, wherein the information recording medium comprises a first information layer to an N-th information layer that are disposed in that order from an opposite side to a laser beam incident side, and at least one information layer selected from the first information layer to the N-th information layer includes the recording layer, and in the step of forming the m-th component layer, the m-th component layer of the recording layer is formed using the target.

31. The method for manufacturing an information recording medium according to claim 27, wherein the information recording medium further comprises a first adjacent layer and a second adjacent layer that are disposed adjacent to the recording layer, and the method further comprises forming at least one of the first adjacent layer and the second adjacent layer using a target that contains an oxide of at least one element selected from Si, Zr, Hf, Cr, In, Ga, Al, Ti, Nb, Y, and Dy.

32. An information recording medium, comprising a recording layer whose phase change by irradiation with a laser beam or application of current, wherein the recording layer is formed with a first component layer to an X-th component layer that are disposed in that order in a thickness direction of the recording layer, where X is an integer of 3 or more, and an m-th component layer, which is at least one component layer selected from the first component layer to the X-th component layer, contains Ge—Sb or Te, where m is an integer that satisfies $1 \leq m \leq X$.

33. An information recording medium, comprising a recording layer whose phase change by irradiation with a laser beam or application of current, wherein the recording layer is formed with a first component layer to an X-th component layer that are disposed in that order in a thickness direction of the recording layer, where X is an integer of 2 or more, and the first component layer to the X-th component layer include a layer containing Ge—Sb and a layer containing Te.

\* \* \* \* \*

UNITED STATES PATENT AND TRADEMARK OFFICE
CERTIFICATE OF CORRECTION

PATENT NO.        : 8,017,208 B2
APPLICATION NO.   : 11/931160
DATED             : September 13, 2011
INVENTOR(S)       : Tsuchino et al.

Page 1 of 1

It is certified that error appears in the above-identified patent and that said Letters Patent is hereby corrected as shown below:

Column 77, line 11 (Claim 29): "$0 \leq p \leq 100$" should read --$0 < p < 100$--.
Column 77, line 12 (Claim 29): "$0 \leq q \leq 100$" should read --$0 \leq q < 100$--.

Signed and Sealed this
Twenty-seventh Day of March, 2012

David J. Kappos
*Director of the United States Patent and Trademark Office*